(12) United States Patent
Inukai

(10) Patent No.: US 6,903,731 B2
(45) Date of Patent: Jun. 7, 2005

(54) LIGHT EMITTING DEVICE

(75) Inventor: Kazutaka Inukai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 190 days.

(21) Appl. No.: 09/833,672

(22) Filed: Apr. 13, 2001

(65) Prior Publication Data

US 2002/0044140 A1 Apr. 18, 2002

(30) Foreign Application Priority Data

Apr. 18, 2000 (JP) .................................. 2000-116040

(51) Int. Cl.[7] .............................................. G09G 5/00
(52) U.S. Cl. .................... 345/204; 345/205; 345/76; 345/82; 315/169.1; 315/169.3; 315/169.4
(58) Field of Search ........................ 345/204, 76, 82, 345/55, 205–206, 89, 60–63, 690–893; 315/169.1, 169.3, 169.4; 313/506, 509, 503

(56) References Cited

U.S. PATENT DOCUMENTS

| | | | |
|---|---|---|---|
| 4,888,523 A | 12/1989 | Shoji et al. | 315/169.3 |
| 5,303,072 A | 4/1994 | Takeda et al. | 349/48 |
| 5,652,600 A | 7/1997 | Khormaei et al. | 345/76 |
| 5,940,053 A | 8/1999 | Ikeda | 345/77 |
| 5,990,629 A * | 11/1999 | Yamada et al. | 315/169.3 |
| 6,166,490 A * | 12/2000 | Hansen | 315/169.1 |
| 6,225,750 B1 * | 5/2001 | Kimura | 315/169.3 |
| 6,246,180 B1 | 6/2001 | Nishigaki | 315/169.3 |
| 6,351,077 B1 * | 2/2002 | Koyama | 315/169.3 |
| 6,366,026 B1 * | 4/2002 | Saito et al. | 315/169.3 |
| 6,373,454 B1 * | 4/2002 | Knapp et al. | 345/76 |
| 6,373,455 B1 * | 4/2002 | Kuribayashi et al. | 345/76 |
| 6,417,825 B1 * | 7/2002 | Stewart et al. | 345/77 |
| 6,528,950 B2 * | 3/2003 | Kimura | 315/169.3 |
| 6,542,138 B1 * | 4/2003 | Shannon et al. | 345/76 |

FOREIGN PATENT DOCUMENTS

| | | |
|---|---|---|
| EP | 0 365 445 A2 | 4/1990 |
| EP | 0 895 219 A1 | 2/1999 |
| EP | 1 003 150 A1 | 5/2000 |
| EP | 1 061 497 A1 | 12/2000 |
| GB | 2 336 459 A | 10/1999 |
| JP | 10-312173 | 11/1998 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| WO | WO 98/48403 | 10/1998 |

OTHER PUBLICATIONS

U.S. Appl. No. 09/724,387, filed Nov. 28, 2000, Inukai et al., pending.

Xichao Mo et al.; "Consecutive PWM Driving Video LED Display System"; *1997 IEEE International Symposium on Circuits and Systems*, pp. 1437–1439; Jun. 9–12, 1997 (Hong Kong).

(Continued)

*Primary Examiner*—Henry N. Tran
*Assistant Examiner*—Frances Nguyen
(74) *Attorney, Agent, or Firm*—Fish & Richardson P.C.

(57) ABSTRACT

The present invention provides an active-matrix electro-optical device allowing clear multi-gray-scale color display. In the electro-optical display according to the present invention, a plurality of pixels included in a pixel portion have a first and a second source signal lines, a first and a second gate signal lines, and a power source supply line. Each of the pixels has a first TFT for switching, a second TFT for switching, a TFT for driving and a light emitting element.

38 Claims, 28 Drawing Sheets

OTHER PUBLICATIONS

M.A. Baldo et al.; "Very high–efficiency green organic light–emitting devices based on electrophosphorescence"; *Applied Physics Letters* 75(*1*); pp. 4–6; Jul. 5, 1999.

Tetsuo Tsutsui et al.; "High Quantum Efficiency in Organic Light–Emitting Devices with Iridium–Complex as a Triplet Emissive Center"; *Japan Journal of Applied Physics*, vol. 38, Part 2, No. 12B; pp. L1502–L1504; Dec. 15, 1999.

M.A. Baldo et al.; "Highly efficient phosphorescent emission from organic electroluminescent devices"; *Nature*, vol. 395; pp. 151–154; Sep. 10, 1998.

Tetsuo Tsutsui et al.; "Electroluminescence in Organic Thin Films"; *Photochemical Processes In Organized Molecular Systems*; pp. 437–450; Sep. 22–24, 1990.

* cited by examiner

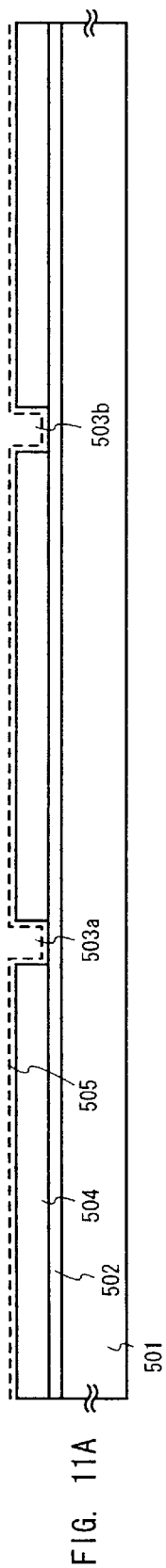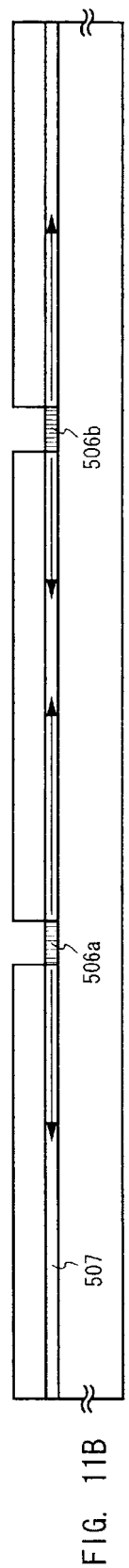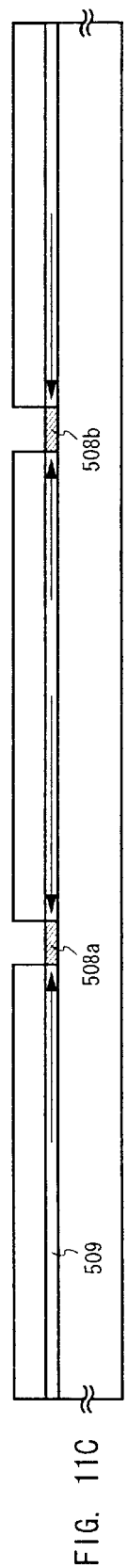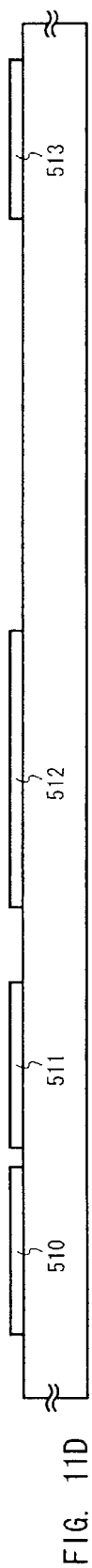

LIGHT EMITTING DEVICE

BACKGROUND OF THE INVENTION

1. Field of the Invention

The present invention relates to a display panel manufactured by sealing a light emitting element formed on a substrate between the substrate and a covering material. The present invention also relates to a display module in which an IC is mounted on the display panel. Display panels and display modules are herein generically referred to as light emitting devices. The present invention also relates to electric appliances using the light emitting device.

2. Description of the Related Art

Recently, a technique for forming TFTs on a substrate has been remarkably developed, and continues to be developed for its application to active matrix electronic displays. Particularly, TFTs using a polysilicon film can operate at a high speed because such TFTs have higher field effect mobility than TFTs using a conventional amorphous silicon film. Therefore, the control of pixels, which has been conventionally conducted by a driver circuit provided outside a substrate, can be performed by a driver circuit provided on the same substrate on which the pixels are provided.

Such an active matrix electronic display includes various circuits or elements formed on the same substrate. With this structure, the active matrix electronic display provides various advantages such as reduced manufacturing cost, reduced size of a display device including an electronic display as a display medium, an increased yield, and an increased throughput.

Furthermore, among electronic displays, an active matrix light emitting device including a light emitting element as a self-luminescent element has been actively studied. The light emitting device is also called Organic EL Display (OELD) or Organic Light Emitting Diode (OLED).

In contrast with the liquid crystal display device, the light emitting device is self-luminescent. The light emitting element has such a structure that a layer containing an organic compound (hereinafter, referred to as an organic compound layer) is sandwiched between a pair of electrodes (anode and cathode). The organic compound layer generates luminescence by applying an electric field across the pair of electrodes. The organic compound layer has normally a multi-layered structure. As a typical example of the multi-layered structures, a multi-layered structure "hole transport layer/light emitting layer/electron transport layer" proposed by Tang et al. of Kodak Eastman Company is cited. This structure has an extremely high light emitting efficiency. For this advantage, most light emitting devices, which are currently under study and development, employ this structure.

The light emitting element has an anode layer, an organic compound layer and a cathode layer to obtain electro luminescence generated by applying an electric field. The electro luminescence generated from the organic compound layer includes light emission (fluorescence) caused upon transition from a singlet excited state to a ground state and light emission (phosphorescence) caused upon transition from a triplet excited state to a ground state. The light emitting device of the present invention may use any type of light emission.

Furthermore, the light emitting device may have such a multi-layered structure that a hole injection layer, a hole transport layer, a light emitting layer and an electron transport layer are deposited on an anode or a hole injection layer, a hole transport layer, a light emitting layer, an electron transport layer, and an electron injection layer are deposited on an anode in this order. Moreover, the light emitting layer may be doped with a florescent pigment or the like.

All layers provided between a cathode and an anode are generically referred to as organic compound layers throughout the specification. Thus, the hole injection layer, the hole transport layer, the light emitting layer, the electron transport layer, the electron injection layer and the like described above are all included in the category of organic compound layers. In this specification, an element constituted by an anode, an organic compound layer and a cathode is referred to as a light emitting element.

As a method of driving a light emitting device, an analog driving method (analog drive) can be given. The analog drive of a light emitting device is described with reference to FIGS. 24 and 25.

FIG. 24 shows a structure of a pixel portion of a light emitting device that is driven in an analog manner. Gate signal lines (G1 through Gy) to which a selecting signal from a gate signal line driver circuit is input are connected to a gate electrode of a TFT 1801 for switching included in each pixel. One of a source region and a drain region of the TFT 1801 for switching included in each pixel is connected to source signal lines (S1 to Sx) to which an analog video signal is input, whereas the other is connected to a gate electrode of a TFT 1804 for current control included in each pixel and a capacitor 1808 included in each pixel.

One of a source region and a drain region of a TFT 1804 for current control included in each pixel is connected to power source supply lines (V1 through Vx), whereas the other is connected to a light emitting element 1806. An electric potential of the power source supply lines (V1 through Vx) is referred to as a power source electric potential. The power source supply lines (V1 through Vx) are connected to the capacitors 1808 included in the respective pixels.

The light emitting element 1806 includes an anode, a cathode and an organic compound layer interposed between the anode and the cathode. Herein, if the anode of the light emitting element 1806 is connected to the source region or the drain region of the TFT 1804 for current control, the anode and the cathode of the light emitting element 1806 are referred to as a pixel electrode and a counter electrode, respectively. On the other hand, if the cathode of the light emitting element 1806 is connected to the source region or the drain region of the TFT 1804 for current control, the anode and the cathode of the light emitting element 1806 are referred to as a counter electrode and a pixel electrode, respectively.

Throughout the specification, an electric potential of the counter electrode is referred to as a counter electric potential. A potential difference between the electric potential at the pixel electrode and the counter electric potential is a light emitting element driving voltage. The light emitting element driving voltage is applied to the organic compound layer.

FIG. 25 shows a timing chart in the case where the light emitting device shown in FIG. 24 is driven in an analog manner. The time period from the selection of one gate signal line until the selection of a next gate signal line is called one line time period (L).

The selection of signal lines (a gate signal line, a first gate signal line, and a second signal line) in this specification means that all the TFTs whose gate electrodes are connected to the signal lines are turned ON.

The time period from the display of one image to another corresponds to one frame time period (F). In the case of the light emitting device shown in FIG. 24, since there are y gate signal lines, y line time periods (L1 to Ly) are provided within one frame time period.

With the enhancement in resolution, the number of line time periods within one frame time period increases. As a result, the driver circuit must be driven at a high frequency.

A power source electric potential at the power source supply lines (V1 through Vx) is held constant, and a counter electric potential at the counter electrodes is also held constant. The counter electric potential has a potential difference with the power source electric potential to such a degree that a light emitting element emits light upon application of the power source electric potential to the pixel electrode of the light emitting element.

During a first line time period (L1), a gate signal line G1 is selected by a selecting signal output from the gate signal line driver circuit to turn ON all the TFTs 1801 for switching connected to the gate signal line G1. An analog video signal is sequentially input to the source signal lines (S1 through Sx). The analog video signal input to the source signal lines is then input to gate electrodes of the TFTs 1804 for current control through the TFTs 1801 for switching.

The amount of a current flowing through a channel formation region of the TFT 1804 for current control is controlled by a gate voltage $V_{GS}$ that is a potential difference between the gate electrode and the source region of the TFT 1804 for current control. Accordingly, the electric potential applied to the pixel electrode of the light emitting element 1806 is determined by the electric potential of the analog video signals input to the gate electrode of the TFT 1804 for current control. Therefore, the light emitting element 1806 is controlled by the electric potential of the analog video signals to emit light.

When the above-described operation is repeated to complete the input of analog video signals to the source signal lines (S1 through Sx), the first line time period (L1) terminates. One line time period may alternatively be constituted by the time period until the completion of input of the analog video signals to the source signal lines (S1 through Sx) and a horizontal blanking time period. Then, a second line time period (L2) starts where a gate signal line G2 is selected by a selecting signal. As in the first line time period (L1), analog video signals are sequentially input to the source signal lines (S1 through Sx) during the second line time period.

When all gate signal lines (G1 through Gy) are selected in this manner, all lines time periods (L1 through Ly) are completed. The completion of all the line time periods (L1 through Ly) corresponds to the completion of one frame period. All pixels perform display during one frame time period to form an image. One frame time period may be alternatively constituted by all line time periods (L1 through Ly) and a vertical blanking time period.

As described above, the amount of light emitted by the light emitting elements 1806 is controlled by the electric potential of analog video signals to perform gray-scale display.

The control of the amount of a current to be supplied to a light emitting element by a voltage between a gate electrode and a source region of a TFT for current control will be described in detail with reference to FIGS. 26A and 26B.

FIG. 26A is a graph showing a transistor characteristic of a TFT. In this graph, a line 401 is referred to as an $I_D$-$V_{GS}$ characteristic (or an $I_D$-$V_{GS}$ curve). Herein, $I_D$ indicates a drain current, and $V_{GS}$ indicates an electric potential difference (gate voltage) between a gate electrode and a source region. This graph allows showing the amount of a current that flows at an arbitrary gate voltage.

Normally, for driving a light emitting element, a region defined with a dotted line 402 of the $I_D$-$V_{GS}$ characteristic is used. FIG. 26B shows an enlarged view of the region defined with the dotted line 402.

A shaded region in FIG. 26B is referred to as a saturated region. Actually, the saturated region corresponds to a region from the vicinity of a threshold voltage ($V_{TH}$) to a gate voltage above the threshold voltage. Within this region, a drain current exponentially changes with respect to a change in gate voltage. In the case of analog driving, a current is controlled by a gate voltage using this region.

A gate voltage of a TFT for current control is determined by an analog video signal which is input to a pixel by turning ON a TFT for switching. At this time, based on the $I_D$-$V_{GS}$ characteristic shown in FIG. 26A, a drain current with respect to a gate voltage is determined in a one-to-one correspondence. More specifically, a voltage of the analog video signal input to the gate electrode of the TFT for current control determines an electric potential of the drain region. As a result, a predetermined amount of a drain current flows into a light emitting element so that the light emitting element emits light in the amount corresponding to the amount of a current.

As described above, the amount of light emitted by the light emitting element is controlled by an analog video signal to perform gray-scale display.

However, the above analog driving has a disadvantage of being extremely affected by variation in characteristics of TFTs. For example, the case where an $I_D$-$V_{GS}$ characteristic of a TFT for switching is different from that of a TFT for switching of an adjacent pixel for displaying the same gray-scale (an $I_D$-$V_{GS}$ characteristic is shifted as a whole to the plus or the minus side) is considered.

In such a case, drain currents of the TFTs for switching differs from each other although such a difference in drain current depends on the degree of variation in characteristics. Therefore, a different gate voltage is applied to a TFT for current control of each pixel. More specifically, a different current flows with respect to each light emitting element. As a result, a different amount of light is emitted from each light emitting element, thereby making it impossible to display the same gray-scale.

Even when the same gate voltage is applied to the TFTs for current control of the respective pixels, the TFTs cannot output the same drain current if there exists a variation in $I_D$-$V_{GS}$ characteristics of the TFTs for current control. Furthermore, as is apparent from FIG. 26A, since the region through which a drain current exponentially changes with respect to a change in gate voltage is used, the amount of a current to be output may greatly vary with a slight shift in $I_D$-$V_{GS}$ characteristic even when the same gate voltage is applied to the TFTs for current control. Under such a condition, even when signals of the same voltage are input, the amounts of light emitted from the light emitting elements of adjacent pixels differ from each other due to a slight variation in $I_D$-$V_{GS}$ characteristic.

Actually, the effect is multiplied by variation in $I_D$-$V_{GS}$ characteristic of the TFTs for switching and that of the TFTs for current control, further complicating the condition for performing the same gray-scale display. As described above, the analog driving is extremely sensitive to a variation in characteristic of TFTs, which is a problem in the gray-scale display of an active matrix light emitting device.

SUMMARY OF THE INVENTION

The present invention is achieved in view of the above problems, and has an object of providing an active matrix light emitting device allowing clear multi-gray scale color display. Moreover, the present invention has another object of providing light emitting devices (electronic appliances) with high performance, including such an active matrix light emitting device in a display region.

The inventors of the present invention consider that the problems in analog driving result from the control of a current flowing through a light emitting element using a saturated region that is susceptible to the effect of variation in $I_D$-$V_{GS}$ characteristic due to exponential change in a drain current with respect to a change in gate voltage.

More specifically, in the case where there is a variation in $I_D$-$V_{GS}$ characteristic, a drain current exponentially varies with a change in gate voltage over a saturated region. Therefore, even if the same gate voltage is applied, different currents (drain currents) are output, resulting in inconvenience that a desired gray-scale cannot be obtained.

Thus, the present inventors conceive to control the amount of light emitted by a light emitting element not through control of a current using a saturated region but mainly through control of a time period during which the light emitting element emits light. In other words, the amount of light emitted by the light emitting element is controlled in terms of time to realize a gray-scale display in the present invention. A driving method for performing gray-scale display by controlling a light emitting time period of a light emitting element is called a time-division driving method (hereinafter, referred to as digital driving). Gray-scale display realized by a time-division driving method is called time division gray-scale display.

With the above structure, the present invention allows avoiding the situation where desired gray-scale display cannot be obtained due to variation in $I_D$-$V_{GS}$ characteristic of TFTs.

The structure of the present invention will be described hereinbelow.

According to the present invention, there is provided a light emitting device comprising a first source signal line driver circuit, a second source signal line driver circuit, a first gate signal line driver circuit, a second gate signal line driver circuit, and a pixel portion, characterized in that the pixel portion has a plurality of pixels;

each of the plurality of pixels includes a light emitting element, a TFT for current control for controlling light emission from the light emitting element, a first TFT for switching and a second TFT for switching for controlling driving of the TFT for current control;

driving of the first TFT for switching is controlled by the first source signal line driver circuit and the first gate signal line driver circuit;

driving of the second TFT for switching is controlled by the second source signal line driver circuit and the second gate signal line driver circuit; and gray-scale display is performed by controlling a length of a time period during which the light emitting element emits light.

According to the present invention, there is provided a light emitting device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second source signal lines connected to the second source signal line driver circuit, a plurality of first gate signal lines connected to the first gate signal line driver circuit, a plurality of second gate signal lines connected to the second gate signal line driver circuit, and a plurality of power source supply lines, characterized in that the pixel portion has a plurality of pixels including a plurality of light emitting elements, a plurality of TFTs for current control, a plurality of first TFTs for switching, and a plurality of second TFTs for switching;

gate electrodes included in the plurality of first TFTs for switching are connected to the plurality of first gate signal lines;

gate electrodes included in the plurality of second TFTs for switching are connected to the plurality of second gate signal lines;

one of source regions and drain regions included in the plurality of first TFTs for switching are connected to the plurality of first source signal lines, and the other are connected to gate electrodes included in the plurality of TFTs for current control;

one of source regions and drain regions included in the plurality of second TFTs for switching are connected to the plurality of second source signal lines, and the other are connected to gate electrodes included in the plurality of TFTs for current control; and one of source regions and drain regions included in the plurality of TFTs for current control are connected to the plurality of power source supply lines, and the other are connected to the plurality of light emitting elements.

According to the present invention, there is provided a light emitting device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second source signal lines connected to the second source signal line driver circuit, a plurality of first gate signal lines connected to the first gate signal line driver circuit, a plurality of second gate signal lines connected to the second gate signal line driver circuit, and a plurality of power supply line held at a constant electric potential, characterized in that the pixel portion has a plurality of pixels including a plurality of light emitting elements, a plurality of TFTs for current control, a plurality of first TFTs for switching, and a plurality of second TFTs for switching;

each of the plurality of light emitting elements has a pixel electrode, a counter electrode held at a constant electric potential, and an organic compound layer provided between the pixel electrode and the counter electrode;

gate electrodes included in the plurality of first TFTs for switching are connected to the plurality of first gate signal lines;

gate electrodes included in the plurality of second TFTs for switching are connected to the plurality of second gate signal lines;

one of source regions and drain regions included in the plurality of first TFTs for switching are connected to the plurality of first source signal lines, and the other are connected to gate electrodes included in the plurality of TFTs for current control;

one of source regions and drain regions included in the plurality of second TFTs for switching are connected to the plurality of second source signal lines, and the other are connected to gate electrodes included in the plurality of TFTs for current control; and one of source regions and drain regions included in the plurality of TFTs for current control are connected to the plurality of power source supply lines, and the other are connected to the plurality of pixel electrodes.

According to the present invention, there is provided a light emitting device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second source signal lines connected to the second source signal line driver circuit, a plurality of first gate signal lines connected to the first gate signal line driver circuit, a plurality of second gate signal lines connected to the second gate signal line driver circuit, and a plurality of power source supply lines, characterized in that the pixel portion has a plurality of pixels including a plurality of light emitting elements, a plurality of TFTs for current control, a plurality of first TFTs for switching, and a plurality of second TFTs for switching;

gate electrodes included in the plurality of first TFTs for switching are connected to the plurality of first gate signal lines;

gate electrodes included in the plurality of second TFTs for switching are connected to the plurality of second gate signal lines;

one of source regions and drain regions included in the plurality of first TFTs for switching are connected to the plurality of first source signal lines, and the other are connected to gate electrodes included in the plurality of TFTs for current control;

one of source regions and drain regions included in the plurality of second TFTs for switching are connected to the plurality of second source signal lines, and the other are connected to gate electrodes included in the plurality of TFTs for current control;

one of source regions and drain regions included in the plurality of TFTs for current control are connected to the plurality of power source supply lines, and the other are connected to the plurality of light emitting elements;

n writing time periods Ta1, Ta2, . . . , Tan sequentially appear within one frame time period;

a writing time period that follows the last writing time period Tan among the n writing time periods Ta1, Ta2, . . . , Tan is a first writing time period Ta1 among the n writing time periods Ta1, Ta2, . . . , Tan, time periods from apparition of the respective n writing time periods Ta1, Ta2, . . . , Tan until apparition of writing time periods following the respective n writing time periods Ta1, Ta2, . . . , Tan are n display time periods Td1, Td2, . . . , Tdn;

during the n writing time periods Ta1, Ta2, . . . , Tan, a digital signal is input to the plurality of pixels through the plurality of first source signal lines from the first source signal line driver circuit or through the plurality of second source signal lines from the second source signal line driver circuit; and the plurality of light emitting elements are selected to be brought into a light emitting state or a non-light emitting state during the n display time periods Td1, Td2, . . . , Tdn by the digital signal.

According to the present invention, there is provided a light emitting device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second source signal lines connected to the second source signal line driver circuit, a plurality of first gate signal lines connected to the first gate signal line driver circuit, a plurality of second gate signal lines connected to the second gate signal line driver circuit, and a plurality of power source supply lines held at a constant electric potential, characterized in that the pixel portion has a plurality of pixels including a plurality of light emitting elements, a plurality of TFTs for current control, a plurality of first TFTs for switching, and a plurality of second TFTs for switching;

each of the plurality of light emitting elements includes a pixel electrode, a counter electrode held at a constant electric potential, and an organic compound layer provided between the pixel electrode and the counter electrode;

gate electrodes included in the plurality of first TFTs for switching are connected to the plurality of first gate signal lines;

gate electrodes included in the plurality of second TFTs for switching are connected to the plurality of second gate signal lines;

one of source regions and drain regions included in the plurality of first TFTs for switching are connected to the plurality of first source signal lines, and the other are connected to gate electrodes included in the plurality of TFTs for current control;

one of source regions and drain regions included in the plurality of second TFTs for switching are connected to the plurality of second source signal lines, and the other are connected to gate electrodes included in the plurality of TFTs for current control;

one of source regions and drain regions included in the plurality of TFTs for current control are connected to the plurality of power source supply lines, and the other are connected to the plurality of pixel electrodes;

n writing time periods Ta1, Ta2, . . . , Tan sequentially appear within one frame time period;

a writing time period that follows the last writing time period Tan among the n writing time periods Ta1, Ta2, . . . , Tan is a first writing time period Ta1 among the n writing time periods Ta1, Ta2, . . . , Tan, time periods from apparition of the respective n writing time periods Ta1, Ta2, . . . , Tan until apparition of writing time periods following the respective n writing time periods Ta1, Ta2, . . . , Tan are n display time periods Td1, Td2, . . . , Tdn;

during the n writing time periods Ta1, Ta2, . . . , Tan, a digital signal is input to the plurality of pixels through the plurality of first source signal lines from the first source signal line driver circuit or through the plurality of second source signal lines from the second source signal line driver circuit; and the plurality of light emitting elements are selected to be brought into a light emitting state or a non-light emitting state during the n display time periods Td1, Td2, . . . , Tdn by the digital signal.

According to the present invention, there is provided a light emitting device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second source signal lines connected to the second source signal line driver circuit, a plurality of first gate signal lines connected to the first gate signal line driver circuit, a plurality of second gate signal lines connected to the second gate signal line driver circuit, and a plurality of power source supply lines, characterized in that the pixel portion has a plurality of pixels including a plurality of light emitting elements, a plurality of TFTs for current control, a plurality of first TFTs for switching, and a plurality of second TFTs for switching;

gate electrodes included in the plurality of first TFTs for switching are connected to the plurality of first gate signal lines;

gate electrodes included in the plurality of second TFTs for switching are connected to the plurality of second gate signal lines;

one of source regions and drain regions included in the plurality of first TFTs for switching are connected to the plurality of first source signal lines, and the other are connected to gate electrodes included in the plurality of TFTs for current control;

one of source regions and drain regions included in the plurality of second TFTs for switching are connected to the plurality of second source signal lines, and the other are connected to gate electrodes included in the plurality of TFTs for current control;

one of source regions and drain regions included in the plurality of TFTs for current control are connected to the plurality of power source supply lines, and the other are connected to the plurality of light emitting elements;

n writing time periods Ta1, Ta2, . . . , Tan sequentially appear within one frame time period;

a writing time period that follows the last writing time period Tan among the n writing time periods Ta1, Ta2, . . . , Tan is a first writing time period Ta1 among the n writing time periods Ta1, Ta2, . . . , Tan, time periods from apparition of the respective n writing time periods Ta1, Ta2, . . . , Tan until apparition of writing time periods following the respective n writing time periods Ta1, Ta2, . . . , Tan are n display time periods Td1, Td2, . . . , Tdn;

during the n writing time periods Ta1, Ta2, . . . , Tan, a digital signal is input to the plurality of pixels through the plurality of first source signal lines from the first source signal line driver circuit or through the plurality of second source signal lines from the second source signal line driver circuit;

among the n writing time periods Ta1, Ta2, . . . , Tan, some adjacent writing time periods partially overlap with each other; and the plurality of light emitting elements are selected to be brought into a light emitting state or a non-light emitting state during the n display time periods Td1, Td2, . . . , Tdn by the digital signal.

According to the present invention, there is provided a light emitting device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second source signal lines connected to the second source signal line driver circuit, a plurality of first gate signal lines connected to the first gate signal line driver circuit, a plurality of second gate signal lines connected to the second gate signal line driver circuit, and a plurality of power source supply lines held at a constant electric potential, characterized in that the pixel portion has a plurality of pixels including a plurality of light emitting elements, a plurality of TFTs for current control, a plurality of first TFTs for switching, and a plurality of second TFTs for switching;

each of the plurality of light emitting elements includes a pixel electrode, a counter electrode held at a constant electric potential, and an organic compound layer provided between the pixel electrode and the counter electrode;

gate electrodes included in the plurality of first TFTs for switching are connected to the plurality of first gate signal lines;

gate electrodes included in the plurality of second TFTs for switching are connected to the plurality of second gate signal lines;

one of source regions and drain regions included in the plurality of first TFTs for switching are connected to the plurality of first source signal lines, and the other are connected to gate electrodes included in the plurality of TFTs for current control;

one of source regions and drain regions included in the plurality of second TFTs for switching are connected to the plurality of second source signal lines, and the other are connected to gate electrodes included in the plurality of TFTs for current control;

one of source regions and drain regions included in the plurality of TFTs for current control are connected to the plurality of power source supply lines, and the other are connected to the plurality of pixel electrodes;

n writing time periods Ta1, Ta2, . . . , Tan sequentially appear within one frame time period;

a writing time period that follows the last writing time period Tan among the n writing time periods Ta1, Ta2, . . . , Tan is a first writing time period Ta1 among the n writing time periods Ta1, Ta2, . . . , Tan, time periods from apparition of the respective n writing time periods Ta1, Ta2, . . . , Tan until apparition of writing time periods following the respective n writing time periods Ta1, Ta2, . . . , Tan are n display time periods Td1, Td2, . . . , Tdn;

during the n writing time periods Ta1, Ta2, . . . , Tan, a digital signal is input to the plurality of pixels through the plurality of first source signal lines from the first source signal line driver circuit or through the plurality of second source signal lines from the second source signal line driver circuit;

among the n writing time periods Ta1, Ta2, . . . , Tan, some adjacent writing time periods partially overlap with each other; and the plurality of light emitting elements are selected to be brought into a light emitting state or a non-light emitting state during the n display time periods Td1, Td2, . . . , Tdn by the digital signal.

A light emitting device may have a characteristic in that the digital signal is input to the plurality of pixels through the plurality of first source signal lines from the first source signal line driver circuit during one writing time period of the partially overlapping adjacent writing time periods, and the digital signal is input to the plurality of pixels through the plurality of second source signal lines from the second source signal line driver circuit during the other writing time period.

A light emitting device may have a characteristic in that j display time periods (j is an integer equal to or more than 0 and equal to or less than n) among the n display time periods Td1, Td2, . . . , Tdn are black display time periods during which all the plurality of light emitting elements are brought into a non-light emitting state.

A light emitting device may have a characteristic in that the lengths of the n writing time periods Ta1, Ta2, . . . , Tan are equal to each other.

A light emitting device may have a characteristic in that a ratio of lengths of (n−j) display time periods among the n display time periods Td1, Td2, . . . , Tdn excluding black display time periods when arranged in order of short length is $2^0:2^1: \ldots :2^{(n-j-1)}$.

A light emitting device may have a characteristic in that the first TFTs for switching and the second TFTs for switching have the same polarity.

A light emitting device may have a characteristic in that a display time period that is the last to appear is the longest black display time period within the one frame time period.

According to the present invention, there is provided a light emitting device comprising a first source signal line driver circuit, a second source signal line driver circuit, a first gate signal line driver circuit, a second gate signal line driver circuit, and a pixel portion, characterized in that the pixel portion has a plurality of pixels;

the plurality of pixels include a plurality of light emitting elements; and driving of the plurality of light emitting elements is controlled by a digital signal output from the first source signal line driver circuit and the second source signal line driver circuit and a selecting signal output from the first gate signal line driver circuit and the second gate signal line driver circuit.

According to the present invention, there is provided a light emitting device comprising a first source signal line driver circuit, a second source signal line driver circuit, a first gate signal line driver circuit, a second gate signal line driver circuit, and a pixel portion, characterized in that the pixel portion has a plurality of pixels;

the plurality of pixels include a plurality of light emitting elements; and a time period during which the light emitting elements emit light is controlled by a digital signal output from the first source signal line driver circuit and the second source signal line driver circuit and a selecting signal output from the first gate signal line driver circuit and the second gate signal line driver circuit to perform gray-scale display.

A light emitting device may have a characteristic in that the organic compound layer is formed of a low-molecular organic material or a polymer organic material.

A light emitting device may have a characteristic in that the light emitting device is a computer, a video camera or a DVD player.

BRIEF DESCRIPTION OF THE DRAWINGS

In the accompanying drawings:

FIGS. 11A to 11D show a manufacture process of a light emitting device;

FIG. 29 is a graph showing the relationship between a gate voltage and a drain current of a TFT for current control.

DESCRIPTION OF THE PREFERRED EMBODIMENTS

Hereinafter, a structure of a light emitting device according to the present invention and a driving method thereof will be described. The case where $2^n$ gray-scale display is performed by an n-bit digital video signal is herein described.

Figure 1:
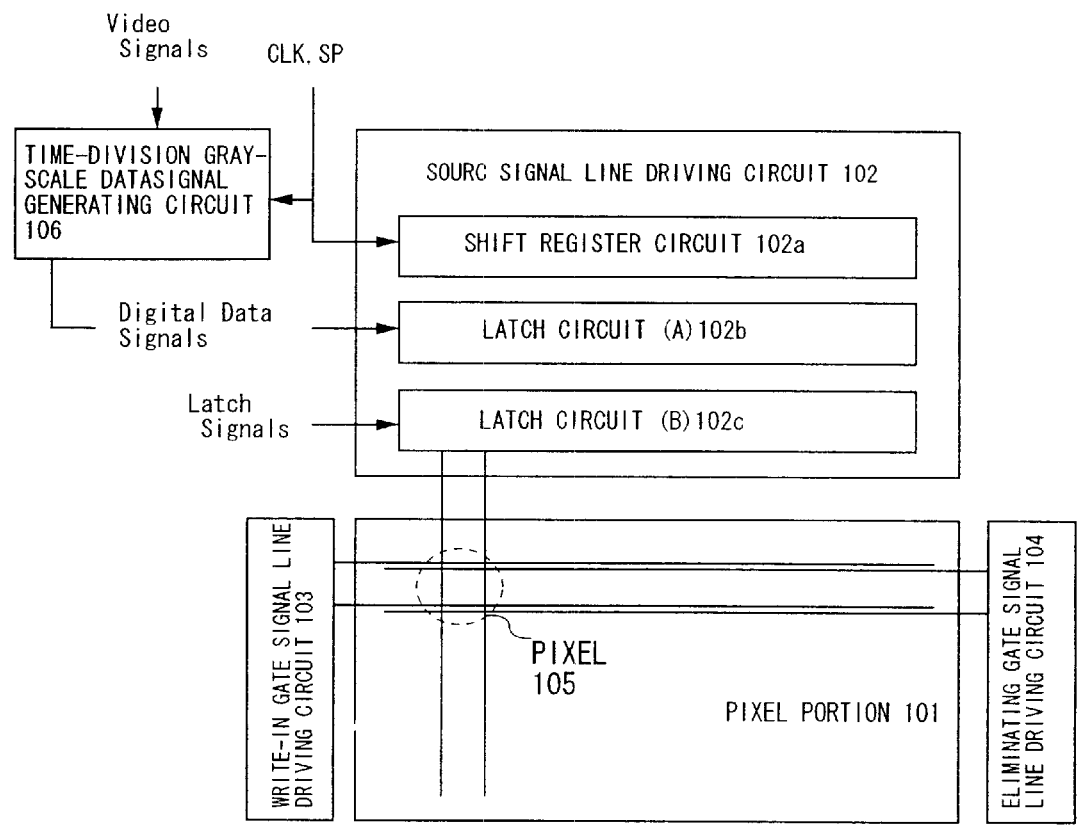
FIG. 1 is an upper block diagram of a light emitting device according to the present invention.

FIG. 1 shows an exemplary block diagram of a light emitting device according to the present invention. The light emitting device shown in FIG. 1 has a pixel portion 101 including TFTs formed on a substrate, a first source signal line driver circuit 102a, a second source signal line driver circuit 102b, a first gate signal line driver circuit 103a, and a second gate signal line driver circuit 103b respectively provided in the periphery of the pixel portion 101.

The first source signal line driver circuit 102a, the second source signal line driver circuit 102b, the first gate signal line driver circuit 103a, and the second gate signal line driver circuit 103b may be formed on the same substrate on which the pixel portion is formed, or may be provided on an IC chip so as to be connected to the pixel portion 101 through an FPC or the like.

Basically, each of the first and the second source signal line driver circuits 102a and 102b has a shift register 105, a latch (A) 106 and a latch (B) 107.

On the other hand, each of the first gate signal line driver circuit 103a and the second gate signal line driver circuit 103b has a shift register and a buffer (neither of them shown). Depending on the case, the first and the second gate signal line driver circuits 103a and 103b may have a level shift in addition to the shift register and the buffer.

The structure of the driver circuits included in the light emitting device according to the present invention is not limited to that shown in FIG. 1.

Figure 2:
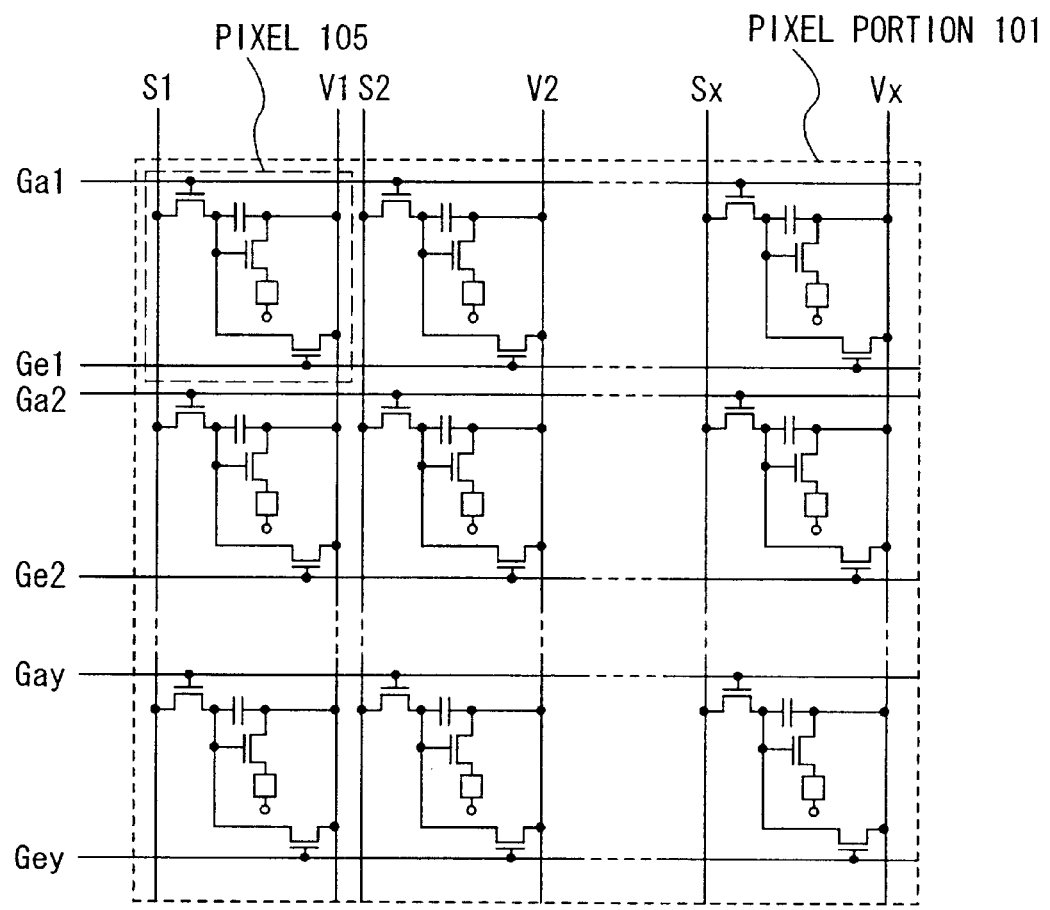
FIG. 2 is a circuit diagram of a pixel portion of a light emitting device according to the present invention.

FIG. 2 shows an enlarged view of the pixel portion 101. First source signal lines (SL1 through SLx) connected to the latch (B) 107 of the first source signal line driver circuit 102a, second source signal lines (SR1 through SRx) connected to the latch (B) 107 of the second source signal line driver circuit 102b, power source supply lines (V1 through Vx) connected to a power source outside the light emitting device through an FPC, first gate signal lines (GL1 through GLy) connected to the first gate signal line driver circuit 103a, and second gate signal lines (GR1 through GRy) connected to the second gate signal line driver circuit 103b are provided in the pixel portion 101.

In this specification, the combination of the first source signal line driver circuit 102a and the first gate signal line driver circuit 103a is called a first group of driver circuits (Dr_L), and the combination of the second source signal line driver circuit 102b and the second gate signal line driver circuit 103b is called a second group of driver circuits (Dr_R).

A region including one of the first source signal lines (SL1 through SLx), one of the second source signal lines (SR1 through SRx), one of the power supply lines (V1 through Vx), one of the first gate signal lines (GL1 through GLy), and one of the second gate signal lines (GR1 through GRy) constitutes a pixel 104. In the pixel portion 101, a plurality of pixels 104 are arranged in a matrix.

Figure 3:
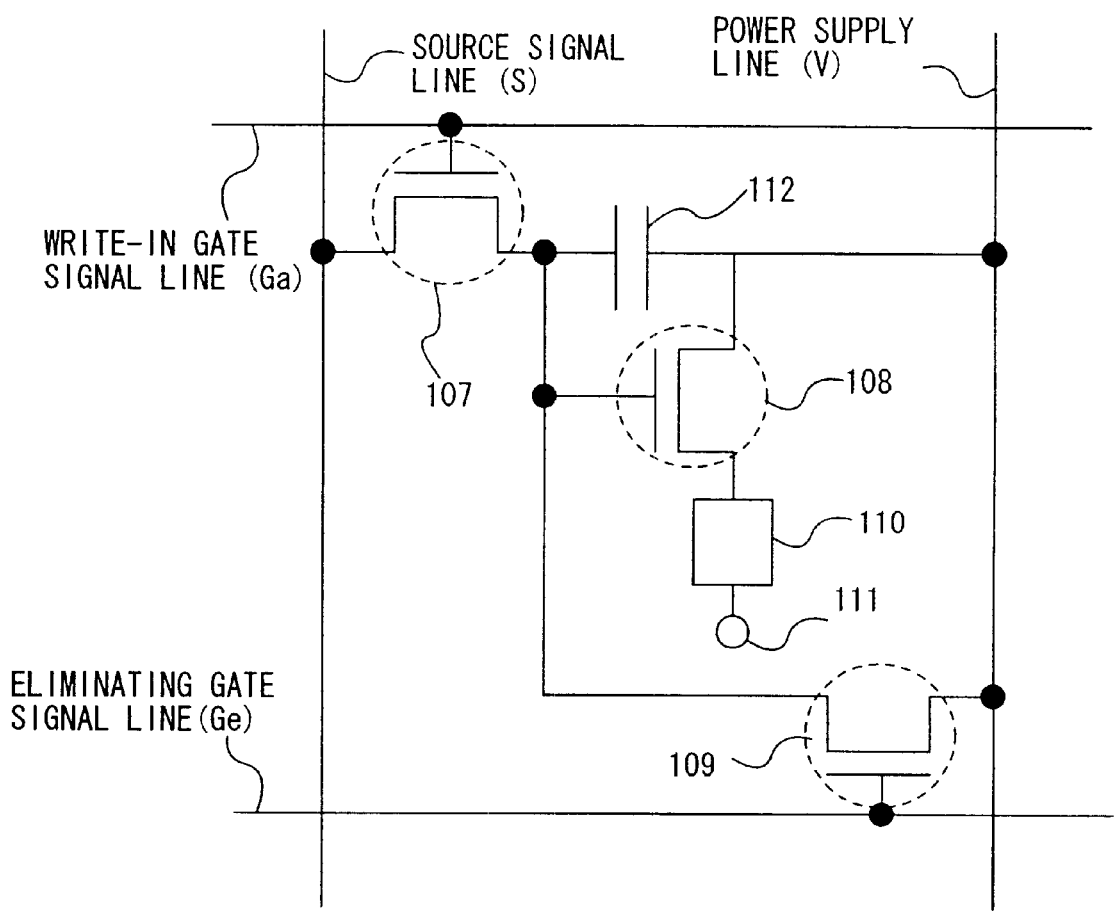
FIG. 3 is a circuit diagram of a pixel of a light emitting device according to the present invention.

FIG. 3 is an enlarged view showing the pixel 104. In FIG. 3, the reference symbol 201a designates a first TFT for switching, and the reference symbol 201b designates a second TFT for switching. A gate electrode of the first TFT for switching 201a is connected to a first gate signal line GL (any one of GL1 through GLy). A gate electrode of the second TFT for switching 201b is connected to a second gate signal line GR (any one of GR1 through GRy).

One of a source region and a drain region of the first TFT for switching 201a is connected to a first source signal line SL (any one of SL1 through SLx), whereas the other is connected to a gate electrode of a TFT for current control 202 and a capacitor 204 included in each pixel. One of a source region and a drain region of the second TFT for switching 201b is connected to a second source signal line SR (any one of SR1 through SRx), whereas the other is connected to the gate electrode of the TFT for current control 202 and the capacitor 204 included in each pixel.

The capacitor 204 is provided so as to retain a gate voltage of the TFT 202 for current control when the first and the second TFTs for switching 201a and 201b are in an OFF state (non-selected state). Although the structure in which the capacitor 204 is provided is shown in this embodiment mode, the present invention is not limited thereto; the structure in which the capacitor 204 is not provided may also be employed.

One of a source region and a drain region of the TFT for current control 202 is connected to a power source supply line V (any one of V1 through Vx), whereas the other is connected to a light emitting element 203. The power source supply line V is connected to the capacitor 204.

The light emitting element 203 includes an anode, a cathode and an organic compound layer provided between the anode and the cathode. In the case where the anode is connected to the source region or the drain region of the TFT for current control 202, the anode serves as a pixel electrode while the cathode serves as a counter electrode. On the contrary, in the case where the cathode is connected to the source region or the drain region of the TFT for current control 202, the cathode serves as a pixel electrode while the anode serves as a counter electrode.

A counter electric potential is applied to the counter electrode of the light emitting element 203 while a power source electric potential is applied to the power source supply line V. A difference in electric potential between the counter electric potential and the power source electric potential is constantly held to a value at which the light emitting element 203 emits light when the power source electric potential is applied to the pixel electrode. The power source electric potential and the counter electric potential are applied to the light emitting device of the present invention through a power source provided by an externally attached IC or the like.

For a current typical light emitting device, in the case where the amount of light per light emitting region of a pixel is 200 cd/m$^2$, about several mA/cm$^2$ of a current per region of a pixel portion is needed. Therefore, when the size of a screen is especially increased, it becomes difficult to control the electric potential applied from the power source provided in an IC by a switch. In the present invention, however, the power source electric potential and the counter electric potential are always held constant. Therefore, since it is not necessary to control the electric potential applied from the power source in the IC by a switch, the present invention is effective to realize a panel having a larger screen size.

As the first and the second TFTs for switching 201a and 201b and the TFT for current control 202, either n-channel TFTs or p-channel TFTs may be used. Besides a single-gate structure, the first and the second TFTs for switching 201a and 201b and the TFT for current control 202 may have a multi-gate structure such as a double-gate structure or a triple-gate structure.

In the present invention, either an n-channel TFT or a p-channel TFT may be used as the TFT for current control 202. In the case where the anode of the light emitting element 203 serves as a pixel electrode and the cathode serves as a counter electrode, however, it is preferred that the TFT for current control 202 is a p-channel TFT. On the contrary, in the case where the anode of the light emitting element 203 serves as a counter electrode and the cathode serves as a pixel electrode, however, it is preferred that the TFT for current control 202 is an n-channel TFT.

Next, Embodiment Modes 1 and 2 will be described below for a driving method of a light emitting device having the above-described structure according to the present invention.

(Embodiment Mode 1)

A driving method of this embodiment mode will be described with reference to FIG. 4.

First, the first gate signal line GL1 is selected by a selecting signal output from the first gate signal line driver circuit 103a to turn ON the first TFTs for switching 201a of all pixels connected to the first gate signal line GL1 (pixels on the first line). Throughout the specification, "turning a TFT ON" is referred to as "driving a TFT".

A digital video signal of the first bit is input to pixels on the first line from the latch (B) 107 of the first source signal line driver circuit 102a through the first source signal lines (SL1 through SLx). The digital video signal of the first bit input to the pixels on the first line is then input to gate electrodes of the TFTs for current control 202 through the first TFTs for switching 201a in an ON state.

The digital video signal has information of "0" or "1". The digital video signal of "0" is a signal having a Hi level voltage, while the digital video signal of "1" is a signal having a Lo level voltage.

In this embodiment mode, in the case where the digital signal has information of "0", the TFT for current control 202 is turned OFF. Accordingly, the power source electric potential is not applied to the pixel electrode of the light emitting element 203. As a result, the light emitting element 203 included in the pixel, to which the digital video signal having information of "0" is input, does not emit light.

On the contrary, in the case where the digital signal has information of "1", the TFT for current control 202 is turned ON. Accordingly, the power source electric potential is applied to the pixel electrode of the light emitting element 203. A difference in electric potential between the counter electric potential and the power source electric potential is always held to a value at which the light emitting elements emits light when the power source electric potential is applied to the pixel electrode. As a result, the light emitting element 203 included in the pixel, to which the digital video signal having information of "1" is input, emits light.

In this embodiment mode, in the case where the digital video signal has information of "0", the TFT for current control 202 is turned OFF, and in the case where the digital video signal has information of "1", the TFT for current control 202 is turned ON. However, the present invention is not limited to such a structure. Alternatively, the TFT for current control 202 may be turned ON with the digital video signal having information of "0", and the TFT for current control 202 may be turned OFF with the digital video signal having information of "1".

Throughout this specification, the state where a light emitting element emits light is referred to as a light emitting state, while the state where a light emitting element does not emit light is referred to as a non-light emitting state.

In this way, simultaneously with the input of the digital video signal of the first bit to the pixels on the first line, the light emitting elements 203 are brought into a light emitting state or a non-light emitting state so that the pixels on the first line perform display. A time period during which pixels perform display is referred to as a display time period Td. Particularly, a display time period that starts with the input of the digital video signal of the first bit to a pixel is designated as Td1. For simplicity of the description, only display time periods for pixels on the first line (1st. row) and pixels on the yth line (last. row) are shown in FIG. 4. The timing at which the display time period of each line starts has a time difference.

Next, the first TFTs for switching 201a of all pixels (pixels on the first line) connected to the first gate signal line GL1 are turned OFF. Then, a first gate signal line GL2 is selected by a selecting signal output from the first gate signal line driver circuit 103a to turn ON the first TFTs for switching 201a of all pixels connected to the first gate signal line GL2 (pixels on the second line). The digital video signal of the first bit is then applied to the pixels on the second line from the first source signal line driver circuit 102a through the source signal lines (SL1 through SLx).

Then, the above-described operation is repeated in this order to select all the first gate signal lines (GL1 through GLy). As a result, the digital video signal of the first bit is input to the pixels on all the lines. A time period until the input of the digital video signal of the first bit to all the pixels is completed corresponds to a writing time period Ta1.

On the other hand, before or after the input of a digital video signal of the first it to the pixels on all the lines, in other words, before or after the completion of the writing time period Ta1, a writing time period Ta2 starts. In this embodiment mode, the case where the writing time period Ta2 starts before the completion of the writing time period Ta1 is described by way of example.

With the start of the writing time period Ta2, the second gate signal line GR1 is selected by a selecting signal output from the second gate signal line driving circuit 103b to turn ON the second TFTs for switching 201b of all pixels connected to the second gate signal line GR1 (pixels on the first line).

A digital video signal of the second bit is input to the pixels on the first line from the latch (B) 107 of the second source signal line driver circuit 102a through the second source signal lines (SR1 through SRx). The digital video signal of the second bit input to the pixels on the first line are then input to the gate electrodes of the TFTs for current control 202 through the second TFTs for switching 201b.

In this manner, during the writing time period Ta2, the digital video signal of the second bit can be input to the pixels on the first line in parallel with the input of the digital video signal of the first bit to the pixels. Therefore, the digital video signal of the first bit input to the pixels during the writing time period Ta1 is overwritten by the digital video signal of the second bit.

Simultaneously with the input of the digital video signal of the second bit to the pixels on the first line, the light emitting element 203 is brought into a light emitting state or a non-light emitting state based on the digital video signal of the second bit, so that the pixels on the first line perform display. The digital video signal of the second bit is input to the pixels to terminate the display time period Td1 and to start the display time period Td2.

Next, the second TFTs for switching 201b of all pixels connected to the second gate signal line GR1 (pixels on the first line) are turned OFF. Then, the second gate signal line GR2 is selected by a selecting signal output from the second gate signal line driver circuit 103b to turn ON the second TFTs for switching 201b of all pixels connected to the second gate signal line GR2 (pixels on the second line). A digital video signal of the second bit is then input to pixels on the second line from the second source signal line driver circuit 102b through the source signal lines (SR1 through SRx).

The above-described operation is repeated in this order to select all the second gate signal lines (GR1 through GRy). The digital signal of the second bit is input to the pixels on all the lines. The time period until the digital video signal of the second bit is input to all the pixels corresponds to a writing time period Ta2.

On the other hand, before or after the input of the digital video signal of the second bit to pixels on all the lines, in other words, before or after the completion of the writing time period Ta2, a writing time period Ta3 starts. In this embodiment mode, the case where the writing time period Ta3 starts before the completion of the writing time period Ta2 is described by way of example.

When the writing time period Ta3 starts, the first gate signal line GL1 is selected by a selecting signal output from the first gate signal line driver circuit 103a to turn ON the first TFTs for switching 201a of all pixels connected to the first gate signal line GL1 (pixels on the first line). Then, a digital video signal of the third bit is input to the pixels on the first line to complete the display time period Td2 and to start a display time period Td3.

Then, all the first gate signal lines (GL1 through GLy) are sequentially selected so that the digital video signal of the third bit is input to all the pixels. The time period until the completion of input of the digital video signal of the third bit to the pixels on all the lines corresponds to a writing time period Ta3.

Figure 4:
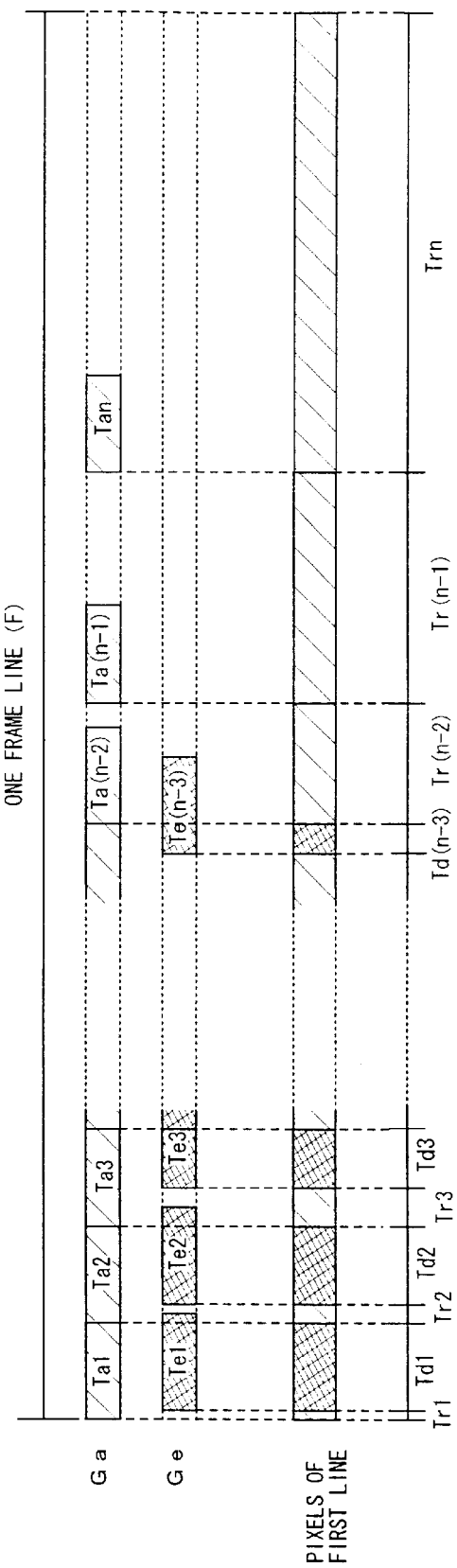
FIG. 4 is a timing chart showing a driving method of light emitting device according to the present invention.

The above-described operation is repeated until a digital video signal of the n-th bit is input to the pixels, so that display time periods Td1 through Tdn all appear (FIG. 4).

When all the display time periods Td1 through Tdn are completed, one frame time period is terminated to display one image. In the driving method according to the present invention, a time period for displaying one image is referred to as one frame time period (F).

For a normal light emitting device, it is preferred to provide 60 or more frame time periods per second. The reason for this is that, if the number of images displayed per second is less than 60, the flicker of image may become visually noticeable.

After the completion of one frame time period, the digital video signal of the first bit is input again to the pixels to constitute the display time period Td1. Then, the above-described operation is repeated. In this embodiment mode, during a next frame time period after the completion of one frame time period, the digital video signal of the first bit is input again to the pixels by the first group of driver circuits (Dr_L). However, the structure of the present invention is not limited thereto. Alternatively, during a next frame time period following the completion of one frame time period, the digital video signal of the first bit may be input to the pixels by the second group of driver circuits (Dr_R).

Throughout the specification, input of a digital video signal to a pixel signifies that a digital video signal is input to a gate electrode of a TFT for current control through a TFT for switching included in a pixel.

In this embodiment mode, the writing time period during which the digital video signal is input to the pixels by the first group of driver circuits (Dr_L) and the writing time period during which the digital video signal is input to the pixels by the second group of driver circuits (Dr_R) alternately appear. However, the present invention is not limited to this structure. In the case where adjacent writing time periods do not overlap with each other, a group of driver circuits for inputting the digital video signal to the pixels during two adjacent writing time periods may be either the first group of driver circuits (Dr_L) or the second group of driver circuits (Dr_R) for both writing time periods.

It is important that writing time periods during which the digital video signal is input to the pixels by the first group of driver circuits (Dr_L) do not overlap with each other. In the same sense, it is also important that writing time periods during which the digital video signal is input to the pixels by the second group of driver circuits (Dr_R) do not overlap with each other.

The display time period Td1 is a time period from the beginning of the writing time period Ta1 until the beginning of the writing time period Ta2. The display time period Td2 is a time period from the beginning of the writing time period Ta2 until the beginning of the writing time period Ta3. As the display time periods Td1 and Td2, display time periods Td3, Td4, . . . , Td(n−1) and Tdn are time periods from the beginning of the writing time periods Ta3, Ta4, . . . , Ta(n−1) and Tan until the beginning of the next writing time periods Ta4, Ta5, . . . , Tan and Ta1, respectively.

In this embodiment mode, the ratio of lengths of display time periods is determined to be $2^0:2^1:2^2: \ldots :2^{(n-2)}:2^{(n-1)}$ in the case where the time periods Td1 through Tdn are arranged in order of short length.

In this embodiment mode, the relationship of lengths of the writing time periods is Ta1=Ta2= . . . =Tan, that is, all the lengths are equal to each other. However, the present invention is not limited to such a relationship of lengths; the lengths of all the writing time periods may not be the same.

In the present invention, the combination of the display time periods Td1 through Tdn allows desired gray-scale display out of $2^n$ gray scales.

The sum of lengths of the display time periods during which a light emitting element emits light within one frame time period is obtained to determine the gray scale displayed by the pixel during that frame time period.

Since the percentage of the sum of display time periods within one frame time period (duty ratio) is 100 in this embodiment mode, display with high brightness can be realized.

(Embodiment Mode 2)

Figure 5:
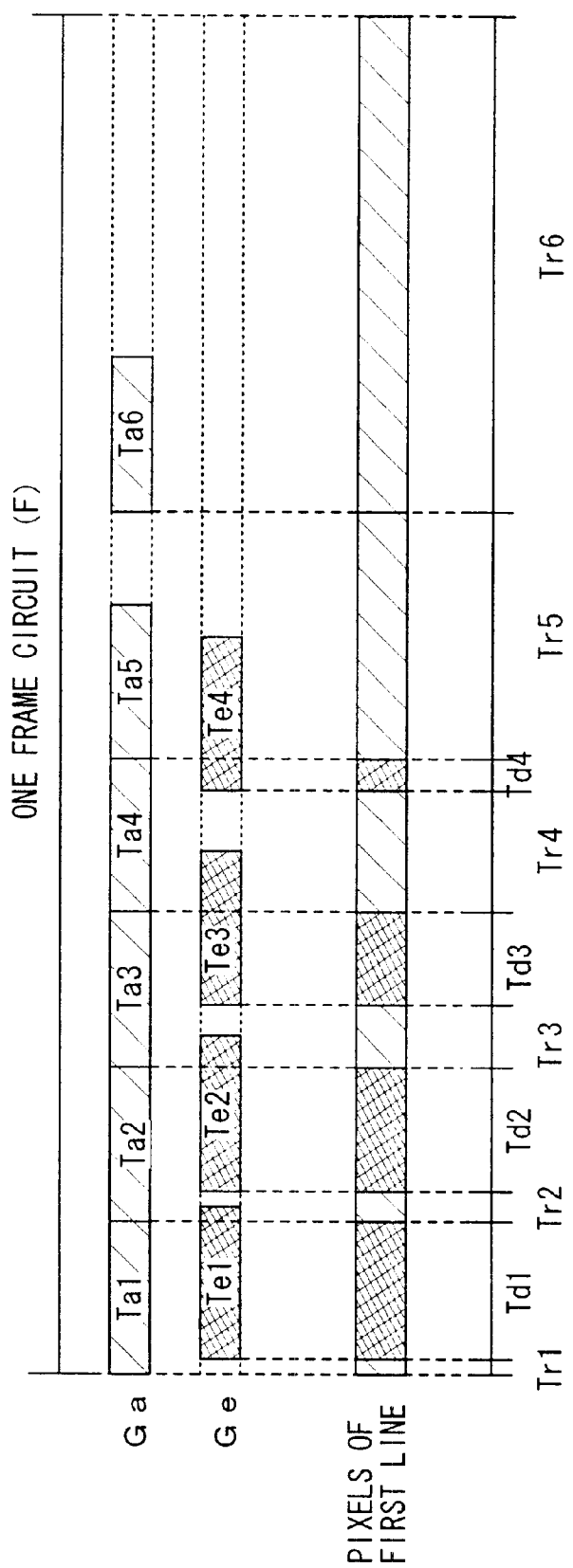
FIG. 5 is a timing chart showing a driving method of light emitting device according to the present invention.

In this embodiment mode, the case where a display time period during which a light emitting element does not emit light (black display time period) is provided will be described with reference to FIG. 5.

First, during the writing time period Ta1, a digital video signal of the first bit is input to each pixel (more specifically, a gate electrode of the TFT for current control 202 of each pixel) by the first group of driver circuits (Dr_L). Since the input of the digital video signal to the pixel in this embodiment mode is performed in the same manner as in Embodiment Mode 1, the detailed description of the operation of the first and second groups of driver circuits is herein omitted.

When the digital video signal of the first bit is input to each pixel, the light emitting element included in each pixel is selected to be in a light emitting state or a non-light emitting state, based on information of "0" or "1" of the digital video signal. Therefore, simultaneously with the beginning of the writing time period Ta1, the pixels start performing display to start the display time period Td1.

Next, before the completion of the writing time period Ta1, the writing time period Ta2 starts. Simultaneously with the beginning of the writing time period Ta2, the display time period Td1 is completed to start the display time period Td2.

During the writing time period Ta2, a digital signal always having information of "0" (non-display signal) is input to each pixel (more specifically, a gate electrode of the TFT for current control 202 of each pixel) by the second group of driver circuits (Dr_R). In contrast with the digital video signal, the non-display signal does not have image information, and always has information of "0".

Throughout this specification, a digital video signal having image information and a non-display signal that does not have image information are generically referred to as digital signals.

When the non-display signal is input to each pixel, the light emitting elements included in all the pixels are brought into a non-light emitting state by information of "0" of the non-display signal. Therefore, the pixels do not perform display during the display time period Td2.

In this embodiment mode, in the case where the digital signal has information of "0", the TFTs for current control 202 are turned OFF; in the case where the digital signal has information of "1", the TFTs for current control 202 are turned ON. However, the present invention is not limited to this structure. Alternatively, the TFTs for current control 202 may be turned ON in the case where the digital signal has information of "0", and the TFT for current control 202 may be turned OFF in the case where the digital signal has information of "1". In this case, the digital signal having information of "1" always serves as a non-display signal.

Throughout this specification, a display time period during which the pixels are brought into a non-light emitting state by a non-display signal that does not have image information is referred to as a black display time period.

Next, before or after the completion of the writing time period Ta2, the writing time period Ta3 starts. During the writing time period Ta3, a digital video signal of the second bit is input to each pixel by the first group of driver circuits (Dr_L).

When the digital video signal of the second bit is input to each pixel, the light emitting element included in each pixel is selected to be in a light emitting state or a non-light emitting state, based on information of "0" or "1" of the digital video signal of the second bit. Accordingly, simultaneously with the beginning of the writing time period Ta3, the pixels perform display to complete the display time period Td2 and to start the display time period Td3.

Next, before or after the completion of the writing time period Ta3, a writing time period Ta4 starts. In this embodiment mode, the writing time period Ta4 starts before the completion of the writing time period Ta3. During the writing time period Ta4, a digital video signal of the third bit is input to each pixel by the second group of driver circuits (Dr_R).

When the digital video signal of the third bit is input to each pixel, the light emitting element included in the pixel is selected to be in a light emitting state or a non-light emitting state, based on the information of "0" or "1" of the digital video signal of the third bit. Accordingly, simultaneously with the beginning of the writing time period Ta4, the display time period Td3 is completed to start the writing time period Td4.

Next, before or after the completion of the writing time period Ta4, a writing time period Ta5 starts. In this embodiment mode, the writing time period Ta5 starts before the completion of the writing time period Ta4. Simultaneously with the start of the writing time period Ta5, the display time period Td4 is completed to start the writing time period Td5.

During the writing time period Ta5, a digital signal always having information of 0 (non-display signal) is input to each pixel by the first group of driver circuits (Dr_L).

When the non-display signal is input to each pixel, the light emitting elements included in all the pixels are brought into a non-light emitting state by the information of "0" of the non-display signal. Therefore, during the display time period Td5, the pixels do not perform display to constitute a black display time period Td5.

The above-described operation is performed until the beginning of a writing time period Ta (m+j'). The symbol j' represents the number of black display time periods that appear until the beginning of the writing time period Ta (m+j').

Before the completion of a writing time period Ta (m−1+j'), the writing time period Ta (m+j') starts. Although FIG. 5 particularly shows the case of m=n−2 for convenience of the description, the present invention is not limited thereto.

During the writing time period Ta (m+j') [Ta (n−2+j')], a digital video signal of the mth bit [(n−2)th bit] is input to each pixel by the first group of driver circuits (Dr_L).

When the digital video signal of the mth bit [(n−2)th bit] is input to each pixel, the light emitting element included in each pixel is selected to be brought into a light emitting state or a non-light emitting state, based on information of "0" or "1" of the digital video signal of the mth bit [(n−2)th bit]. Accordingly, simultaneously with the beginning of the writing time period Ta(m+j') [Ta(n−2+j')], the pixels perform display to complete the display time period Td(m−1+j') [Td(n−3+j')] and to state a display time period Td(m+j') [Td(n−2+j')].

This display time period Td(m+j') [Td(n−2+j')] lasts until the writing time period Ta (m+j') [Ta (n−2+j')] is completed to start a next writing time period Ta (m+1+j') [Ta (n−1+j')].

When the writing time period Ta (m+1+j') [Ta (n−1+j')] starts, a digital video signal of the (m+1)th bit [(n−1)th bit] is input to each pixel by the first group of driver circuits (Dr_L).

Although the digital video signal is input to the pixels by the first group of driver circuits (Dr_L) during the writing time period Ta (m+1+j') [Ta (n−1+j')] in this embodiment mode, the present invention is not limited thereto. In the case where adjacent writing time periods do not overlap with each other, a group of driver circuits for inputting a digital video signal to the pixels during the adjacent writing time periods may be either the first group of driver circuits (Dr_L) or the second group of driver circuits (Dr_R) for both writing time periods.

When the digital video signal of the (m+1)th bit [(n−1)th bit] is input to each pixel, the light emitting element included in the pixel is selected to be brought into a light emitting state or a non-light emitting state, based on the information of "0" or "1" of the digital video signal of the (m+1)th bit [(n−1)th bit]. Accordingly, simultaneously with the beginning of the writing time period Ta (m+1+j') [Ta (n−1+j')], the pixels perform display to complete the display time period Td (m+j') [Td (n−2+j')] and to start a display time period Td (m+j'+1) [Td (n−1+j')].

This display time period Td (m+j'+1) [Td (n−1+j')] lasts until the writing time period Ta (m+1+j') [Ta (n−1+j')] is completed to start a next writing time period Ta (m+2+j') [Ta (n+j')]. Simultaneously with the beginning of the writing time period Ta (m+2+j) [Ta (n+j)], a display time period Td (m+2+j) [Td (n+j)] starts. Then, simultaneously with the beginning of the writing time period Ta1 within a next frame time period, the display time period Td (m+2+j) [Td (n+j)] is completed. The symbol j represents the number of black display time periods during one frame time period. In the case of this embodiment mode, since no black display time period appears from the beginning of the writing time period Ta (m+j') [Ta (n−2+j')], j'=j is established.

When all the display time periods Td1 through Td (n+j) are completed, one frame time period is terminated to allow one image to be displayed.

After the completion of one frame time period, the digital video signal of the first bit is input again to the pixels to start a display time period Td1. Then, the above-described operation is repeated. During a next frame time period after the completion of one frame time period, either the first group of driver circuits (Dr_L) or the second group of driver circuits (Dr_R) may be used for inputting the digital video signal of the first bit to the pixels.

The display time periods Td1, Td2, . . . , Td (n+j−1) and Td (n+j) respectively correspond to time periods from the beginning of the writing time periods Ta1, Ta2, . . . , Ta (n+j−1) and Ta (n+j) until the beginning of the following writing time periods Ta2, Ta3, . . . , Ta (n+j) and Ta 1.

In the case where the display time periods Td1 through Tdn except the black display time periods are arranged in order of short length, the ratio of lengths of the display time periods is $2^0:2^1:2^2: \ldots :2^{(n-2)}:2^{(n-1)}$.

The combination of display time periods except the black display time periods allows display of a desired gray scale out of $2^n$ gray scales. The sum of lengths of display time periods within one frame time period during which the light emitting elements emit light is obtained to determine the gray scale displayed by the pixels within that frame time period. In the case where the light emitting elements emit light during all display time periods except black display time periods in this embodiment mode, the brightness of pixels is 100%.

In this embodiment mode, by providing a black display time period during which display is not performed, the light emitting element is prevented from always emitting light so as to restrain the deterioration of the organic compound layer.

In this embodiment mode, when a display time period which is the longest black display time period within one frame time period is provided at the end of one frame time period, it is possible to make the human eyes recognize as if there were an interval of the frame time period between the longest black display time period and a following display time period. In this manner, unevenness in display, which results from adjacent display time periods of two adjacent frame time periods when intermediate gray-scale display is performed, can be made difficult to be recognized to the human eyes.

As described above in Embodiment Modes 1 and 2, gray-scale display is performed by the combination of display time periods according to the present invention. Therefore, as compared with an analog driving method, the brightness of a screen in gray-scale display is hardly affected by variation in $I_D-V_{GS}$ characteristic of the TFT.

In the present invention, the display time period and the writing time period partially overlap with each other. In other words, it is possible to make pixels perform display even during a writing time period. Accordingly, the percentage of the sum of lengths of display time periods within one frame time period (duty ratio) is not determined uniquely by the lengths of writing time periods.

The above-described driving method according to the present invention is applicable not only to a light emitting device, but also to devices using other passive elements. Moreover, in the case where high response speed liquid crystal having response time period of dozens of μsec or less is developed, it is possible to apply the driving method of the present invention to liquid crystal display devices.

(Embodiments)

Hereinafter, embodiments of the present invention will be described.

(Embodiment 1)

Figure 6A:
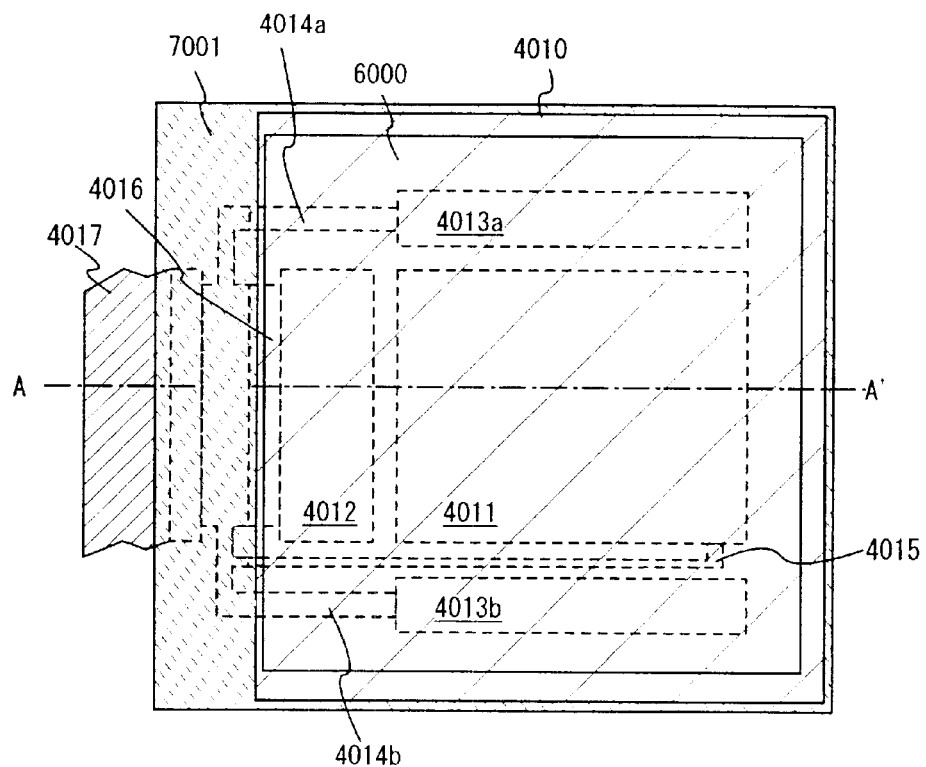
FIG. 6 is a timing chart showing a driving method of light emitting device according to the present invention.
Figure 6B:
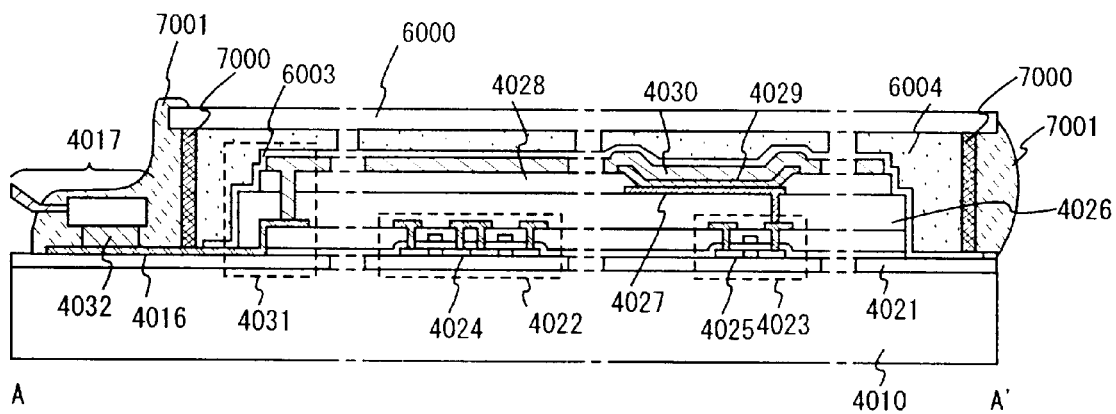

In this embodiment, the case where display of $2^6$ gray scales is performed by a 6-bit digital video signal in a light emitting device according to the present invention is described with reference to FIG. 6. A light emitting device of this embodiment has the structure shown in FIGS. 1 to 3.

First, during a writing time period Ta1, a digital video signal of the first bit is input to each pixel (more specifically, a gate electrode of the TFT for current control 202 included in each pixel) by the first group of driver circuits (Dr_L). Since the input of a digital video signal to a pixel in this embodiment is performed in the same manner as in Embodiment Modes 1 and 2 described above, the detailed description of the operation of the first group and the second group of driver circuits is herein omitted.

When the digital video signal of the first bit is input to each pixel, a light emitting element included in the pixel is selected to be brought into a light emitting state or a non-light emitting state, based on information of "0" or "1" of the digital video signal. Accordingly, simultaneously with the beginning of the writing time period Ta1, the pixels perform display to start a display time period Td1.

Next, a writing time period Ta2 starts before the completion of the writing time period Ta1. During the writing time period Ta2, a digital video signal of the second bit is input to each pixel by the second group of driver circuits (Dr_R).

When the digital video signal of the second bit is input to each pixel, a light emitting element included in the pixel is selected to be brought into a light emitting state or a non-light emitting state, based on information of "0" or "1" of the digital video signal of the second bit. Accordingly, simultaneously with the beginning of the writing time period Ta2, the pixels perform display to start a display time period Td2.

The above-described operation is repeated until a digital video signal of the nth bit is input to the pixels. As a result, display time periods Td1 through Td6 all appear (FIG. 6). The completion of all the display time periods Td1 through Td6 corresponds to the completion of one frame time period, thereby allowing one image to be displayed.

After the completion of one frame time period, the digital video signal of the first bit is input again to the pixels to start the display time period Td1. In this manner, the above-described operation is repeated.

The display time periods Td1, Td2, . . . , Td5 and Td6 respectively correspond to time periods from the beginning of the writing time periods Ta1, Ta2, . . . , Ta5 and Ta6 until the beginning of the following writing time periods Ta2, Ta3, . . . , Ta6 and Ta1.

In this embodiment, the ratio of lengths of the display time periods Td1 through Td6 is Td1:Td2:Td3:Td4:Td5:Td6=$2^2:2^3:2^1:2^4:2^0:2^5$. The ratio of lengths of the display time periods is not limited to this order. Any order may be accepted as long as the ratio of lengths of the display time periods is $2^0:2^1: \ldots :2^4:2^5$ in the case where the display time periods Td1 through Td6 are arranged in order of short length.

In this embodiment, display of a desired gray scale out of $2^6$ gray scales can be performed by the combination of the display time periods Td1 through Td6.

By obtaining the sum of lengths of the display time periods within one frame time period during which the light emitting elements emit light, the gray scale displayed by the pixels within that frame time period is determined. For example, assuming that the brightness in the case where the pixels emit light during all the display time periods is 100%, the brightness of 19% can be achieved in the case where the pixels emit light during the display time periods Td1 and Td2, and the brightness of 56% can be achieved in the case where the pixels emit light during the display time periods Td3, Td5 and Td6.

Since the percentage of the sum of lengths of the display time periods within one frame time period (duty ratio) is 100, display with high brightness can be performed.

(Embodiment 2)

In this embodiment, the case where display of $2^8$ gray scales is performed by an 8-bit digital video signal using 10 display time periods is described. A light emitting device of Embodiment 2 has the structure shown in FIGS. 1 to 3.

Figure 7A:
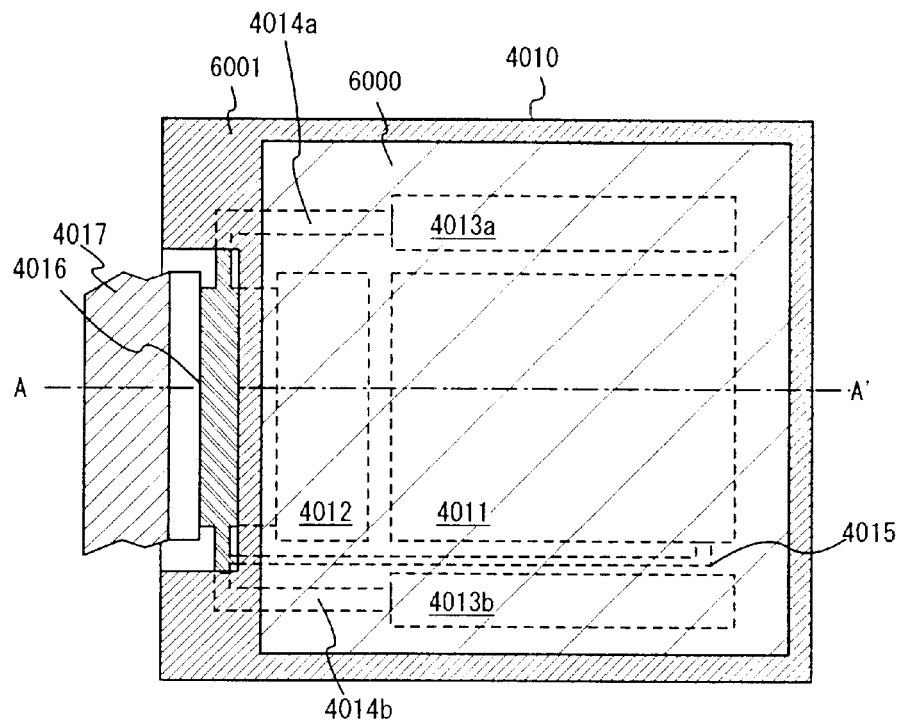
FIG. 7 is a timing chart showing a driving method of light emitting device according to the present invention.
Figure 7B:
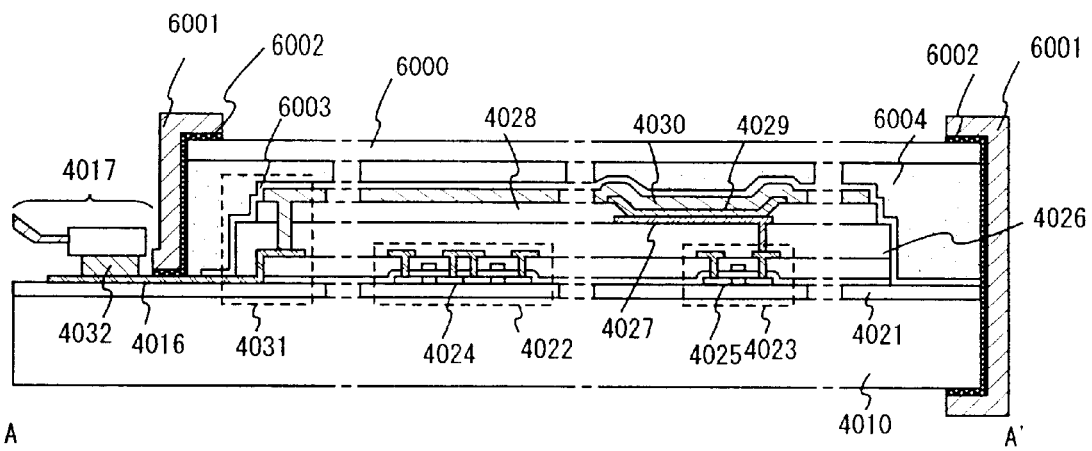

FIG. 7 is referred to. First, during a writing time period Ta1, a digital video signal of the first bit is input to each pixel (more specifically, a gate electrode of the TFT for current control 202 of each pixel) by the first group of driver circuits (Dr_L). Since the input of a digital video signal to the pixels in Embodiment 2 is performed in the same manner as in the above-described embodiment modes, the description of the detailed operation of the first and the second groups of driver circuits is herein omitted.

When the digital video signal of the first bit is input to each pixel, the light emitting element included in the pixel is selected to be brought into a light emitting state or a non-light emitting state, based on information of "0" or "1" of the digital video signal. Accordingly, simultaneously with the beginning of the writing time period Ta1, the pixels perform display to start a display time period Td1.

Next, before the completion of the writing time period Ta1, a writing time period Ta2 starts. During the writing time period Ta2, a digital video signal of the second bit is input to each pixel by the second group of driver circuits (Dr_R).

When the digital video signal of the second bit is input to each pixel, the light emitting element included in the pixel is selected to be brought into a light emitting state or a non-light emitting state, based on information of "0" or "1" of the digital video signal of the second bit. Accordingly, simultaneously with the beginning of the writing time period Ta2, the pixels perform display to complete the display time period Td1 and to start a display time period Td2.

Next, after the completion of the writing time period Ta2, a writing time period Ta3 starts. During the writing time period Ta3, a digital video signal of the third bit is input to each pixel by the first group of driver circuits (Dr_L). Then, simultaneously with the beginning of the writing time period Ta3, the pixels perform display to complete the display time period Td2 and to start a display time period Td3.

Next, before the completion of the writing time period Ta3, a writing time period Ta4 starts. During the writing time period Ta4, a digital video signal of the fourth bit is input to each pixel by the second group of driver circuits (Dr_R). Then, simultaneously with the beginning of the writing time period Ta4, the pixels perform display to complete the display time period Td3 and to start a display time period Td4.

Next, after the completion of the writing time period Ta4, a writing time period Ta5 starts. During the writing time period Ta5, a digital video signal of the fifth bit is input to each pixel by the first group of driver circuits (Dr_L). Then, simultaneously with the beginning of the writing time period Ta5, the pixels perform display to complete the display time period Td4 and to start a display time period Td5.

The above-described operation is repeated, so that all the display time periods Td1 through Td10 appear (FIG. 7). The completion of all the display time periods Td1 through Td10 corresponds to the completion of one frame time period to allow one image to be displayed.

After the completion of one frame time period, the writing time period Ta1 starts. Then, the digital video signal of the first bit is input again to the pixels to start the display time period Td1. In this manner, the above-described operation is repeated.

The display time periods Td1, Td2, . . . , Td9 and Td10 respectively correspond to time periods from the beginning of the writing time periods Ta1, Ta2, . . . , Ta9 and Ta10 until the beginning of the following writing time periods Ta2, Ta3, . . . , Ta10 and Ta1.

In this embodiment, the digital video signal of the same bit number is input to the pixels during the writing time periods Ta6, Ta8 and Ta10. More specifically, in this embodiment, the digital video signal of the sixth bit is input to the pixels during the writing time periods Ta6, Ta8 and Ta10.

Moreover, in this embodiment, the ratio of lengths of the display time periods Td1 through Td10 is Td9:Td7:Td5:Td3:Td1:Td2:Td4:(Td6+Td8+Td10)= $2^0:2^1:2^2:2^3:2^4:2^5:2^6:2^7$. The ratio of lengths of the display time periods is not limited to this order. Any order of the ratio of lengths can be accepted as long as the ratio of lengths is $2^0:2^1: \ldots :2^4:2^7$ in the case where the display time periods Td1 through Tdn are arranged in order of short length.

Thus, in this embodiment, three display time periods Td6, Td8 and Td10 function as one display time period to realize $2^8$ gray-scale display. Moreover, the combination of the display time periods Td1 through Td10 allows display of a desired gray scale out of $2^8$ gray scales.

The sum of lengths of the display time periods within one frame time period during which the light emitting elements emit light is obtained to determine the gray scale displayed by the pixels during that frame time period. For example, assuming that the brightness in the case where the pixels emit light during all the display time periods is 100%, the brightness of 19% can be achieved in the case where the pixels emit light during the display time periods Td1 and Td2, and the brightness of 55% can be achieved in the case where the pixels emit light during the display time periods Td3, Td5, Td6, Td8 and Td10.

Since the ratio of the sum of lengths of the display time periods within one frame time period (duty ratio) is 100, display with high brightness can be performed.

(Embodiment 3)

In this embodiment, the case where display of $2^6$ gray scales is performed by a 6-bit digital video signal using 10 display time periods is described. A light emitting device of Embodiment 3 has the structure shown in FIGS. 1 to 3.

Figure 8:
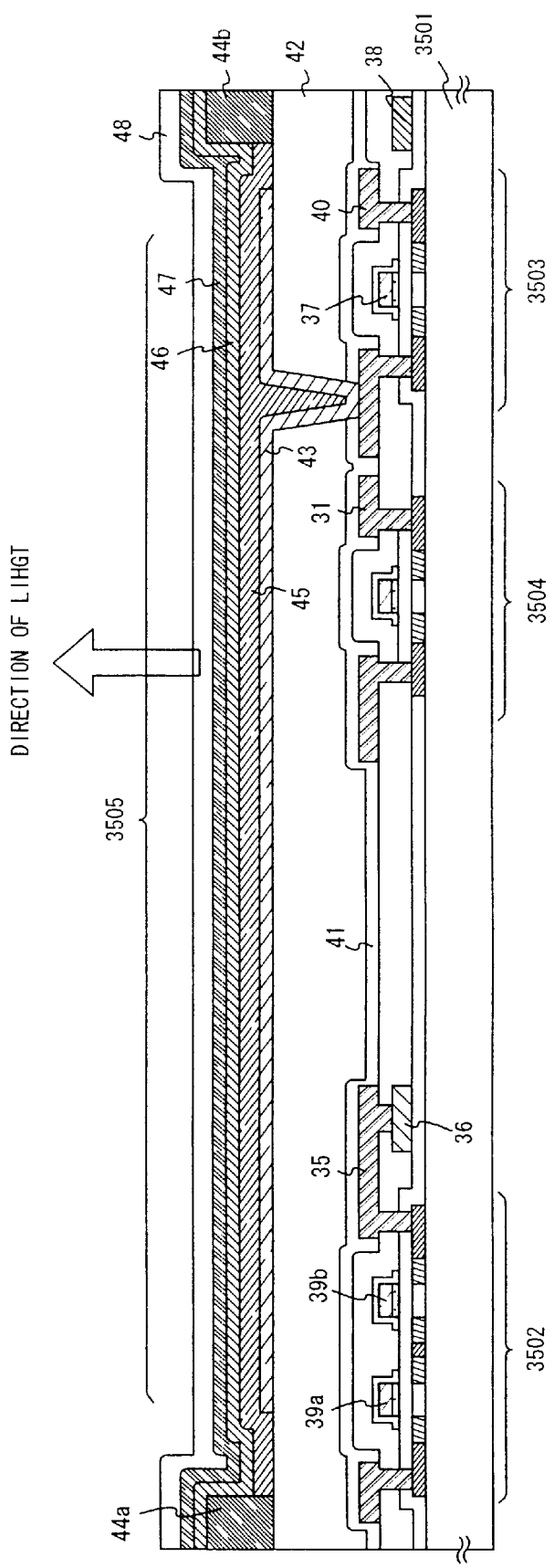
FIG. 8 is a timing chart showing a driving method of light emitting device according to the present invention.

FIG. 8 is referred to. First, during a writing time period Ta1, a digital video signal of the first bit is input to each pixel (more specifically, a gate electrode of the TFT for current control 202 of each pixel) by the first group of driver circuits (Dr_L). Since the input of a digital video signal to the pixels in Embodiment 3 is performed in the same manner as in the above-described embodiment modes, the detailed description of the operation of the first and the second groups of driver circuits is herein omitted.

When the digital video signal of the first bit is input to each pixel, the light emitting element included in the pixel is selected to be brought into a light emitting state or a non-light emitting state, based on information of "0" or "1" of the digital video signal of the first bit. Accordingly, simultaneously with the beginning of the writing time period Ta1, the pixels perform display to start a display time period Td1.

Next, before the completion of the writing time period Ta1, a writing time period Ta2 starts. During the writing time period Ta2, a digital video signal always having information of "0" (non-display signal) is input to each pixel (more specifically, a gate electrode of the TFT for current control 202 included in each pixel) by the second group of driver circuits (Dr_R). In this embodiment, in the case where the digital signal has information of "0", the TFT for current control 202 is turned OFF; in the case where the digital signal has information of "1", the TFT for current control 202 is turned ON. However, the present invention is not limited to this structure. Alternatively, the TFT for current control 202 may be turned ON in the case where the digital signal has information of "0", and the TFT for current control 202 is turned OFF in the case where the digital signal has information of "1". In such a case, the digital signal always having information of "1" acts as a non-display signal.

When the non-display signal is input to each pixel, the light emitting elements included in all pixels are brought into a non-light emitting state. Accordingly, simultaneously with the beginning of the writing time period Ta2, the pixels stop performing display to terminate the display time period Td1 and to start the display time period Td2 that is a black display time period.

Next, after the completion of the writing time period Ta2, a writing time period Ta3 starts. During the writing time period Ta3, a digital video signal of the second bit is input to each pixel by the first group of driver circuits (Dr_L). The light emitting element included in each pixel is selected to be brought into a light emitting state or a non-light emitting state, based on information of "0" or "1" of the digital video signal of the second bit. Then, simultaneously with the beginning of the writing time period Ta3, the pixels perform display to complete the display time period Td2 and to start a display time period Td3.

The above-described operation is performed until a digital video signal of the fifth bit is input to the pixels during the writing time period Ta9. After the completion of the writing time period Ta9, a writing time period Ta10 starts.

During the writing time period Ta10, a digital video signal of the sixth bit is input to each pixel. The light emitting element included in each pixel is selected to be brought into a light emitting state or a non-light emitting state, based on information of "0" or "1" of the digital video signal of the sixth bit. Thus, simultaneously with the beginning of the writing time period Ta10, the pixels perform display to complete the display time period Td9 and to start a display time period Td10.

The completion of all the display time periods Td1 through Td10 corresponds to the completion of one frame time period to allow one image to be displayed.

After the completion of one frame time period, a digital video signal of the first bit is input again to the pixels to start the writing time period Ta1. In this manner, the above-described operation is repeated.

The display time periods Td1, Td2, . . . , Td9 and Td10 respectively correspond to time periods from the beginning of the writing time periods Ta1, Ta2, . . . , Ta9 and Ta10 until the beginning of the following writing time periods Ta2, Ta3, . . . , Ta10 and Ta1.

In this embodiment, among the display time periods Td1 through Td10, the display time periods Td2, Td4, Td6 and Td8 are black display time periods. Therefore, six display time periods Td1, Td3, TD5, Td7, Td9 and Td10 perform $2^6$ gray-scale display.

In this embodiment, the ratio of lengths of the display time periods Td1, Td3, Td5, Td7, Td9 and Td10 except for the black display time periods is Td1:Td3:Td5:Td7:Td9:Td10=$2^0:2^1:2^2:2^3:2^4:2^5$. The ratio of lengths of the display time periods is not limited to this order. Any order of the radio of lengths is accepted as long as the ratio of lengths may be $2^0:2^1: \ldots :2^4:2^5$ in the case where the display time periods Td1, Td3, Td5, Td7, Td9 and Td10 are arranged in order of short length.

The sum of lengths of the display time periods within one frame time period during which the light emitting elements emits light is obtained to determine the gray scale displayed by the pixels during the frame time period. For example, assuming that the brightness in the case where the pixels emit light during all the display time periods is 100%, the brightness of 8% can be achieved in the case where the pixels emit light during the display time periods Td1 and Td5, and the brightness of 60% can be achieved in the case where the pixels emit light during the display time periods Td3, Td5 and Td10.

In this embodiment, by providing a black display time period during which display is not performed, the light emitting element can be prevented from always emitting light to restrain the deterioration of the organic compound layer.

(Embodiment 4)

In this embodiment, the case where $2^6$ gray-scale display is performed by a 6-bit digital video signal using 7 display time periods is described. A light emitting device of Embodiment 4 has the structure shown in FIGS. 1 to 3.

Figure 9:
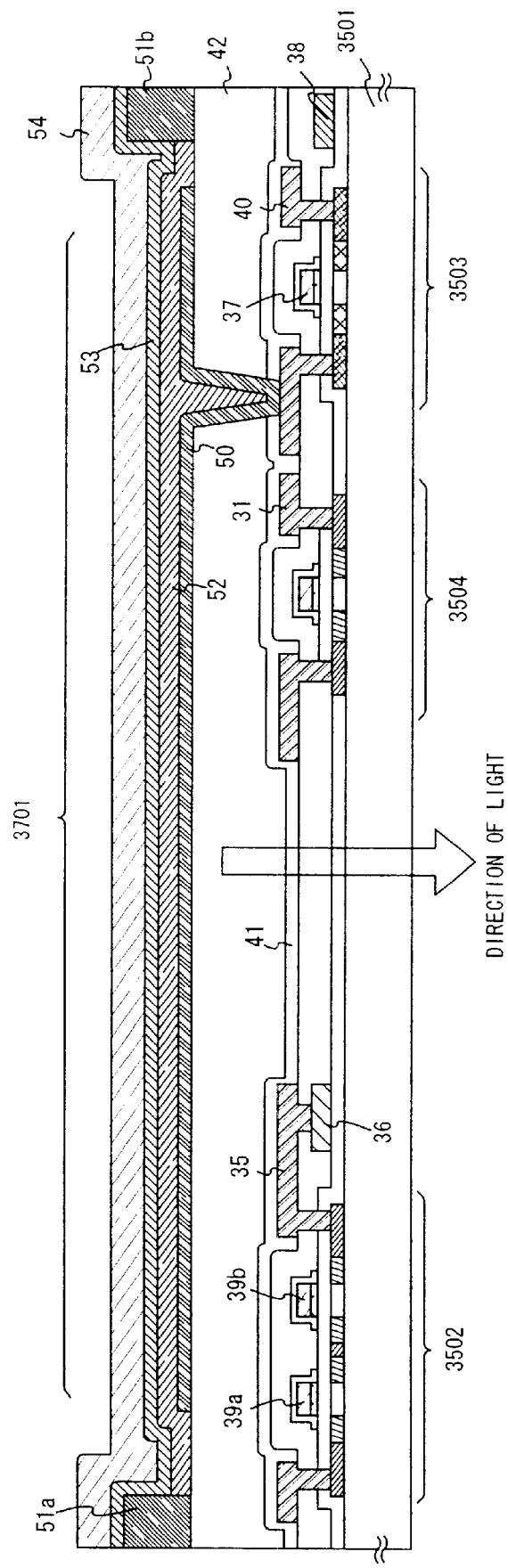
FIG. 9 is a timing chart showing a driving method of light emitting device according to the present invention.

FIG. 9 is referred to. First, during the writing time period Ta1, a digital video signal of the first bit is input to each pixel (more specifically, a gate electrode of the TFT for current control 202 of each pixel) by the first group of driver circuits (Dr_L). Since the input of a digital video signal to the pixel in Embodiment 4 is performed in the same manner as in the above-described embodiment modes, the detailed description of the operation of the first and the second groups of driver circuits is herein omitted.

When the digital video signal of the first bit is input to each pixel, the light emitting elements included in the pixels are selected to be brought into a light emitting state or a non-light emitting state, based on information of "0" or "1" of the digital video signal of the first bit. Accordingly, simultaneously with the beginning of the writing time period Ta1, the pixels perform display to start a display time period Td1.

Next, after the completion of the writing time period Ta1, a writing time period Ta2 starts. During the writing time period Ta2, a digital video signal of the second bit always having information of "0" is input to each pixel (more specifically, a gate electrode of the TFT for current control 202 included in each pixel) by the second group of driver circuits (Dr_R).

When a digital video signal of the second bit is input to each pixel, the light emitting elements included in all pixels are selected to be brought into a light emitting state or a non-light emitting state, based on the information of "0" or "1" of the digital video signal of the second bit. Accordingly, simultaneously with the beginning of the writing time period Ta2, the pixels perform display to terminate the display time period Td1 and to start the display time period Td2.

Next, after the completion of the writing time period Ta2, a writing time period Ta3 starts. During the writing time period Ta3, a digital video signal of the third bit is input to each pixel by the first group of driver circuits (Dr_L). The light emitting element included in each pixel is selected to be brought into a light emitting state or a non-light emitting state, based on information of "0" or "1" of the digital video signal of the third bit. Then, simultaneously with the beginning of the writing time period Ta3, the pixels perform display to complete the display time period Td2 and to start a display time period Td3.

Next, before the completion of the writing time period Ta3, a writing time period Ta4 starts. During the writing time period Ta4, a digital signal always having information of "0" (non-display signal) is input to each pixel by the second group of driver circuits (Dr_R). When the non-display signal is input to each pixel, the light emitting elements included in all pixels are brought into a non-light emitting state by information of "0" of the non-display signal. Accordingly, simultaneously with the beginning of the writing time period Ta4, the pixels stop performing display to complete the display time period Td3 and to start a display time period Td4 that is a black display time period.

Next, simultaneously with the completion of the writing time period Ta4, a writing time period Ta5 starts. During the writing time period Ta5, a digital video signal of the fourth bit is input to each pixel by the first group of driver circuits (Dr_L). The light emitting element included in each pixel is selected to be brought into a light emitting state or a non-light emitting state, based on information of "0" or "1" of the digital video signal of the fourth bit. Therefore, simultaneously with the beginning of the writing time period Ta5, the pixels perform display to complete the display time period Td4 and to start a display time period Td5.

Next, before the completion of the writing time period Ta5, a writing time period Ta6 starts. During the writing time period Ta6, a digital video signal of the fifth bit is input to each pixel by the second group of driver circuits (Dr_R). The light emitting element included in each pixel is selected to be brought into a light emitting state or a non-light emitting state, based on information of "0" or "1" of the digital video signal of the fifth bit. Therefore, simultaneously with the beginning of the writing time period Ta6, the pixels perform display to complete the display time period Td5 and to start a display time period Td6.

Next, after the completion of the writing time period Ta6, the writing time period Ta7 starts. During the writing time period Ta7, a digital video signal of the sixth bit is input to each pixel by the first group of driver circuits (Dr_L). Then, the light emitting element included in each pixel is selected to be brought into a light emitting state or a non-light emitting state, based on information of "0" or "1" of the digital video signal of the sixth bit. Therefore, simultaneously with the beginning of the writing time period Ta7, the pixels perform display to complete the display time period Td6 and to start a display time period Td7.

Next, before the completion of the writing time period Ta7, a writing time period Ta8 starts. During the writing time period Ta8, a digital signal always having information of "0" (non-display signal) is input to each pixel by the second group of driver circuits (Dr_R). When the non-display signal is input to each pixel, the light emitting elements included in all pixels are brought into a non-light emitting state, based on information of 0 of the non-display signal. Therefore, simultaneously with the beginning of the writing time period Ta8, the pixels stop performing display to complete the display time period Td7 and to start a display time period Td8.

The completion of all the display time periods Td1 through Td8 corresponds to the completion of one frame time period to allow one image to be displayed.

After the completion of one frame time period, a digital video signal of the first bit is input again to the pixels to start the display time period Td1. In this manner, the above-described operation is repeated.

The display time periods Td1, Td2, . . . , Td7 and Td8 respectively correspond to time periods from the beginning of the writing time periods Ta1, Ta2, . . . , Ta7 and Ta8 until the beginning of the following writing time periods Ta2, Ta3, . . . , Ta8 and Ta1.

In this embodiment, among the display time periods Td1 through Td8, the display time periods Td4 and Td8 are black display time periods. Therefore, $2^6$ gray-scale display is performed by six display time periods Td1, Td2, Td3, Td5, Td6 and Td7.

In this embodiment, the ratio of lengths of the display time periods Td1, Td2, Td3, Td5, Td6 and Td7 excluding the black display time periods is $Td7:Td5:Td3:Td1:Td2:Td6= 2^0:2^1:2^2:2^3:2^4:2^5$. The ratio of lengths of the display time periods is not limited to this order. Any order is accepted as long as the ratio of lengths is $2^0:2^1: \ldots :2^4:2^5$ in the case where the display time periods Td1, Td2, Td3, Td5, Td6 and Td7 are arranged in order of short length.

The sum of lengths of the display time periods within one frame time period during which the light emitting elements emit light is obtained to determine the gray scale displayed by the pixels during the frame time period. For example, assuming that the brightness in the case where the pixels emit light during all the display time periods is 100%, the brightness of 13% can be achieved in the case where the pixels emit light during the display time period Td1, and the brightness of 56% can be achieved in the case where the display time periods Td3 and Td6 are selected.

In this embodiment, by providing a black display time period during which display is not performed, the light emitting element is prevented from always emitting light to restrain the deterioration of the organic compound layer.

(Embodiment 5)

In this embodiment, the case where $2^6$ gray-scale display is performed by a 6-bit digital video signal using 8 display time periods is described. A light emitting device of Embodiment 5 has the structure shown in FIGS. 1 to 3.

Figure 10A:
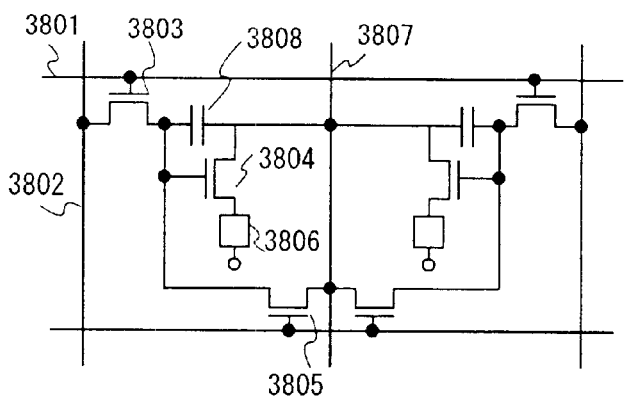
FIG. 10 is a timing chart showing a driving method of light emitting device according to the present invention.
Figure 10B:
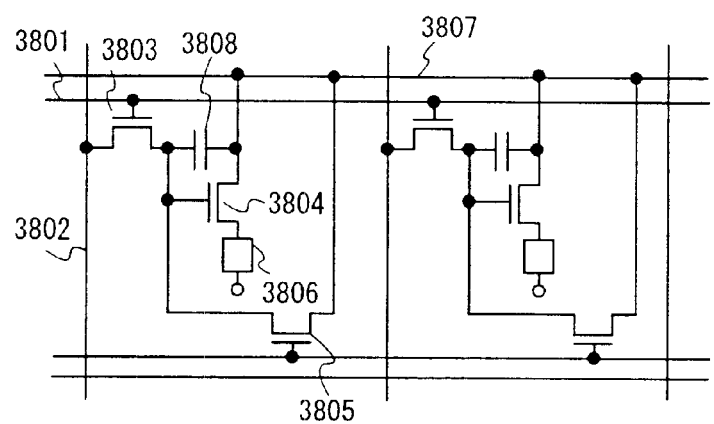
Figure 10C:
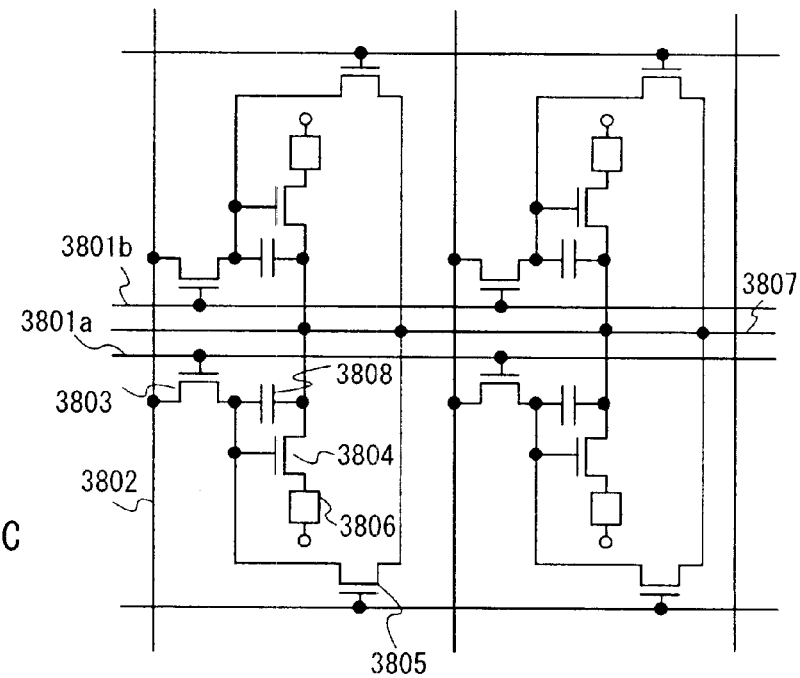

FIG. 10 is referred to. First, during the writing time period Ta1, a digital video signal of the first bit is input to each pixel (more specifically, a gate electrode of the TFT for current control 202 of each pixel) by the first group of driver circuits (Dr_L). Since the input of a digital video signal to the pixels is performed in Embodiment 5 in the same manner as in the above-described embodiment modes, the detailed description of the operation of the first and the second groups of driver circuits is herein omitted.

When the digital video signal of the first bit is input to each pixel, the light emitting element included in the pixel is selected to be brought into a light emitting state or a non-light emitting state, based on information of "0" or "1" of the digital video signal of the first bit. Accordingly, simultaneously with the beginning of the writing time period Ta1, the pixels perform display to start a display time period Td1.

Next, after the completion of the writing time period Ta1, a writing time period Ta2 starts. During the writing time period Ta2, a digital video signal of the second bit is input to each pixel by the second group of driver circuits (Dr_R).

When the digital video signal of the second bit is input to each pixel, the light emitting element included in the pixel is selected to be brought into a light emitting state or a non-light emitting state, based on information of "0" or "1" of the digital video signal of the second bit. Accordingly, simultaneously with the beginning of the writing time period Ta2, the pixels perform display to terminate the display time period Td1 and to start a display time period Td2.

Next, before the completion of the writing time period Ta2, a writing time period Ta3 starts. During the writing time period Ta3, a digital video signal of the third bit is input to each pixel by the first group of driver circuits (Dr_L). The light emitting element included in each pixel is selected to be brought into a light emitting state or a non-light emitting state, based on information of "0" or "1" of the digital video signal of the third bit. Then, simultaneously with the beginning of the writing time period Ta3, the pixels perform display to complete the display time period Td2 and to start a display time period Td3.

Next, after the completion of the writing time period Ta3, the writing time period Ta4 starts. During the writing time period Ta4, a digital signal of the fourth bit is input to each pixel by the second group of driver circuits (Dr_R). Then, the light emitting element included in each pixel is selected to be brought into a light emitting state or a non-light emitting state, based on information of "0" or "1" of the digital video signal of the fourth bit. Accordingly, simultaneously with the beginning of the writing time period Ta4, the pixels stop performing display to complete the display time period Td3 and to start a display time period Td4.

Next, before the completion of the writing time period Ta4, a writing time period Ta5 starts. During the writing time period Ta5, a digital video signal of the fifth bit is input to each pixel by the first group of driver circuits (Dr_L). The light emitting element included in each pixel is selected to be brought into a light emitting state or a non-light emitting state, based on information of "0" or "1" of the digital video signal of the fifth bit. Therefore, simultaneously with the beginning of the writing time period Ta5, the pixels perform display to complete the display time period Td4 and to start a display time period Td5.

Next, after the completion of the writing time period Ta5, a writing time period Ta6 starts. During the writing time period Ta6, a digital video signal of the sixth bit is input to each pixel by the second group of driver circuits (Dr_R). Then, the light emitting element included in each pixel is selected to be brought into a light emitting state or a non-light emitting state, based on information of "0" or "1" of the digital video signal of the sixth bit. Therefore, simultaneously with the beginning of the writing time period Ta6, the pixels perform display to complete the display time period Td5 and to start a display time period Td6.

Next, before the completion of the writing time period Ta6, the writing time period Ta7 starts. During the writing time period Ta7, a digital signal always having information of "0" (non-display signal) is input to each pixel by the first group of driver circuits (Dr_L). When the non-display signal is input to each pixel, the light emitting elements included in all the pixels are brought into a non-light emitting state, based on "0" information of the non-display signal. Therefore, simultaneously with the beginning of the writing time period Ta7, the pixels stop performing display to complete the display time period Td6 and to start a display time period Td7.

The completion of all the display time periods Td1 through Td8 corresponds to the completion of one frame time period to allow one image to be displayed.

After the completion of one frame time period, a digital video signal of the first bit is input again to the pixels to start the display time period Td1. In this manner, the above-described operation is repeated.

The display time periods Td1, Td2, ..., Td6 and Td7 respectively correspond to time periods from the beginning of the writing time periods Ta1, Ta2, ..., Ta6 and Ta7 until the beginning of the following writing time periods Ta2, Ta3, ..., Ta7 and Ta1.

In this embodiment, among the display time periods Td1 through Td7, the display time period Td7 is a black display time period. Therefore, $2^6$ gray-scale display is realized by six display time periods Td1 through Td6.

In this embodiment, the ratio of lengths of the display time periods Td1 through Td6 excluding the black display time periods is Td6:Td4:Td2:Td1:Td3:Td5 = $2^0:2^1:2^2 2^3:2^4:2^5$. The ratio of lengths of the display time periods is not limited to this order. Any order is accepted as long as the ratio of lengths is $2^0:2^1: \ldots :2^4:2^5$ in the case where the display time periods Td1 through Td6 are arranged in order of short length.

The sum of lengths of the display time periods within one frame time period during which the light emitting elements emit light is obtained to determine the gray scale displayed by the pixels during that frame time period. For example, assuming that the brightness in the case where the pixels emit light during all the display time periods is 100%, the brightness of 13% can be achieved in the case where the pixels emit light during the display time period Td1, and the brightness of 78% can be achieved in the case where the display time periods Td3, Td5 and Td6 are selected.

In this embodiment, by providing a black display time period during which display is not performed, the light emitting element is prevented from always emitting light to restrain the deterioration of the organic compound layer.

(Embodiment 6)

In Embodiment 6, in the light emitting device shown in FIG. 1 according to the present invention, a method for driving the first and the second source signal line driver circuits 102a and 102b and the first and the second gate signal line driver circuits 103a and 103b will be described in detail. Although a method for driving the first group of driver circuits (Dr_L) is only described in this embodiment for facility of understanding, the second group of driver circuits (Dr_R) can be driven in the same manner as the first group of driver circuits (Dr_L).

In the first source signal line driver circuit 102a, a clock signal (CLK) and a start pulse (SP) are input to the shift register 105. The shift register 105 sequentially generates timing signals based on these clock signal (CLK) and start pulse (SP) so as to sequentially supply the timing signals to a circuit at the following stage.

The timing signals from the shift register 105 may be buffer-amplified by a buffer or the like (not shown) so as to sequentially supply the buffer-amplified timing signals to the circuit at the following stage. Since a plurality of circuits or elements are connected to a wiring to which the timing signals are supplied, the wiring has a large amount of load capacitance (parasitic capacitance). In order to prevent a rising edge or a falling edge of the timing signals from being "dulled" due to a large amount of load capacitance, the buffer is provided.

The timing signals from the shift register 105 are input to the latch (A) 106. The latch (A) 106 includes latches at a plurality of stages for processing digital signals. Simultaneously with the input of the timing signals, digital signals are sequentially input to the latch (A) 106 to be held therein.

In Embodiment 6, the digital signals are sequentially input to the latches at a plurality of stages included in the latch (A) 106. However, the present invention is not limited to this structure. Alternatively, division driving may be performed, in which the latches at a plurality of stages included in the latch (A) 106 are divided into some groups and the digital signals are simultaneously input to these groups in parallel. The number of groups is referred to as the number of division. For example, when the latches are divided into groups at four stages, this type of driving is referred to as four-division driving.

The time period until the completion of input of the digital signals to the latch at all stages of the latch (A) 106 is referred to as a line time period. In other words, a line time period corresponds to a time period from the beginning of the input of the digital signals to the latch at the leftmost stage in the latch (A) 106 until the completion of the input of the digital signals to the latch at the rightmost stage. Actually, the line time period may further include a horizontal blanking time period.

When one line time period is completed, a latch signal is supplied to the latch (B) 107. Upon supply of the latch signal, the digital signals input to the latch (A) 106 and held therein are sent to the latch (B) 107 at a time so as to be input to the latches at all stages of the latch (B) 107 and held therein.

After the latch (A) 106 finishes sending the digital signals to the latch (B) 107, the digital signals are sequentially input again to the latch (A) 106, based on the timing signal from the shift register 105.

During this second line time period, the digital signals input to the latch (B) 102*b* and held therein are input to the first source signal line.

On the other hand, in the first gate signal line driver circuit 103*a*, the timing signal from a shift register (not shown) is input to a buffer (not shown) to be then input to the corresponding gate signal lines (GL1 through GLy). Gate electrodes of the first TFTs for switching 201*a* of the pixels for one line are respectively connected to the gate signal lines (GL1 through GLy). Thus, since the first TFTs for switching 201*a* of all the pixels for one line should be driven at a time, a buffer allowing a large amount of current to be flowed is used.

In the present invention, the pixel region 101, the first source signal line driver circuit 102*a*, the second source signal line driver circuit 102*b*, the first gate signal line driver circuit 103*a* and the second gate signal line driver circuit 103*b* may be formed on the same substrate by using TFTs. In such a case, the size of electric appliances having the light emitting device according to the present invention as a display can be reduced.

Embodiment 6 can be carried out in free combination with Embodiments 1 to 5.

(Embodiment 7)

The embodiments of the present invention are explained using FIGS. 11 to 13. A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits. The first switching TFT can be formed by the same method of the second switching TFT, so the first switching TFT and the current control TFT are shown one by one as a pixel TFT in this embodiment.

First, as shown in FIG. 11A, a base film 401 made of an insulating film such as a silicon oxide film, a silicon nitride film, or a silicon oxynitride film, is formed on a substrate 400 made of a glass such as barium borosilicate glass or aluminum borosilicate glass, typically a glass such as Corning Corp. #7059 glass or #1737 glass. For example, a lamination film of a silicon oxynitride film, manufactured from $SiH_4$, $NH_3$, and $N_2O$ by plasma CVD, and formed having a thickness of 10 to 200 nm (preferably between 50 and 100 nm), and a hydrogenated silicon oxynitride film, similarly manufactured from $SiH_4$ and $N_2O$, and formed having a thickness of 50 to 200 nm (preferably between 100 and 150 nm), is formed. In FIG. 11A shows two layers structure base film as a single layer. A two layer structure is shown for the base film 401 in Embodiment 7, but a single layer film of the insulating film, and a structure in which more than two layers are laminated, may also be formed.

Semiconductor layers 402 to 405 are formed by crystalline semiconductor films made from a semiconductor film having an amorphous structure, using a laser crystallization method or a known thermal crystallization method. The thickness of the semiconductor layers 402 to 405 may be formed from 25 to 80 nm (preferably between 30 and 60 nm). There are no limitations placed on the materials for forming a crystalline semiconductor film, but it is preferable to form the crystalline semiconductor films by silicon or a silicon germanium (SiGe) alloy.

As for known crystallization methods, there is a thermal crystallization method using an electric furnace, a laser annealing crystallization method using laser light, a lamp annealing crystallization method using infrared light, and a crystallization method using a catalyst metal.

A laser such as a pulse oscillation type or continuous light emission type excimer laser, a YAG laser, or a $YVO_4$ laser can be used to fabricate the crystalline semiconductor films by the laser crystallization method. A method of condensing laser light emitted from a laser oscillator into a linear shape by an optical system and then irradiating the light to the semiconductor film may be used when these types of lasers are used. The crystallization conditions may be suitably selected by the operator, but when using the excimer laser, the pulse oscillation frequency is set to 300 Hz, and the laser energy density is set form 100 to 400 $mJ/cm^2$ (typically between 200 and 300 $mJ/cm^2$). Further, when using the YAG laser, the second harmonic is used and the pulse oscillation frequency is set from 30 to 300 kHz, and the laser energy density may be set from 300 to 600 $mJ/cm^2$ (typically between 350 and 500 $mJ/cm^2$). The laser light condensed into a linear shape with a width of 100 to 1000 $\mu m$, for example 400 $\mu m$, is then irradiated over the entire surface of the substrate. This is performed with an overlap ratio of 50 to 90% for the linear laser light.

A gate insulating film 406 is formed covering the semiconductor layers 402 to 405. The gate insulating film 406 is formed of an insulating film containing silicon with a thickness of 40 to 150 nm by plasma CVD or sputtering. A 120 nm thick silicon oxynitride film is formed in Embodiment 7. The gate insulating film 406 is not limited to this type of silicon oxynitride film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, at between 400 and 500° C., of the silicon oxide film thus manufactured.

A first conductive film 407 and a second conductive film 408 are then formed on the gate insulating film 406 in order to form gate electrodes. The first conductive film 407 is formed of a Ta film with a thickness of 50 to 100 nm, and the second conductive film 408 is formed of a W film having a thickness of 100 to 300 nm, in Embodiment 7.

The Ta film is formed by sputtering, and sputtering of a Ta target is performed by Ar. If appropriate amounts of Xe and Kr are added to Ar, the internal stress of the Ta film is relaxed, and film peeling can be prevented. The resistivity of an α phase Ta film is about 20 $\mu\Omega cm$, and it can be used in the gate electrode, but the resistivity of a β phase Ta film is about 180 $\mu\Omega cm$ and it is unsuitable for the gate electrode. The α phase Ta film can easily be obtained if a tantalum nitride film, which possesses a crystal structure similar to that of α phase Ta, is formed with a thickness of about 10 to 50 nm as a base for a Ta film in order to form the α phase Ta film.

The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 $\mu\Omega$cm. The resistivity can be lowered by enlarging the crystal grains of the W film, but for cases in which there are many impurity elements such as oxygen within the W film, crystallization is inhibited, thereby the film becomes high resistance. A W target having a purity of 99.9999% or 99.99% is thus used in sputtering. In addition, by forming the W film while taking sufficient care that no impurities from the gas phase are introduced at the time of film formation, the resistivity of 9 to 20 $\mu\Omega$cm can be achieved.

Note that, although the first conductive film 407 is a Ta film and the second conductive film 408 is a W film in Embodiment 7, both may also be formed from an element selected from the group consisting of Ta, W, Ti, Mo, Al, and Cu, or from an alloy material having one of these elements as its main constituent, and a chemical compound material. Further, a semiconductor film, typically a polycrystalline silicon film into which an impurity element such as phosphorus is doped, may also be used. Examples of preferable combinations other than that used in Embodiment 7 include: forming the first conductive film by tantalum nitride (TaN) and combining it with the second conductive film formed from a W film; forming the first conductive film by tantalum nitride (TaN) and combining it with the second conductive film formed from an Al film; and forming the first conductive film by tantalum nitride (TaN) and combining it with the second conductive film formed from a Cu film. (FIG. 11B)

Then, masks 409 to 412 are formed from resist, and a first etching treatment is performed in order to form electrodes and wirings. An ICP (inductively coupled plasma) etching method is used in Embodiment 7. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. In case of mixing $CF_4$ and $Cl_2$, the W film and the Ta film are etched to the approximately same level.

Not shown in FIG. 11C, edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. Not shown in FIG. 11C, a gate insulating film 406, and the regions not covered by the first shape conductive layers 414 to 417 are made thinner by etching of about 20 to 50 nm.

First shape conductive layers 414 to 417 (first conductive layers 414a to 417a and second conductive layers 414b to 417b) are thus formed of the first conductive layers and the second conductive layers in accordance with the first etching process.

A second etching process is performed next, as shown in FIG. 11D. The ICP etching method is similarly used, a mixture of $CF_4$, $Cl_2$, and $O_2$ is used as the etching gas, and a plasma is generated by supplying a 500 W RF electric power (13.56 MHz) to a coil shape electrode at a pressure of 1 Pa. A 50 W RF electric power (13.56 MHz) is applied to the substrate side (test piece stage), and a self-bias voltage which is lower in comparison to that of the first etching process is applied. The W film is etched anisotropically under these etching conditions, and Ta (the first conductive layers) is anisotropically etched at a slower etching speed, forming second shape conductive layers 419 to 422 (first conductive layers 419a to 422a and second conductive layers 419b to 422b). Not shown in FIG. 11D, a gate insulating film, and regions not covered by the second shape conductive layers 419 to 422 are additionally etched on the order of 20 to 50 nm, forming thinner regions.

The etching reaction of a W film or a Ta film in accordance with a mixed gas of $CF_4$ and $Cl_2$ can be estimated from the radicals generated and from the ion types and vapor pressures of the reaction products. Comparing the vapor pressures of fluorides and chlorides of W and Ta, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions is generated. As a result, the etching speed of the W film having a high fluoride vapor pressure is increased. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. Therefore, it becomes possible to have a difference in etching speeds between the W film and the Ta film, and it becomes possible to make the etching speed of the W film larger than that of the Ta film.

Figure 12A:
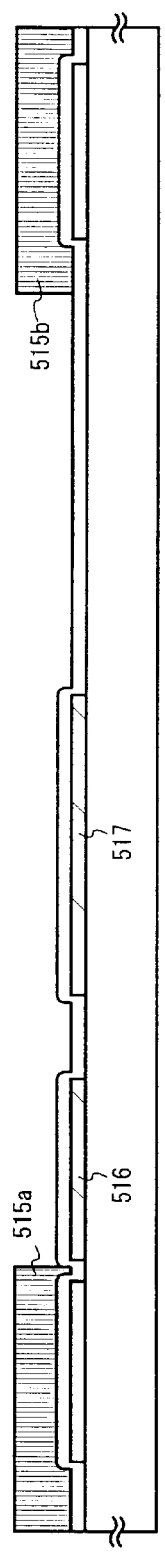
FIGS. 12A–12C show a manufacture process of a light emitting device.

Removing masks 409a to 412a a second doping process is then performed as shown in FIG. 12A and an impurity element which imparts n-type conductivity is doped. For example, doping is performed with the acceleration voltage set from 70 to 120 keV. The second conductive layers 419 to 422 are used as masks with respect to the impurity element, and doping is performed so as to also add the impurity element into regions under the second conductive layers 419a to 422a. First impurity regions 425 to 428 that overlap the second conductive layers 419a to 422a. Though an impurity element which imparts n-type conductivity is doped after removing masks 409a to 412a in this embodiment, the present invention is not limited to that. In the process shown in FIG. 12A, masks 409a to 412a can be removed after doping an impurity element which imparts n-type conductivity.

A mask 433 is next formed over the semiconductor layer 404 so as to cover the second conducting layers 421a and 421b. A portion of the mask 433 overlaps with the second impurity region 431, sandwiching the gate insulating film 406. A second doping process is then performed, and an impurity element which imparts n-type conductivity is added. Doping of the n-type conductivity imparting impurity element is performed at conditions in which the dosage is raised higher than that of the first doping process, and at a low acceleration voltage. (See FIG. 12B.) The doping can be carried out by ion doping or ion implantation. Ion doping is performed under conditions of a dose amount from $1 \times 10^{13}$ to $5 \times 10^{14}$ atoms/cm² and an acceleration voltage of 60 to 100 keV. A periodic table group 15 element, typically phosphorous (P) or arsenic (As) is used as the impurity element which imparts n-type conductivity, and phosphorous (P) is used here. The second conducting layers 419 to 422 become masks with respect to the n-type conductivity imparting impurity element in this case, and source regions 434 to 437, drain regions 438 to 441, and Lov regions 442 to 445 are formed in a self-aligning manner. Further, Loff region 446 is formed in accordance with the mask 433. The impurity element which imparts n-type conductivity is added to the source regions 434 to 437, and to the drain regions 438 to 441 with a concentration in the range of $1 \times 10^{20}$ to $1 \times 10^{21}$ atoms/cm³.

It is possible to freely set the length of the Loff region 446 by controlling the size of the mask 433 with the present invention.

In this specification, the LDD region which overlap with the gate electrode between the gate insulating film is called Lov region. The LDD region which does not overlap with the gate electrode between the gate insulating film is called Loff region.

The n-type conductivity imparting impurity element is added so as to form a concentration of $1 \times 10^{17}$ to $1 \times 10^{19}$ atoms/cm³ in the Loff region, and a concentration of $1 \times 10^{16}$ to $1 \times 10^{18}$ atoms/cm³ in the Lov region.

Figure 12B:
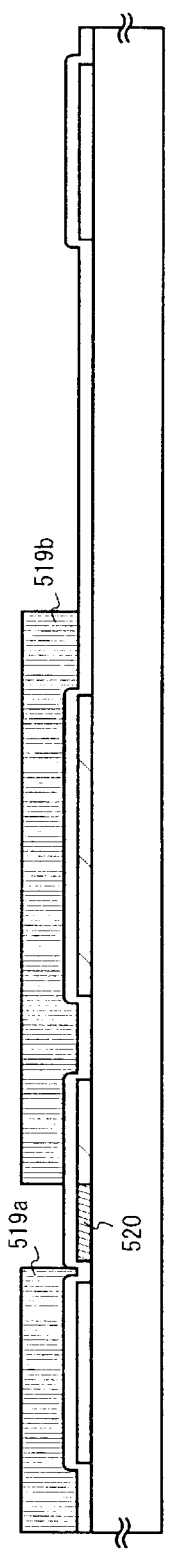

Note that, in FIG. 12B, an impurity element which imparts n-type conductivity may also be doped at an acceleration voltage of 70 to 120 keV, in the state in which the mask 433 is formed over the semiconductor layer 404, before or after doping the n-type conductivity imparting impurity element under the above stated conditions. The concentration of the impurity element which imparts n-type conductivity is suppressed in the portion 446 which becomes the Loff region of the switching TFT by the above process, and the concentration of the n-type conductivity imparting impurity element in the portion 443 which becomes the Lov region of the n-channel TFT used in the driver circuit can be increased. It is possible to reduce the off current in the switching TFT by suppressing the concentration of the n-type conductivity imparting impurity element in the portion 446 which becomes the Loff region of the switching TFT. Further, by increasing the concentration of the n-type conductivity imparting impurity element in the portion 443 which becomes the Lov region of the n-channel TFT used in the driver circuit, the degradation phenomenon caused by hot carriers, due to the hot carrier effect, generated in accordance with a high electric field in the vicinity of the drain, can be prevented. It is preferable that the concentration of the n-type conductivity imparting impurity element in the region 443 which becomes the Lov region of the n-channel TFT used in the driver circuit be from $5 \times 10^{17}$ to $5 \times 10^{19}$ atoms/cm³.

Figure 12C:
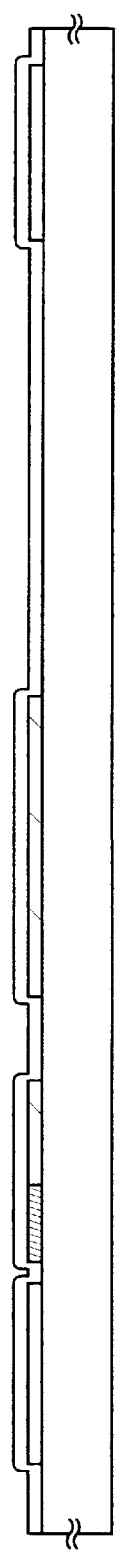
Figure 12D:
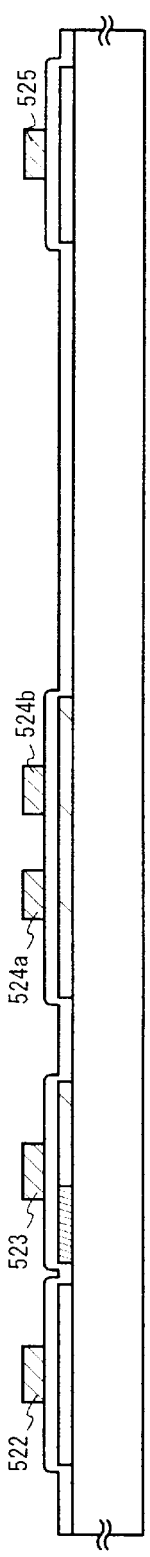
Figure 13A:
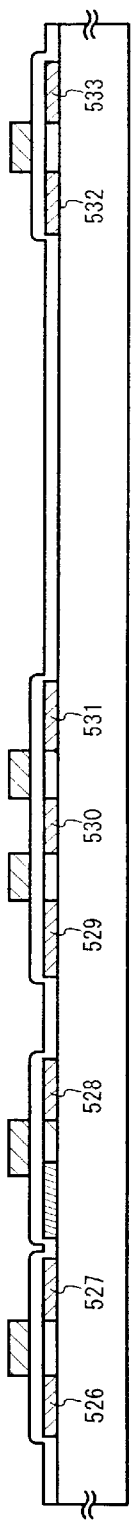
FIGS. 13A to 13C show a manufacture process of a light emitting device.
Figure 13B:
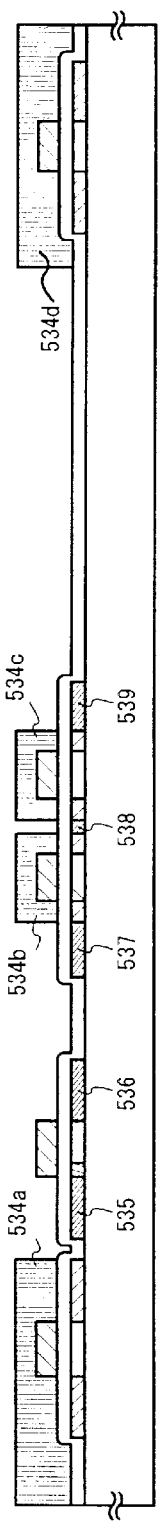
Figure 13C:
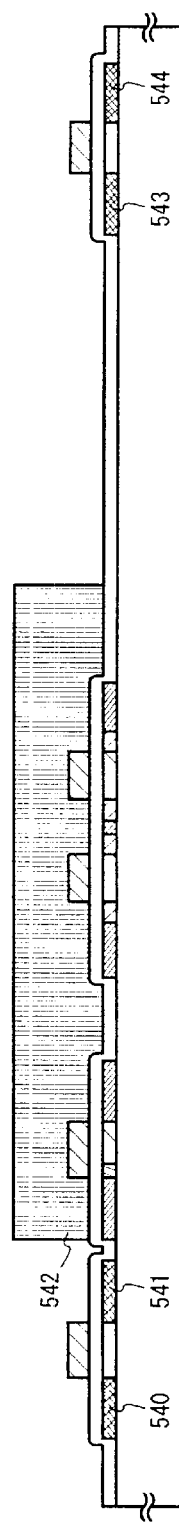
Figure 13D:
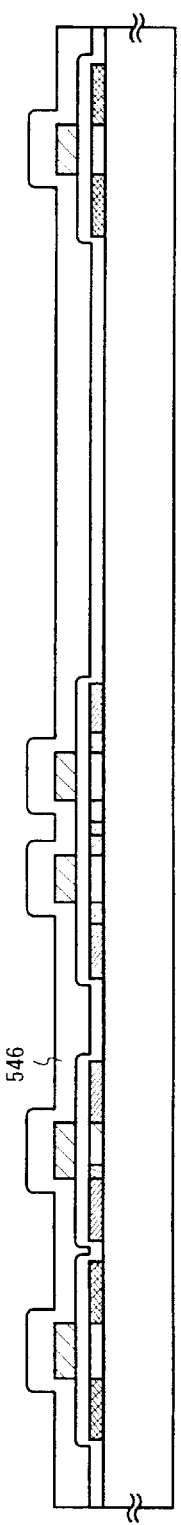

After removing the mask 453, the source region 447 and 448, the drain region 449 and 450 and the Lov region 451 and 452, which are reverse to one conductivity type, are formed on semiconductor layers 402 and 405 fabricating p-channel type TFT as shown in FIG. 12C. The second conductive layers 419 and 422 are used as a mask with respect to the impurity element, and the impurity regions are formed in a self-aligning manner. The semiconductor layers 402 and 403, which form n-channel TFTs, are covered over their entire surface areas by resist masks 453. Phosphorus is added to the source region 447 and 448, the drain region 449 and 450 and the Lov region 451 and 452 at a different concentration, and ion doping is performed here using diborane ($B_2H_6$), so that the respective impurity regions have the impurity concentration of $2 \times 10^{20}$ to $2 \times 10^{21}$ atoms/cm³.

Impurity regions (source region, drain region, Lov region and Loff region) are formed in the respective semiconductor layers 402 to 405 by the above processes. The second conductive layers 419 to 422 overlapping the semiconductor layers function as gate electrodes.

A process of activating the impurity elements added to the respective semiconductor layers is then performed with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 7. However, for cases in which the wiring material used in the wirings 419 to 422 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the semiconductor layers. This process is one of terminating dangling bonds in the semiconductor layers by hydrogen which is thermally excited. Plasma hydrogenation (using hydrogen excited by a plasma) may also be performed as another means of hydrogenation.

A first interlayer insulating film 455 is formed next of a silicon oxynitride film having a thickness of 100 to 200 nm. (See FIG. 13A.) A second interlayer insulating film 458 made of an organic insulating material is then formed on the first interlayer insulating film 455.

Contact holes are then formed in the gate insulating film 406, the first interlayer insulating film 455, and the second interlayer insulating film 458, and source wirings 459 to 462 are formed so as to contact the source regions 447, 435, 436, and 448 through the contact holes. Further, drain wirings 463 to 465 are formed similarly contacting the drain regions 449, 439, 440, and 450. (See FIG. 13B.)

Note that it is preferable to form the contact holes by dry etching using $CF_4$ and $O_2$ when the gate insulating film 406, the first interlayer insulating film 455, and the second interlayer insulating film 458 are $SiO_2$ films or SiON films. Further, for cases in which the gate insulating film 406, the first interlayer insulating film 455, and the second interlayer insulating film 458 are organic resin films, it is preferable to form the contact holes by dry etching using $CHF_3$ or by BHF (buffered hydrogen fluoride, $HF+NH_4F$). In addition, if the gate insulating film 406, the first interlayer insulating film 455 and the second interlayer insulating film 458 are formed by different materials, it is preferable to change the method of etching and the etchant or etching gas type for each film. The contact holes may also be formed by using the same etching method and the same etchant or etching gas.

A third interlayer insulating film 467 is formed next from an organic resin. Organic resins such as polyimide, polyamide, acrylic, and BCB (benzocyclobutene) can be used. In particular, it is preferable to use acrylic, which has superior levelness, because the third interlayer insulating film 467 is formed with a strong implication of leveling. An acrylic film is formed in Embodiment 7 at a film thickness at which steps formed by the TFTs can be sufficiently leveled. The film thickness is preferably from 1 to 5 μm (more preferably between 2 and 4 μm).

A contact hole for reaching the drain wiring 465 is formed next in the third interlayer insulating film 467, and a pixel electrode 468 is formed. An indium tin oxide (ITO) film is formed with a thickness of 110 nm in Embodiment 7, and patterning is then performed, forming the pixel electrode 468. Further, a transparent conducting film in which between 2 and 20% zinc oxide (ZnO) is mixed with indium oxide may also be used. The pixel electrode 468 becomes an anode of an EL element. (See FIG. 13C.)

Figure 14A:
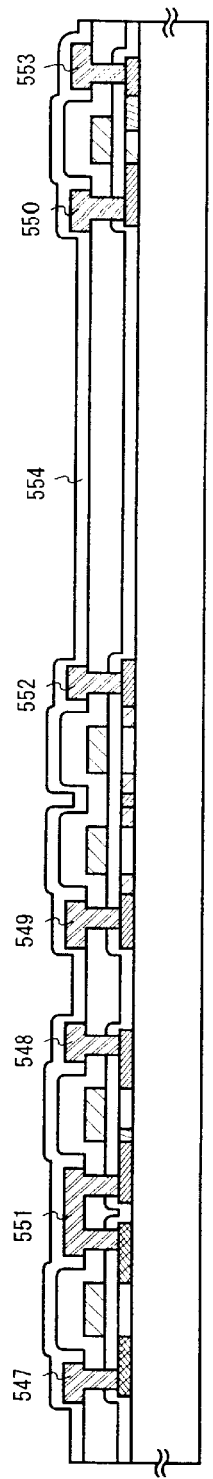
FIGS. 14A and 14B show a manufacture process of a light emitting device.

A first bank 469 and a second bank 470 are formed next from a resin material. The first bank 469 and the second bank 470 are formed in order to separate organic compound layers and cathodes, formed later, of adjacent pixels. It is therefore preferable that the second bank 470 stick out farther horizontally than the first bank 469. Note that it is preferable that the combined thickness of the first bank 469 and the second bank 470 be made on the order of 1 to 2 $\mu$m, but there are no limitations on this thickness provided that the organic compound layers and the cathodes formed later of adjacent pixels can be separated. Further, it is necessary to form the first bank 469 and the second bank 470 by an insulating film, and it is therefore possible to use materials such as an oxide or a resin, for example. The first bank 469 and the second bank 470 may both be formed by the same material, and they may also be formed by different materials. The first bank 469 and the second bank 470 are formed in stripe shapes between pixels. The first bank 469 and the second bank 470 may be formed on and along the source wirings (source signal lines), and may be formed on and along the gate wirings (gate signal lines). Note that the first bank 469 and the second bank 470 may also be formed by a material in which a pigment is mixed into a resin. (See FIG. 14A.)

An organic compound layer 471 and a cathode (MgAg electrode) 472 are formed next in succession without exposure to the atmosphere using vacuum evaporation. Note that the film thickness of the organic compound layer 471 may be from 80 to 200 nm (typically between 100 and 120 nm), and that the film thickness of the cathode 472 may be from 180 to 300 nm (typically between 200 and 250 nm). Note also that, although only one pixel is shown in Embodiment 7, an organic compound layer which emits red color light, an organic compound layer which emits green color light, and an organic compound layer which emits blue color light are formed at the same time at this point. Further, a part of the materials forming the organic compound layer and the cathode are laminated on the bank 470, although these materials are not included in the organic compound layer 471 and the cathode 472 in this specification.

The organic compound layer 471 and cathode 472 are formed in order for a pixel corresponding to the color red, a pixel corresponding to the color green, and a pixel corresponding to the color blue. However, the organic compound layers 471 have scant resistance with respect to solutions, and therefore each color must be formed separately without using a photolithography technique. It is preferable to use a metal mask and cover the pixels other than the desired pixel, and selectively form the organic compound layers 471 in only the required locations.

Namely, first a mask is set so as to cover all of the pixels except for those corresponding to the color red, and red color light emitting organic compound layers are selectively formed using the mask. Next, a mask is set so as to cover all of the pixels except for those corresponding to the color green, and green color light-emitting organic compound layers are selectively formed using the mask. Finally, a mask is set so as to cover all of the pixels except for those corresponding to the color blue, and blue color light emitting organic compound layers are selectively formed using the mask. Note that, although the use of all different masks is recorded here, the same mask may also be reused. Further, it is preferable to perform processing until all pixel organic compound layers are formed without releasing the vacuum.

Note that a single layer structure composed of only a light-emitting layer is shown in Embodiment 7 for the organic compound layer 471, but a structure having layers such as a hole transporting layer, a hole injecting layer, an electron transporting layer, and an electron injecting layer in addition to the light-emitting layer may also be used for the organic compound layer. Various examples of these types of combinations have already been reported, and all such structures may be used. A known material can be used as the organic compound layer 471. Considering the light emitting driver voltage, it is preferable to use an organic material as the known material.

The cathode 472 is formed next. An example of using a MgAg electrode as the cathode 472 is shown in Embodiment 7, but it is also possible to use other known materials.

Figure 14B:
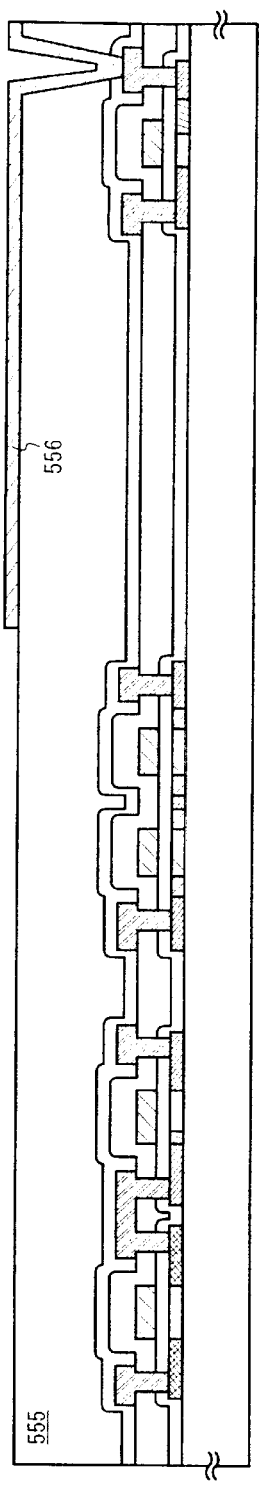
Figure 14C:
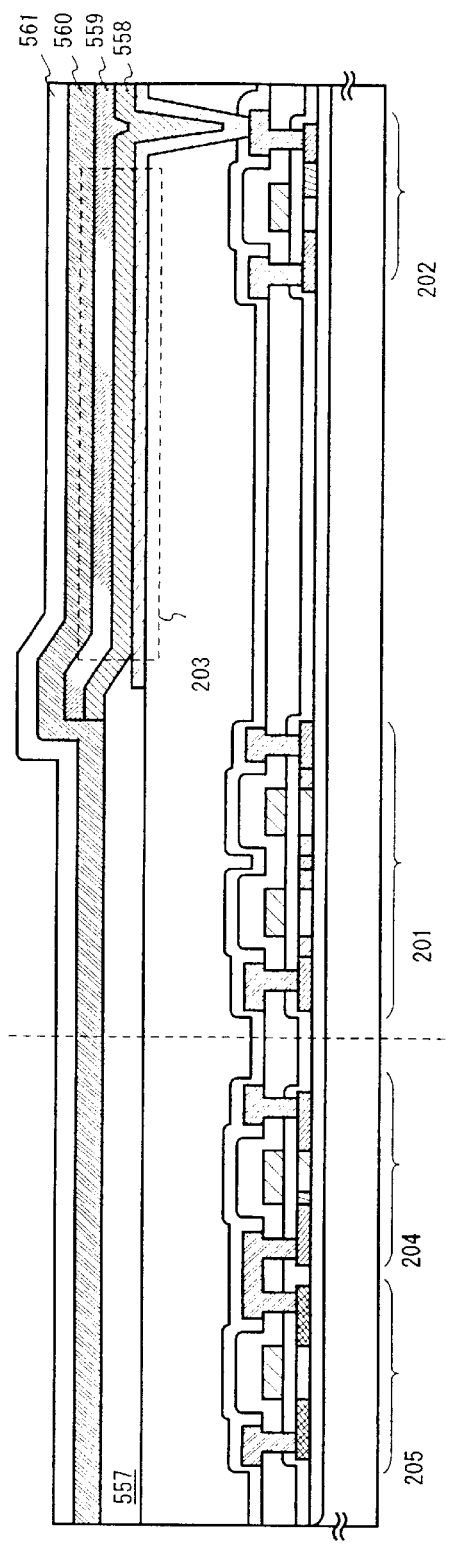

An active matrix substrate having a structure as shown in FIG. 14B is thus completed. Note that, after forming the first bank 469 and the second bank 470, it is effective to perform processing in succession without exposure to the atmosphere up through to the formation of the cathode 472 by using a multi-chamber method (or an in-line method) thin film formation apparatus.

In Embodiment 7, a source region 504, a drain region 505, an Loff region 506, an Lov region 507, and a channel forming region 508 are contained in a semiconductor layer of a switching TFT 501. The Loff region 506 is formed so as not to overlap with the gate electrode 421 through the gate insulating film 406. Further, the Lov region 507 is formed so as to overlap with the gate electrode 421 through the gate insulating film 406. This type of structure is extremely effective in reducing the off current.

Further, a single gate structure is used as the switching TFT 501 in Embodiment 7, but the present invention may also have a double gate structure or another type of multi-gate structure for the switching TFT. Two TFTs are effectively connected in series by using the double gate structure, giving the advantage of additionally reducing the off current.

Further, the switching TFT 501 is an n-channel TFT in Embodiment 7, but a p-channel TFT may also be used.

A semiconductor layer of an electric current control TFT 502 contains a source region 510, a drain region 511, an Lov region 512, and a channel forming region 513. The Lov region 512 is formed so as to overlap with the gate electrode 422 through the gate insulating film 406. Note that the electric current control TFT 502 does not have an Loff region in Embodiment 7, but a structure having an Loff region may also be used.

Further, the electric current control TFT 502 is a p-channel TFT in Embodiment 7, but it may also be an n-channel TFT.

Note that the active matrix substrate of Embodiment 7 shows an extremely high reliability, and its operational characteristics are also increased, by arranging optimally structured TFT in not only the display portion, but also in the driver circuit portion.

First, a TFT having a structure in which hot carrier injection is reduced so as not to have a very large drop in operational speed is used as an n-channel TFT 503 of a CMOS circuit forming the driver circuit portion. Note that circuits such as a shift register, a buffer, a level shifter, and a sampling circuit (sample and hold circuit) are included as the driver circuits here. Signal conversion circuits such as a D/A converter can also be included when performing digital drive.

A semiconductor layer of the n-channel TFT 503 of the CMOS circuit in Embodiment 1 contains a source region 521, a drain region 522, an Lov region 523, and a channel forming region 524.

Further, a semiconductor layer of a p-channel TFT 504 of the CMOS circuit contains a source region 531, a drain region 532, an Lov region 533, and a channel forming region 534.

Note that, in practice, it is preferable to perform packaging (sealing) by a protecting film having high airtight characteristics and little outgassing (such as a laminate film or an ultraviolet hardened resin film) or by a transparent sealing material after completing up through to the processes of FIG. 14B so as to have no exposure to the atmosphere. Further, if an inert gas is placed in the inside of the sealing material, and a drying agent (barium oxide, for example) is arranged on the inside of the sealing material, then the reliability of the light emitting element is increased.

Further, a connector (flexible printed circuit, FPC) is attached in order to connect the elements formed on the substrate, with terminals extended from the circuits, to external signal terminals after increasing the airtight characteristics in accordance with the packaging process or the like. A manufactured product is thus completed. This type of deliverable state is referred to as an light emitting display device throughout this specification.

The length of the channel long direction of the gate electrodes (hereinafter referred to as the width of the gate electrode) differ as stated above with the present invention. Therefore, it is possible to make the ion concentration within the semiconductor layers arranged under the first gate electrode less than the ion concentration within the semiconductor layers not arranged under the first gate electrode by utilizing the difference in ion penetration depth, due to the differing gate electrode thicknesses, when performing ion injection using the gate electrodes as masks.

Further, in order to form the Loff regions using a mask, only the width of the Lov region, control of the Loff region and Lov region positions is easy.

Note that although an example in which light emitted from the organic compound layer is directed toward the substrate is explained in Embodiment 7, the present invention is not limited to this, and a structure in which the light emitted from the organic compound layer is directed above the substrate may also be used. In this case, the cathode of the light emitting element becomes the pixel electrode, and it is preferable that the electric current control TFT be an n-channel TFT.

Note that the above stated forming method of light emitting device of the present invention is not limited to the method shown in Embodiment 7, and it is also possible to use the all forming method of light emitting device.

Embodiment 7 can be combined freely with the structure shown in Embodiment 1 to 6.

(Embodiment 8)

Figure 15:
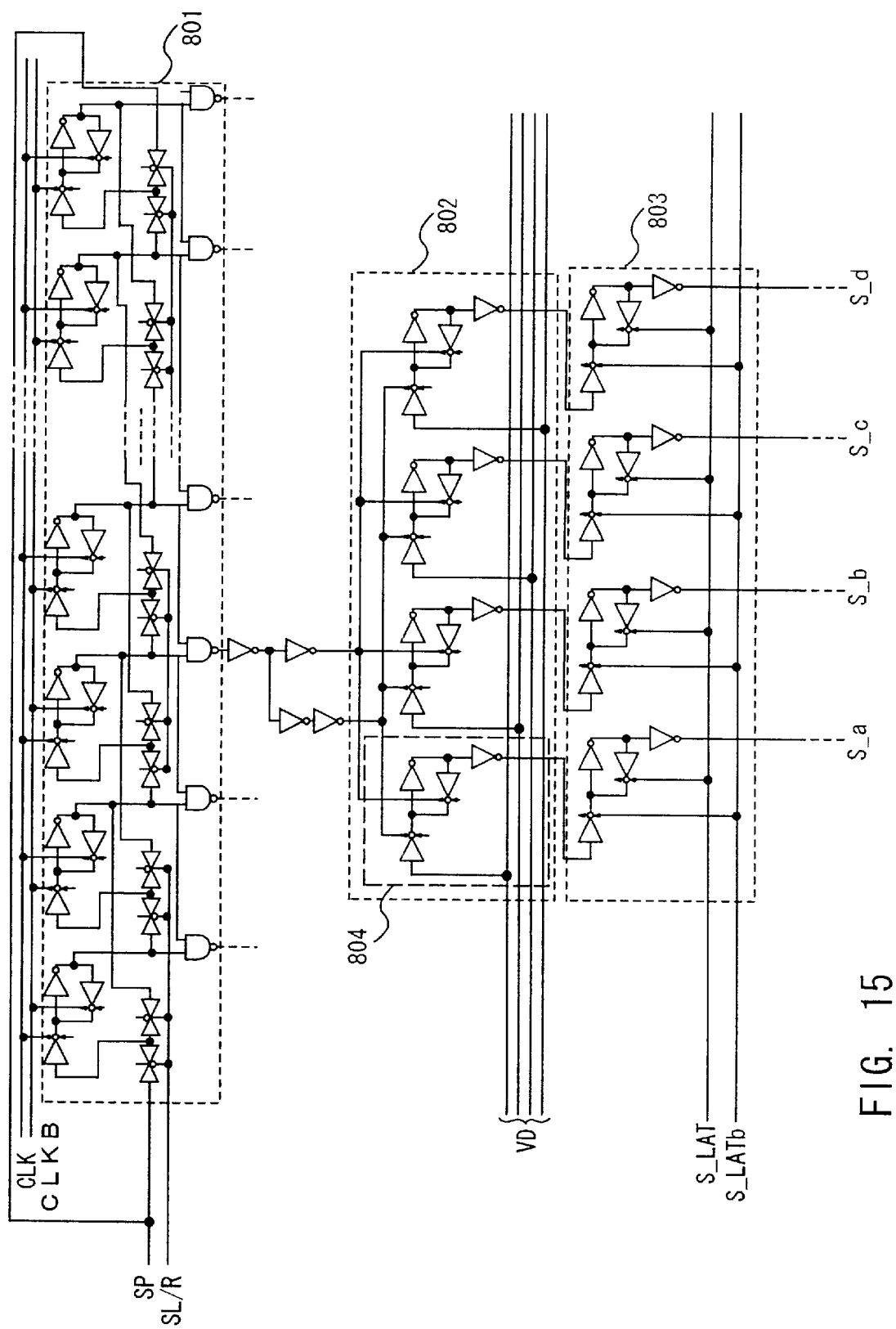
FIGS. 15A and 15B show an upper plan view and a cross-sectional view of a light emitting device according to the present invention.

FIG. 15A is a top view of a light emitting device using the present invention. In FIG. 15A, reference numeral 4010 is a substrate, reference numeral 4011 is a pixel portion, reference numeral 4012*a* and b are first and second source signal side driver circuits, and reference numeral 4013*a* and b are gate signal side driver circuits. The driver circuits are connected to external equipment, through an FPC 4017, via wirings 4016*a*, 4016*b*, 4014*a*, 4014*b* and 4015.

A covering material 6000, a sealing material (also referred to as a housing material) 7000, and an airtight sealing material (a second sealing material) 7001 are formed so as to enclose at least the pixel portion 4011, preferably both the driver circuits (4012*a*, 4012*b*, 4013*a* and 4013*b*) and the pixel portion 4011, at this point.

Further, FIG. 15B is a cross sectional structure of the light emitting device of the present invention, the cross sectional figure cut the line indicated as A–A'. In FIG. 15B, a driver circuit TFT 4022*a* and 4022*b* (note that a CMOS circuit in which an n-channel TFT and a p-channel TFT are combined is shown in the figure here), a pixel portion TFT 4023 (note that only an EL driver TFT for controlling the current flowing to an EL element is shown here) are formed on a base film 4021 on a substrate 4010. The TFTs may be formed using a known structure (a top gate structure or a bottom gate structure).

After the driver circuit TFT 4022*a* and 4022*b* and the current control TFT 4023 are completed, a pixel electrode 4027 is formed on an interlayer insulating film (leveling film) 4026 made from a resin material. The pixel electrode 4027 is formed from a transparent conducting film for electrically connecting to a drain of the current control TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An organic compound layer 4029 is formed next. The organic compound layer 4029 may be formed having a lamination structure, or a single layer structure, by freely combining known organic materials (such as a hole injecting layer, a hole transporting layer, a light emitting layer, an electron transporting layer, and an electron injecting layer). A known technique may be used to determine which structure to use. Further, organic materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the organic compound layer 4029 is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the light emitting display device can also be made to emit a single color of light.

After forming the organic compound layer 4029, a cathode 4030 is formed on the organic compound layer. It is preferable to remove as much as possible any moisture or oxygen existing in the interface between the cathode 4030 and the organic compound layer 4029. It is therefore necessary to use a methods of depositing the organic compound layer 4029 and the cathode 4030 continually under vacuum or forming the organic compound layer 4029 in an inert gas atmosphere and forming the cathode 4030 without the air exposure. The above film deposition becomes possible in this embodiment by using a multi-chamber method (cluster tool method) film deposition apparatus.

Note that a lamination structure of a LiF (lithium fluoride) film and an Al (aluminum) film is used in this embodiment as the cathode 4030. Specifically, a 1 nm thick LiF (lithium fluoride) film is formed by evaporation on the organic compound layer 4029, and a 300 nm thick aluminum film is formed on the LiF film. A MgAg electrode, a known cathode material, may of course also be used. The cathode 4030 is then connected to the wiring 4016 in a region denoted by reference numeral 4031. The wiring 4016 is a power source supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the organic compound layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the light emitting element thus made.

In addition, the sealing material 7000 is formed between the covering material 6000 and the substrate 4010, so as to surround the light emitting element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of aluminum foil is sandwiched by a PVF film or a Mylar film.

However, depending upon the light emission direction from the light emitting element (the light radiation direction), it is necessary for the covering material 6000 to have light transmitting characteristics.

Further, the wiring 4015 is electrically connected to the FPC 4017 through a gap between the airtight sealing material 7001 and the substrate 4010. Note that although an explanation of the wiring 4015 has been made here, the wirings 4014a, 4014b, 4016a and 4016b are also electrically connected to the FPC 4017 by similarly passing underneath and the sealing material 7000 and the airtight sealing material 7001.

Note that the covering material 6000 is bonded, and the sealing material 7000 is attached so as to cover the lateral surfaces (exposed surfaces) of the filling material 6004, after forming the filling material 6004 in this embodiment, but the filling material 6004 may also be formed after attaching the covering material 6000 and the sealing material 7000. In this case, a filling material injection opening is formed through a gap formed by the substrate 4010, the covering material 6000, and the frame material 6001. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 8 can be freely combined with the structure shown in Embodiments 1 to 6.

(Embodiment 9)

Figure 16:
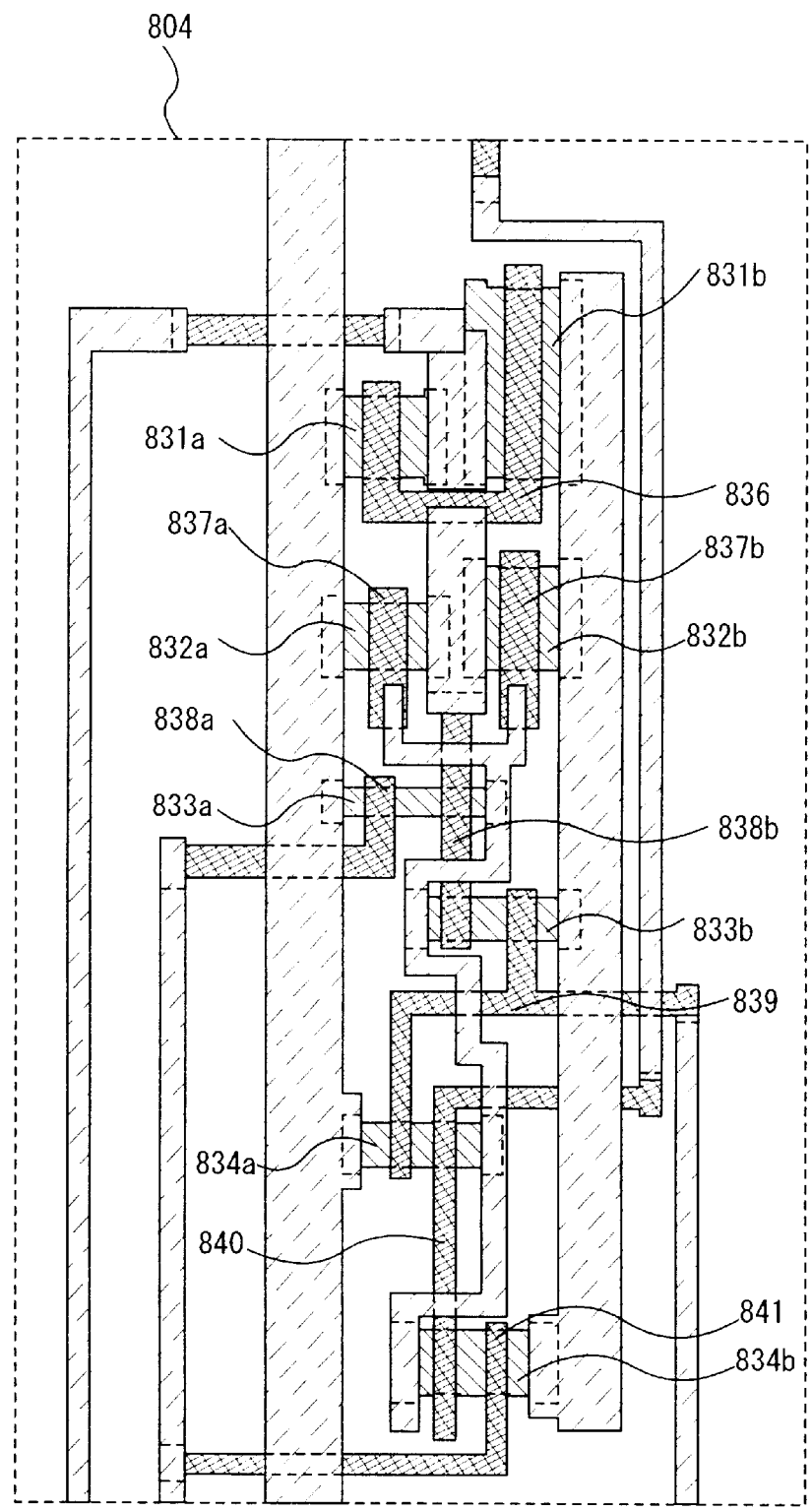
FIGS. 16A and 16B show an upper plan view and a cross-sectional view of a light emitting device according to the present invention.
Figure 17A:
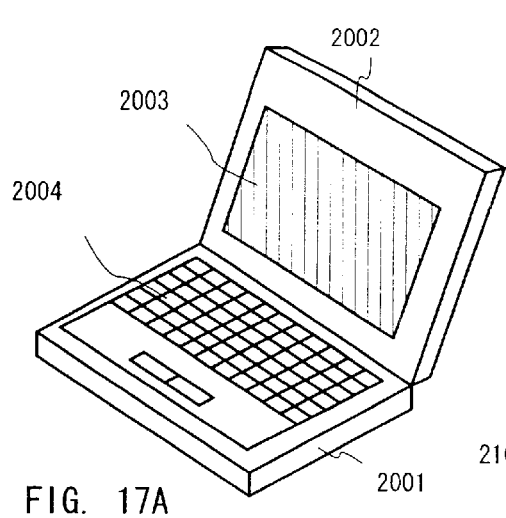
FIG. 17 is a cross-sectional view of a pixel of a light emitting device according to the present invention.
Figure 17B:
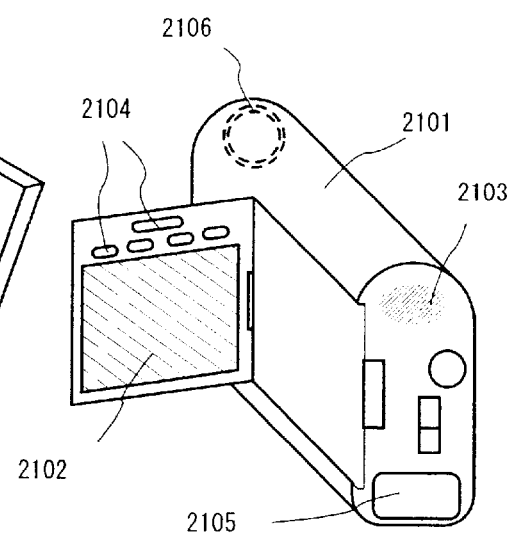
Figure 17C:
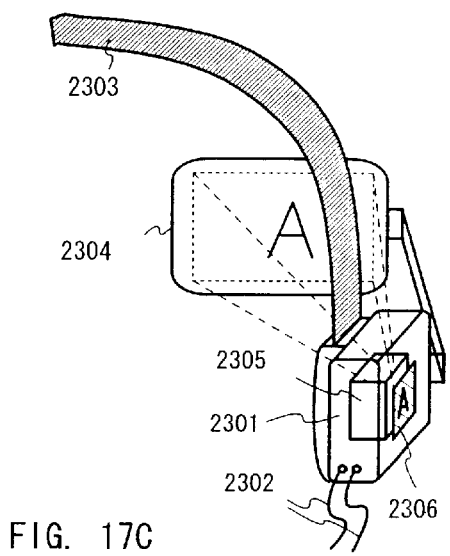
Figure 17D:
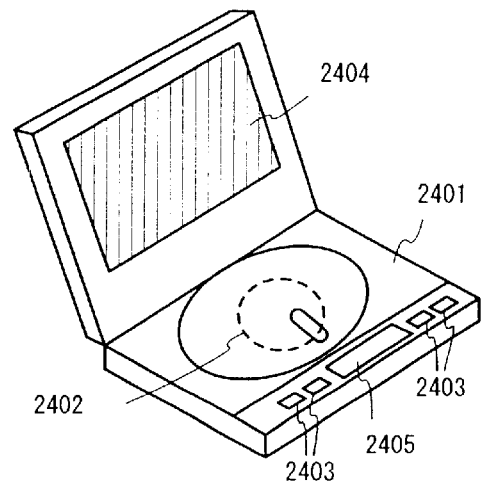
Figure 17E:
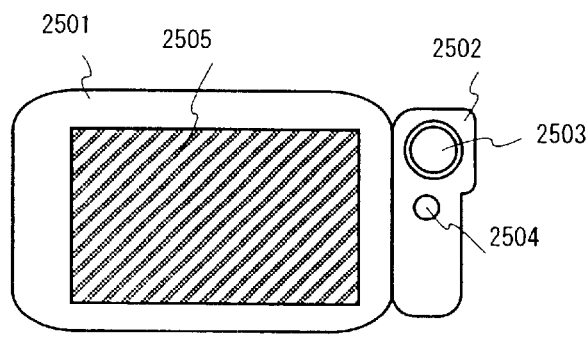

In this embodiment, the example of forming the light emitting device which have a different form of Embodiment 8 using the present invention is shown by FIGS. 16A and 16B. The same number as FIGS. 15A and 15B are omitted because they indicate the same.

FIG. 16A is a top surface of the light emitting device of this embodiment and FIG. 16B show the cross sectional figure of FIG. 16A cut the line indicated as A–A'.

According to Embodiment 8, passivation film 6003 is formed covering hte light emitting element.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of aluminum foil is sandwiched by a PVF film or a Mylar film.

However, depending upon the light emission direction from the light emitting element (the light radiation direction), it is necessary for the covering material 6000 to have light transmitting characteristics.

Next, after bonding the covering material 6000 using the filler material 6004, the frame material 6001 is attached so as to cover the side surface (exposed surface) of the filler material 6002. The frame material 6001 is bonded by a sealing material (which functions as a sealant) 6002. It is preferable to use a photo curing resin as the sealing material 6002 at this point, but a thermally curable resin may also be used provided that the thermal resistance of the organic compound layer layer permits. Note that it is preferable that the sealing material 6002 be a material through which as little moisture and oxygen as possible are transmitted. Further, a drying agent may also be added to the inside of the sealing material 6002.

Further, the wiring 4015 is electrically connected to the FPC 4017 through a gap between the sealing material 6002 and the substrate 4010. Note that although an explanation of the wiring 4015 has been made here, the wirings 4014a, 4014b, 4016a and 4016b are also electrically connected to the FPC 4017 by similarly passing underneath and the sealing material 6002 and the substrate 4010.

Note that the covering material 6000 is bonded, and the sealing material 7000 is attached so as to cover the lateral surfaces (exposed surfaces) of the filling material 6004, after forming the filling material 6004 in this embodiment, but the filling material 6004 may also be formed after attaching the covering material 6000 and the sealing material 7000. In this case, a filling material injection opening is formed through a gap formed by the substrate 4010, the covering material 6000, and the frame material 6001. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 8 can be freely combined with the structure shown in Embodiments 1 to 6.

(Embodiment 10)

FIG. 17 shows a cross-sectional structure of a pixel portion in a light emitting device further in detail.

In FIG. 17, n-channel TFTs formed by a known method are used as a first TFT for switching 3502 and a second TFT for switching 3504 provided on a substrate 3501. In Embodiment 10, the pixel portion has a double-gate structure. The double-gate structure is advantageous in that two TFT are substantially connected in series to allow an OFF current value to be reduced. Although the double-gate structure is adopted in this embodiment, a single-gate structure or multi-gate structures such as a triple-gate structure or a structure having more than three gates may alternatively be used.

As a TFT for current control 3503, an n-channel TFT formed by a known method is used.

A drain wiring 31 of the second TFT for switching 3504 is electrically connected to a drain wiring 35 of the first TFT for switching 3502 and a gate electrode 37 of the TFT for current control 2503 through a wiring 36.

As the first TFT for switching 3503, the second TFT for switching 3504 and the TFT for current control 3503, p-channel TFTs formed by using a known method may alternatively be used. It is preferred to use TFTs having the same polarity as the first TFT for switching 3502 and the second TFT for switching 3504.

An n-channel TFT formed by a known method is used as the TFT for current control 3505. The gate electrode 37 of the TFT for current control 3505 is electrically connected to the drain wiring 35 of the first TFT for switching 3502 and the drain electrode 31 of the second TFT for switching 3504 through the wiring 36.

Since the TFT for current control 3503 is for controlling the amount of a current flowing through the light emitting element, a large amount of a current flows through the TFT 3503. As a result, there is a high possibility of degradation of the TFT 3503 due to heat or hot carriers. Therefore, the structure of this embodiment, in which an LDD region is provided so as to overlap the gate electrode through a gate insulating film on the side of a drain region of the TFT for current control 3505, is extremely effective. However, the present invention is not limited to this structure. An LDD region may be provided so as to overlap the gate electrode through a gate insulating film on the side of a drain region of the TFT for current control 3503. Alternatively, it is not necessary to provide the LDD region. In these cases, it is desirable that a driving voltage for the light emitting element is 10 V or less, typically, 5 V or less.

Although the TFT for current control 3503 is shown to have a single-gate structure in this embodiment, a plurality of TFTs may be connected in series to provide a double-gate structure or a multi-gate structure having more than two gates. Furthermore, a plurality of TFTs may be connected in parallel so as to substantially divide a channel formation region into a plurality of regions to provide a structure capable of radiating heat at a high efficiency. Such a structure is effective as a countermeasure against deterioration due to heat.

A source wiring 40 is connected to a power source supply line 38 to be always held at a constant electric potential.

A first passivation film 41 is provided on the first TFT for switching 3502, the second TFT for switching 3504, and the TFT for current control 3503. Then, a leveling film 42 made of a resin insulating film is provided thereon. It is extremely important to eliminate a difference in level due to TFTs using the leveling film 42. Since an organic compound layer to be formed in a later step is extremely thin, poor light emission is caused due to the presence of a level difference in some cases. Therefore, it is desirable to level a pixel electrode before the formation of the organic compound layer so that the organic compound layer can be formed on a surface as flat as possible.

The reference symbol 43 indicates a pixel electrode (in this case, a cathode of the light emitting element) made of a highly reflective electric conductive film, which is electrically connected to the drain region of the TFT for current control 3503. It is preferred to use an electrically conductive film having low resistance such as an aluminum alloy film, a copper alloy film, a silver alloy film or a multi-layered film thereof as the pixel electrode 43. It is apparent that the pixel electrode 43 may have a multi-layered structure further including another electric conductive film.

A light emitting layer 45 is formed in a groove (corresponding to a pixel) formed by banks 44*a* and 44*b* formed of an insulating film (preferably, a resin). Although only one pixel is shown in FIG. 17, a plurality of light emitting layers respectively corresponding to R (red), G (green) and B (blue) may be formed. As an organic material for the light emitting layer, a 7r conjugated polymer material is used. As typical polymer materials, polyparaphenylene vinylenes (PPV), polyvinylcarbazoles (PVK), polyfluorenes can be cited.

There are various types of PPV type organic material; for example, materials as described in "Polymers for Light Emitting Diodes" by H. Schenk, H. Becker, O. Gelsen, E. Kluge, W. Kreuder and H. Spreitzer, Euro Display, Proceedings, 1999, pp. 33 to 37, and Japanese Patent Publication Laid-Open No. Hei 10-92576.

As a specific light emitting layer, cyanopolyphenylene as a light emitting layer that emits red light, polyphenylenevinylene as a light emitting layer that emits green light, polyphenylenevinylene or polyalkylphenylene as a light emitting layer that emits blue light may be used. A thickness of the light emitting layer may be 30 to 150 nm (preferably, 40 to 100 nm).

However, since the above-cited light emitting layers are merely examples of organic materials that can be used for a light emitting layer, the organic material is not necessarily limited thereto. An organic compound layer (a layer for light emission and movement of carriers for light emission) may be formed by freely combining a light emitting layer, a charge transport layer or a charge injection layer.

For example, although a polymer material is used as a light emitting layer in this embodiment, a low-molecular organic material may alternatively be used. An inorganic material such as silicon carbide may be used as a charge transport layer or a charge injection layer. Known materials may be used as these organic materials or inorganic materials.

In this embodiment, an organic compound layer having a multi-layered structure including a hole injection layer 46 made of PEDOT (polythiophene) or PAni (polyaniline) formed on a light emitting layer 45 is provided. Then, an anode 47 made of a transparent electrically conductive film is provided on the hole injection layer 46. In this embodiment, since light generated by the light emitting layer 45 is radiated toward the side of the upper surface (toward the upper side of the TFT), the anode 47 should be light transmissive. Although a compound of indium oxide and tin oxide or a compound of indium oxide and zinc oxide may be used for a transparent electrically conductive film, a transparent electrically conductive film which can be formed at a temperature as low as possible because the film is formed after formation of the light emitting layer and the hole injection layer having low heat resistance.

With the formation of the anode 47, the light emitting element 3505 is completed. The light emitting element 3505 herein indicates an element including the pixel electrode (cathode) 43, the light emitting layer 45, the hole injection layer 46 and the anode 47. Since the region of the pixel electrode 43 substantially equal to that of the pixel, the pixel entirely functions as a light emitting element. Therefore, a utilization efficiency of light emission is extremely high to realize bright image display.

In this embodiment, a second passivation film 48 is further provided on the anode 47. A silicon nitride film or a silicon oxynitride film is preferred as the second passivation film 48. The second passivation film 48 may not be necessarily provided. However, the passivation film 48 is advantageously provided because it blocks the light emitting element from outside so as to prevent the degradation due to oxidation of the organic material and to restrain degas from the organic material. As a result, the reliability of the light emitting device can be enhanced.

As described above, the light emitting device according to the present invention has a pixel portion including pixels having the structure as shown in FIG. 17, and includes the first and second TFTs for switching having a sufficiently low OFF current value and the TFT for current control that is resistant against injection of hot carriers. Thus, a light emitting device having high reliability and capable of displaying an excellent image can be obtained.

This embodiment can be combined with any of Embodiments 1 through 6.

(Embodiment 11)

Figure 18:
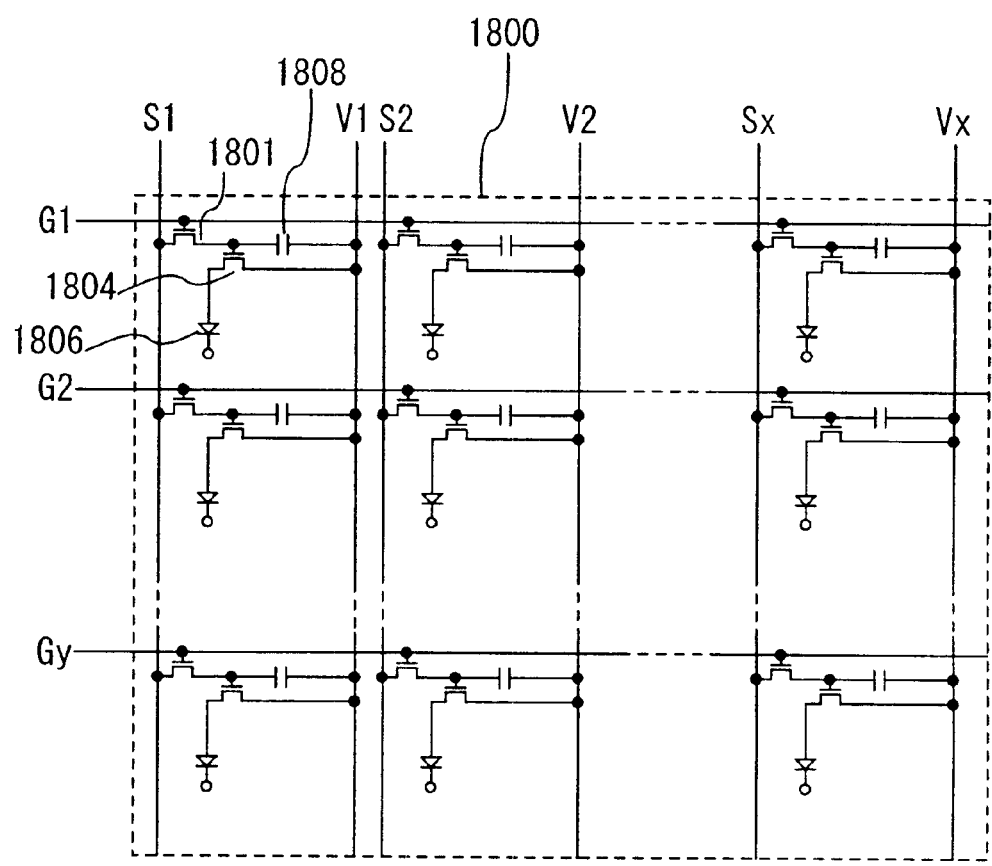
FIG. 18 is a cross-sectional view of a pixel of a light emitting device according to the present invention.

In Embodiment 11, a structure obtained by inverting the structure of the light emitting element 3505 in the pixel portion of Embodiment 10 will be described. For the description of this structure, FIG. 18 is referred to. Since the structure shown in FIG. 18 differs from that of FIG. 17 only in the light emitting element and the TFT for current control, the description of the other parts is herein omitted.

In FIG. 18, a p-channel TFT formed by a known method is used as the TFT for current control 3503.

In Embodiment 11, a transparent electrically conductive film is used as the pixel electrode (anode) 50. More specifically, an electrically conductive film made of a compound of indium oxide and zinc oxide is used. It is apparent that an electrically conductive film made of a compound of indium oxide and zinc oxide may also be used.

After the formation of the banks 51a and 51b made of an insulating film, the light emitting layer 52 made of polyvinylcarbazole is formed by application of a solution. The electron injection layer 53 made of potassium acetylacetonate (designated as acacK) and the cathode 54 made of an aluminum alloy are formed thereon. In this case, the cathode 54 also functions as a passivation film. In this manner, a light emitting element 3701 is formed.

In Embodiment 11, light emitted from the light emitting layer 52 is radiated toward the substrate on which the TFTs are formed as indicated with an arrow in FIG. 18.

Embodiment 11 can be combined with any of Embodiments 1 to 6.

(Embodiment 12)

Figure 19:
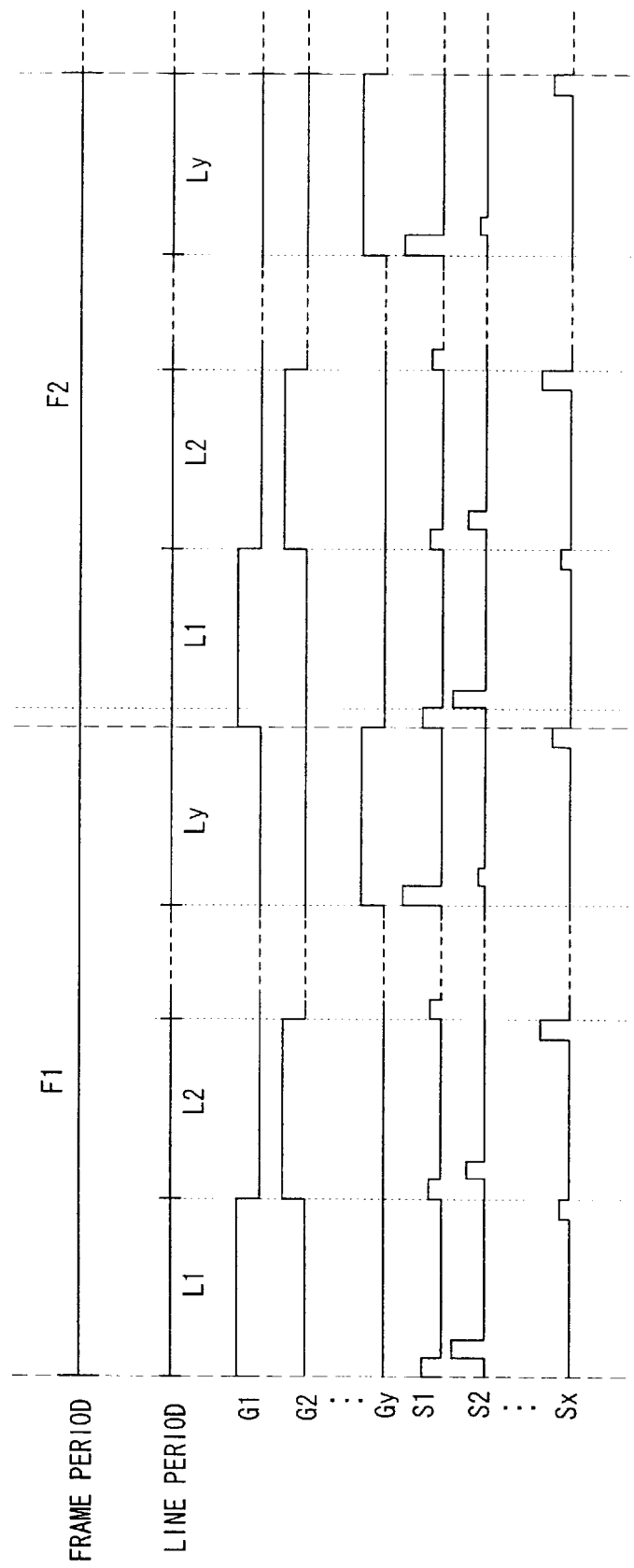
FIGS. 19A and 19B are circuit diagrams of a pixel of a light emitting device according to the present invention.

In Embodiment 12, a circuit diagram having a structure different from that shown in FIG. 3 is shown in FIGS. 19A and 19B. In Embodiment 12, the reference symbols 3801, 3801a and 3801b denote first source signal lines; 3802, 3802a and 3802b denote second source signal lines; 3803 denotes a first gate signal line; 3804 denotes a second gate signal line; 3805 denotes a first TFT for switching; 3806 denotes a second TFT for switching; 3807 denotes a TFT for current control; 3808 denotes a light emitting element; 3809 denotes a power source supply line; and 3810 denotes a capacitor.

FIG. 19A is a circuit diagram showing the example where the power source supply line 3809 is provided in parallel with the first and second gate signal lines 3801 and 3802. Although the power source supply line 3809 and the first and second gate signal lines 3801 and 3802 are provided so as not to overlap with each other in FIG. 19A, any one of the first and second gate signal lines 3801 and 3802 can be provided so as to overlap with the power source supply line 3809 through an insulating film if these wirings are formed in different layers. In this case, since the power source supply line 3809 and the first and second signal lines 3801 and 3802 can share the region occupied by these lines, the pixel portion may have higher fineness.

The structure shown in FIG. 19B is characterized in that the power source supply line 3809 is provided in parallel with the first and second gate signal lines 3801a, 3801b, 3802a and 3802b as in the structure shown in FIG. 19A and that two pixels are axisymmetrically formed with respect the power source supply line 3809 as a center. It is also effective to provide the power source supply line 3809 so as to overlap any one of the first and second gate signal lines 3801a, 3801b, 3802a and 3802b. In such a case, the number of power source supply lines can be reduced to further increase the fineness of the pixel portion.

The structure of Embodiment 12 can be carried out in free combination with the structure of Embodiments 1 to 11.

(Embodiment 13)

Figure 20A:
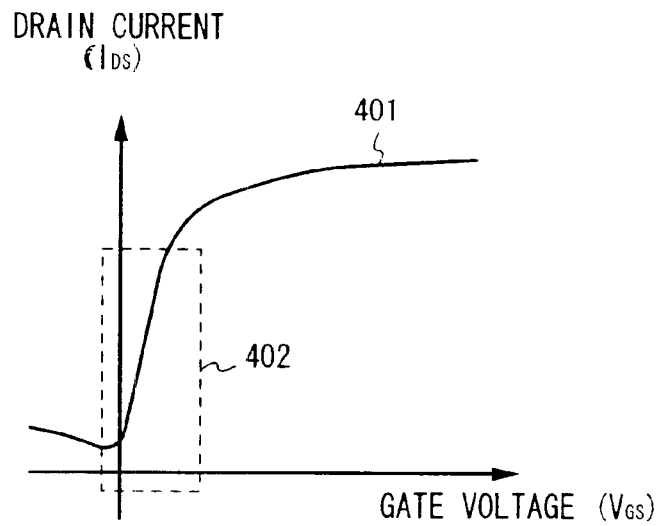
FIG. 20 is a circuit diagram of a source signal line driver circuit.
Figure 20B:
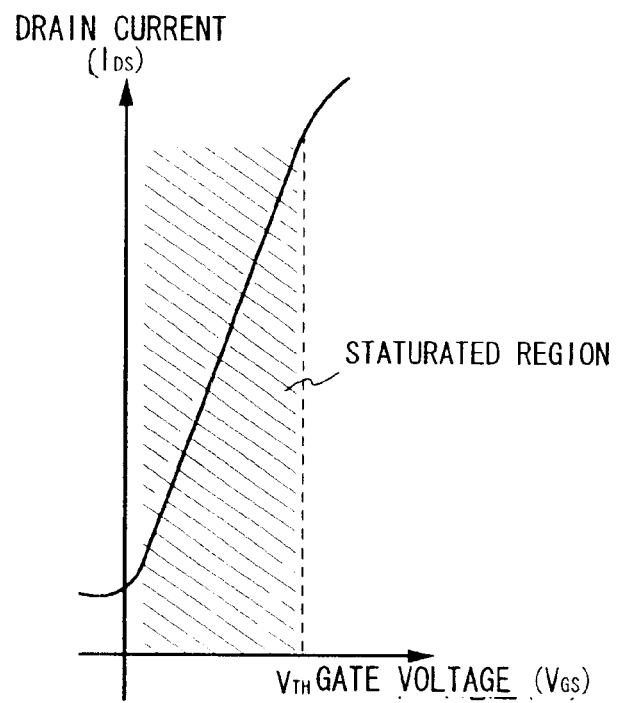

In Embodiment 13, a detailed structure of the first source signal line driver circuit 102a and the second source signal line driver circuit 102b shown in FIG. 1 will be described. Since the structure of the first source signal line driver circuit 102a is substantially the same as that of the second source signal line driver circuit 102b, the structure of the first source signal line driver circuit 102a is described by way of example in Embodiment 13. FIG. 20 is a circuit diagram showing an example of the first source signal line driver circuit 102a used in the present invention.

A shift register 801, a latch (A) (802) and latch (B) (803) are placed as shown in FIG. 20. In Embodiment 13, a series of latch (A) (802) and a series of latch (B) (803) correspond to four first source signal lines GL_a through GL_d. Although not provided in this embodiment, the designers may appropriately provide a level shift for varying a width of amplification of a voltage of a signal.

A clock signal CLK, a clock signal CLKB having an inverted polarity of the clock signal CLK, a start pulse signal SP, and a driving direction switching signal SL/R are respectively input to the shift register 801 through wirings shown in FIG. 20. A digital video signal is externally input to the latch (A) (802) through a wiring VD shown in FIG. 20. A latch signal S_LAT and a signal S_LATb having an inverted polarity of the latch signal S_LAT are respectively input to the latch (B) (803) through wirings shown in FIG. 20.

For a detailed structure of the latch (A) (802), a part 804 of the latch (A) (802) corresponding to the source signal line GL_a is described by way of example. The part 804 of the latch (A) (802) includes two clocked inverters and two inverters.

Figure 21A:
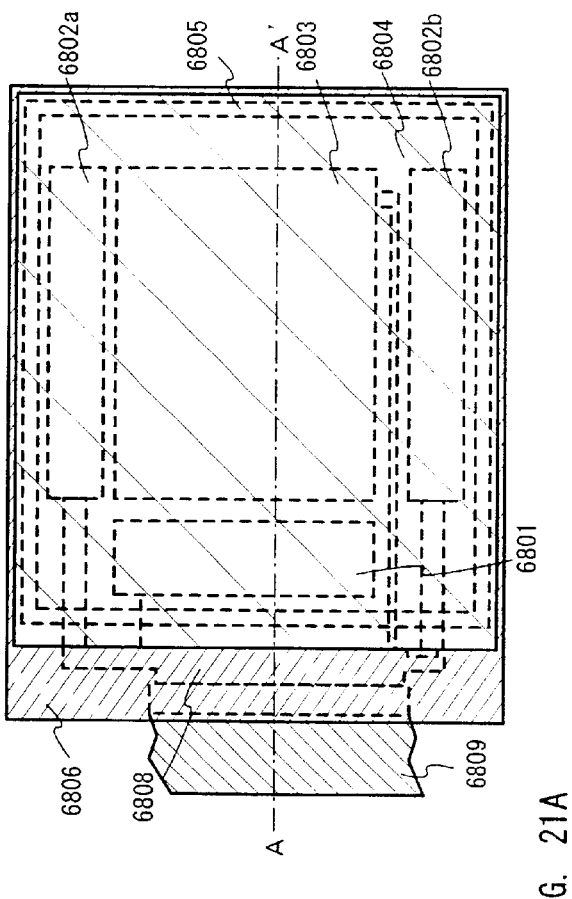
FIG. 21 is an upper plan view of a latch of a source signal line driving circuit.
Figure 21B:
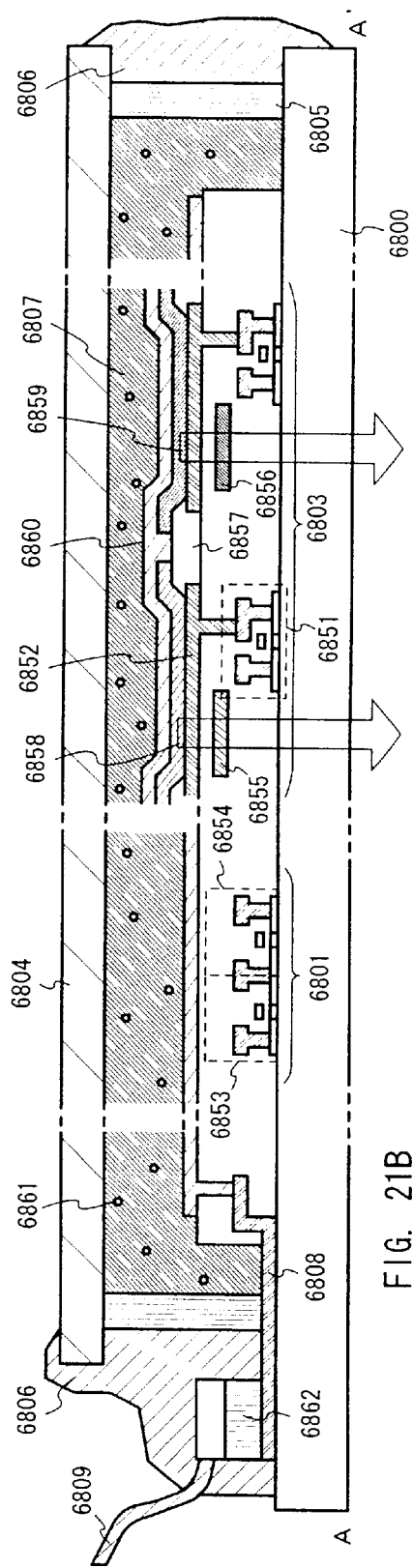
Figure 22:
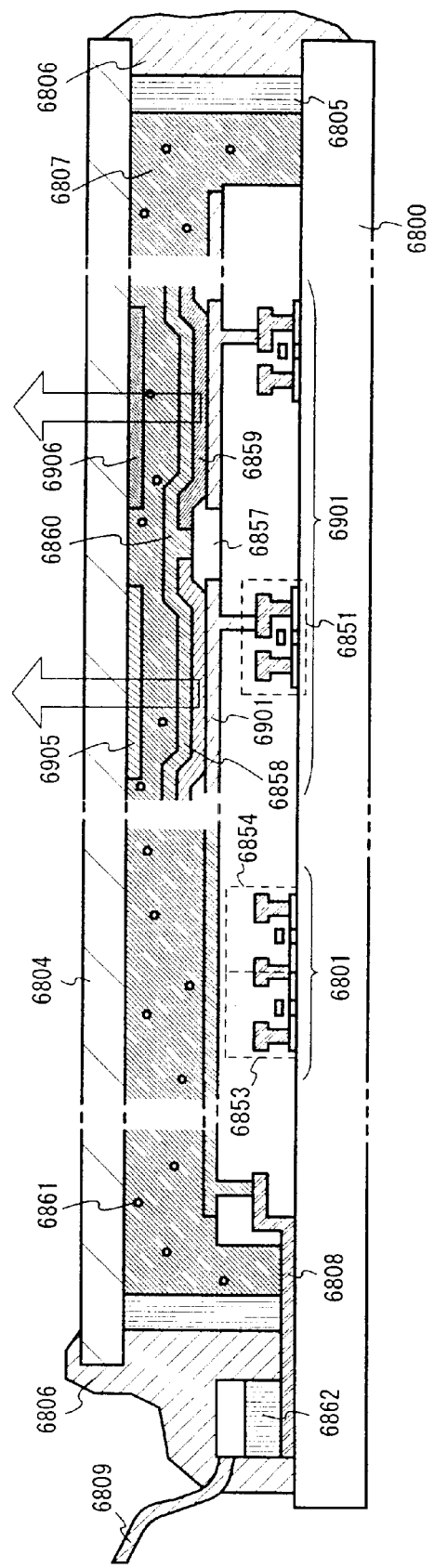
FIGS. 22A to 22F show electric appliances using a light emitting device according to the present invention.
Figure 23:
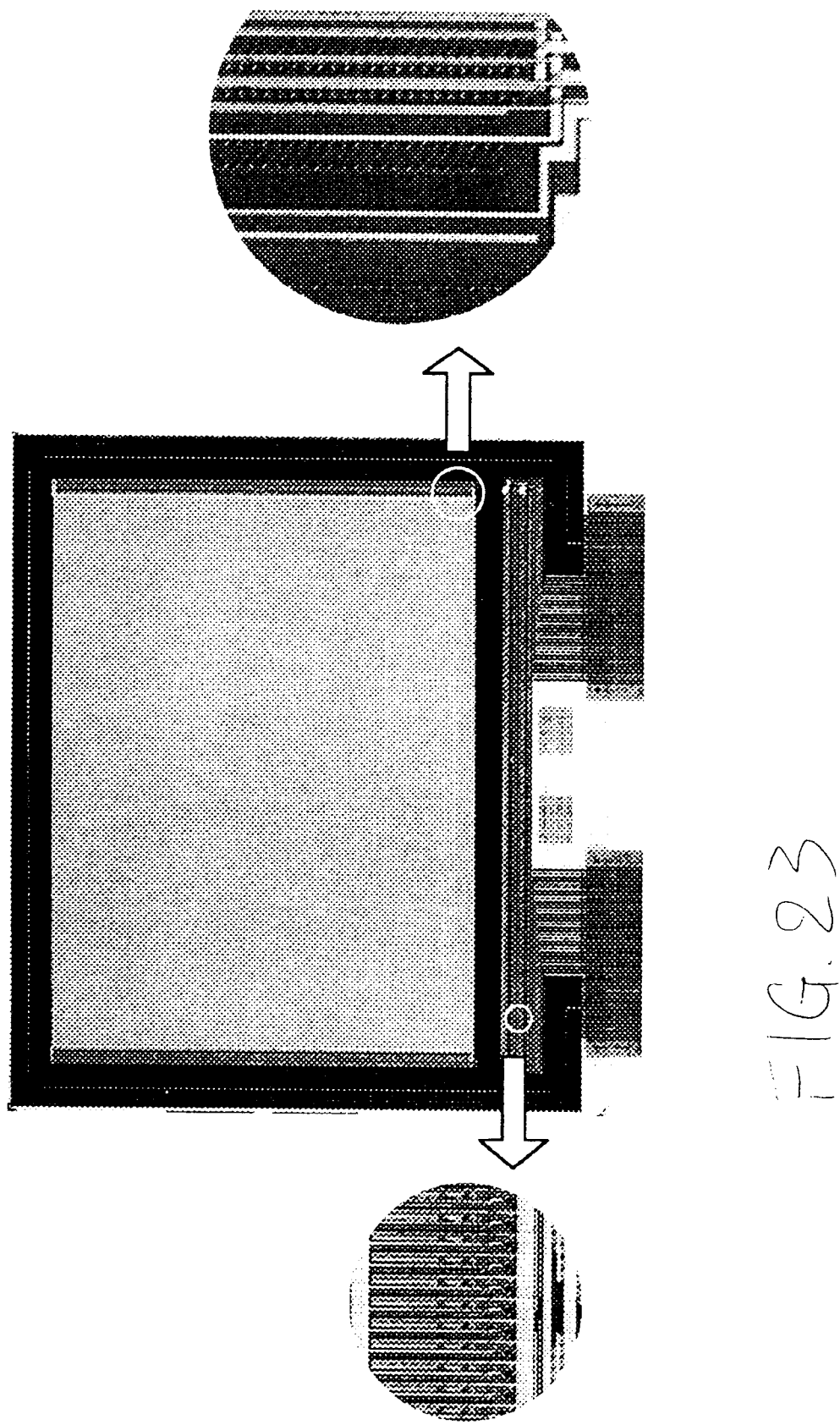
FIGS. 23A and 23B show electric appliances using a light emitting device according to the present invention.
Figure 24:
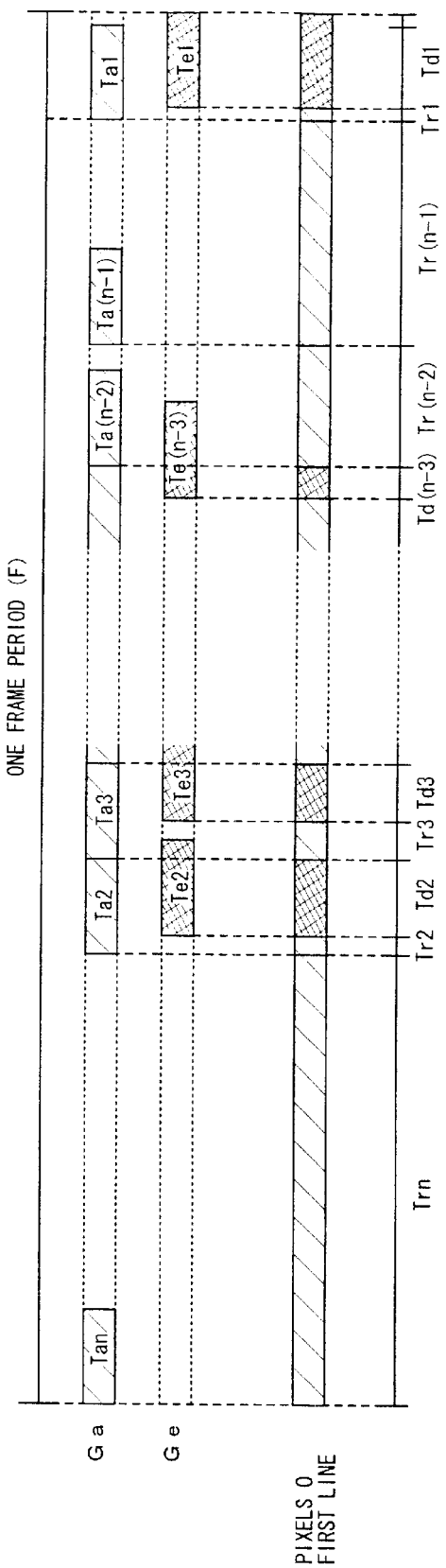
FIG. 24 is a circuit diagram showing a pixel portion of a conventional light emitting device.
Figure 25A:
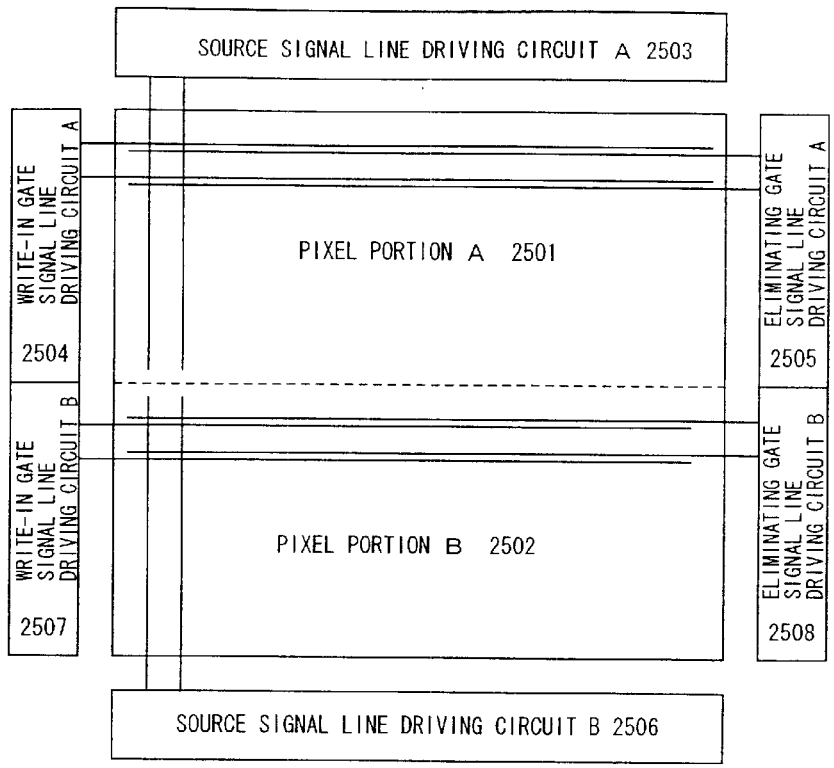
FIG. 25 is a timing chart showing a driving method of a conventional light emitting device.
Figure 25B:
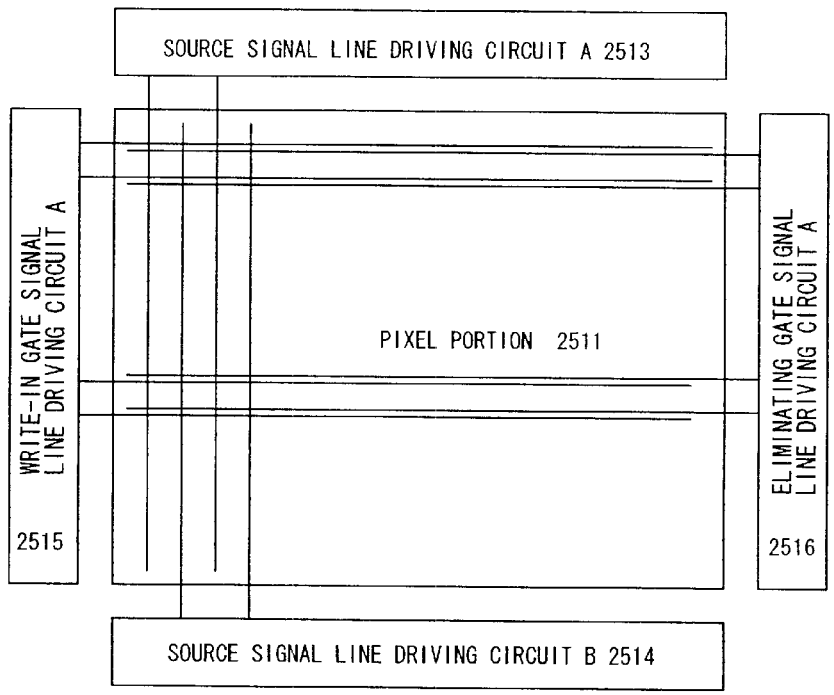
Figure 26A:
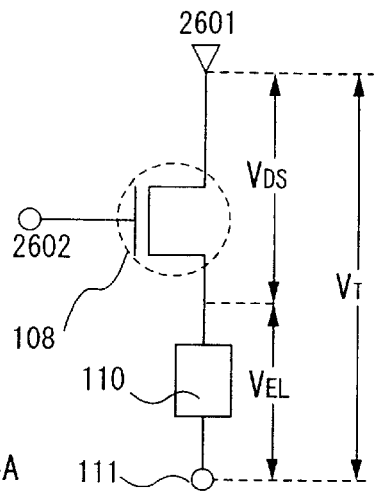
FIGS. 26A and 26B are graphs showing an $I_D$-$V_{GS}$ characteristic of a TFT.
Figure 26B:
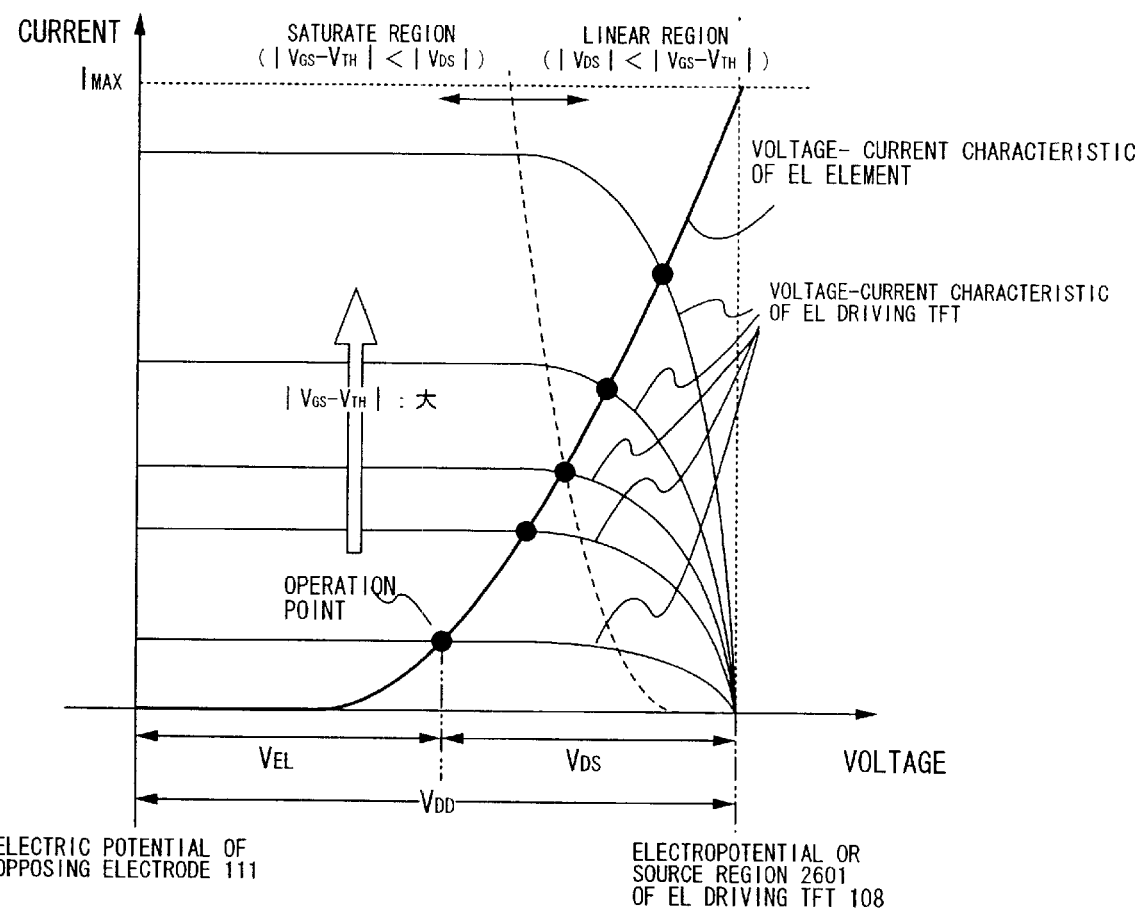

FIG. 21 shows an upper plan view of the part 804 of the latch (A) (802). TFTs forming one of the inverters included in the part 804 of the latch (A) (802) have active layers 831a and 831b and a gate electrode 836 common to the TFTs forming the inverter. TFTs forming the other inverter included in the part 804 of the latch (A) (802) have active layers 832a and 832b, respectively. Gate electrodes 837a and 837b are respectively provided on the active layers 832a and 832b. The gate electrodes 837a and 837b are electrically connected with each other.

TFTs forming one of the clocked inverters included in the part 804 of the latch (A) (802) have active layers 833a and 833b. Gate electrodes 838a and 838b are provided on the active layer 833a to provide a double-gate structure. In the same manner, gate electrodes 838b and 839 are provided on the active layer 833b to provide a double-gate structure.

TFTs forming the other clocked inverter included in the part 804 of the latch (A) (802) have active layers 834a and 834b. Gate electrodes 839 and 840 are provided on the active layer 834a to provide a double-gate structure. In the same manner, gate electrodes 840 and 841 are provided on the active layer 834b to provide a double-gate structure.

(Embodiment 14)

The light emitting device fabricated in accordance with the present invention is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic devices. For example, in order to view a TV program or the like on a large-sized screen, the light emitting device in accordance with the present invention can be used as a display portion of an electro luminescence display device (i.e., a display in which an EL display device is installed into a frame) having a diagonal size of 30 inches or larger (typically 40 inches or larger.).

The light emitting device includes all kinds of displays to be used for displaying information, such as a display for a personal computer, a display for receiving a TV broadcasting program, a display for advertisement display. Moreover, the light emitting device in accordance with the present invention can be used as a display portion of other various electric devices.

As other electronic equipments of the present invention there are: a video camera; a digital camera; a goggle type display (head mounted display); a car navigation system; a sound reproduction apparatus (a car audio stereo or an audio stereo and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk player (DVD), and displays the images). Specific examples of those electronic equipments are shown in FIGS. 22A to 23B.

FIG. 22A shows an electro luminescence display device containing a casing 2001, a support stand 2002, and a display portion 2003. The light emitting device of the present invention can be used as the display portion 2003. Such a light emitting display is a self light emitting type so that a back light is not necessary. Thus, the display portion can be made thinner than that of a liquid crystal display.

FIG. 22B shows a video camera, and contains a main body 2101, a display portion 2102, a sound input portion 2103, operation switches 2104, a battery 2105, and an image receiving portion 2106. The light emitting device of the present invention can be used as the display portion 2102.

FIG. 22C illustrates a portion (the right-half piece) of a light emitting display device of head mount type, which includes a main body 2201, signal cables 2202, a head mount band 2203, a display portion 2204, an optical system 2205, a light emitting device 2206, or the like. The light emitting device of the present invention is applicable to the light emitting display device 2206.

FIG. 22D is an image playback device equipped with a recording medium (specifically, a DVD playback device), and contains a main body 2301, a recording medium (such as a DVD and so forth) 2302, operation switches 2303, a display portion (a) 2304, and a display portion (b) 2305. The display portion (a) 2304 is mainly used for displaying image information. The display portion (b) 2305 is mainly used for displaying character information. The light emitting device of the present invention can be used as the display portion (a) 2304 and as the display portion (b) 2305. Note that the image playback device equipped with the recording medium includes devices such as game machines.

FIG. 22E shows a goggle type display (head mount display), and contains a main body 2401, a display portion 2402, and an arm portion 2403. The light emitting device of the present invention is applicable to the display device 2402.

FIG. 22F is a personal computer, and contains a main body 2501, a casing 2502, a display portion 2503, and a keyboard 2504. The light emitting device of the present invention can be used as the display portion 2503.

Note that if the luminance of the organic compound material increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable tv), and particularly situations of displaying moving images is increasing. The response speed of organic compound materials is so high that the above electric devices are good for display of moving image.

In addition, since the light emitting device conserves power in the light emitting portion, it is preferable to display information so as to make the light emitting portion as small as possible. Consequently, when using the light emitting device in a display portion mainly for character information, such as in a portable information terminal, in particular a portable telephone or an audio stereo, it is preferable to drive the light emitting device so as to form character information by the light emitting portions while non-light emitting portions are set as background.

FIG. 23A shows a portable telephone, and contains a main body 2601, a sound output portion 2602, a sound input portion 2603, a display portion 2604, operation switches 2605, and an antenna 2606. The light emitting device of the present invention can be used as the display portion 2604. Note that by displaying white color characters in a black color background, the display portion 2604 can suppress the power consumption of the portable telephone.

FIG. 23B shows a sound reproduction device, in a concrete term, car audio stereo, and contains a main body 2701, a display portion 2702, and operation switches 2703 and 2704. The light emitting device of the present invention can be used as the display portion 2702. Further, a car mounting audio stereo is shown in this embodiment, but a fixed type audio playback device may also be used. Note that, by displaying white color characters in a black color background, the display portion 2702 can suppress the power consumption. Note that, if a stick driver is provided in the light emitting device used in the display portion 2702, it is preferable that it is dividedly provided in several parts.

As described above, the application range of this invention is extremely wide, and it may be used for electric devices in various fields. Further, the electric device of this embodiment may be obtained by using a light emitting device freely combining the structures of the first to thirteenth embodiments.

(Embodiment 15)

In Embodiment 15, in the case where the method of driving the light emitting device according to the present invention, voltage-current characteristics of the region where a TFT for current control is driven will be described.

With even a slight change in voltage to be applied to the light emitting element, a current flowing through the light emitting element exponentially changes in a great manner. From another point of view, even if the amount of a current flowing through the light emitting element changes, a voltage value to be applied to the light emitting element does not greatly change. The brightness of the light emitting element proportionally increases with the amount of a current flowing through the light emitting element. Therefore, it is easy to control the brightness of the light emitting element by controlling the amount of a current (current value) flowing through the light emitting element rather than by controlling a voltage (voltage value) to be applied to the light emitting element because the control is hardly affected by TFT characteristics.

Figure 27:
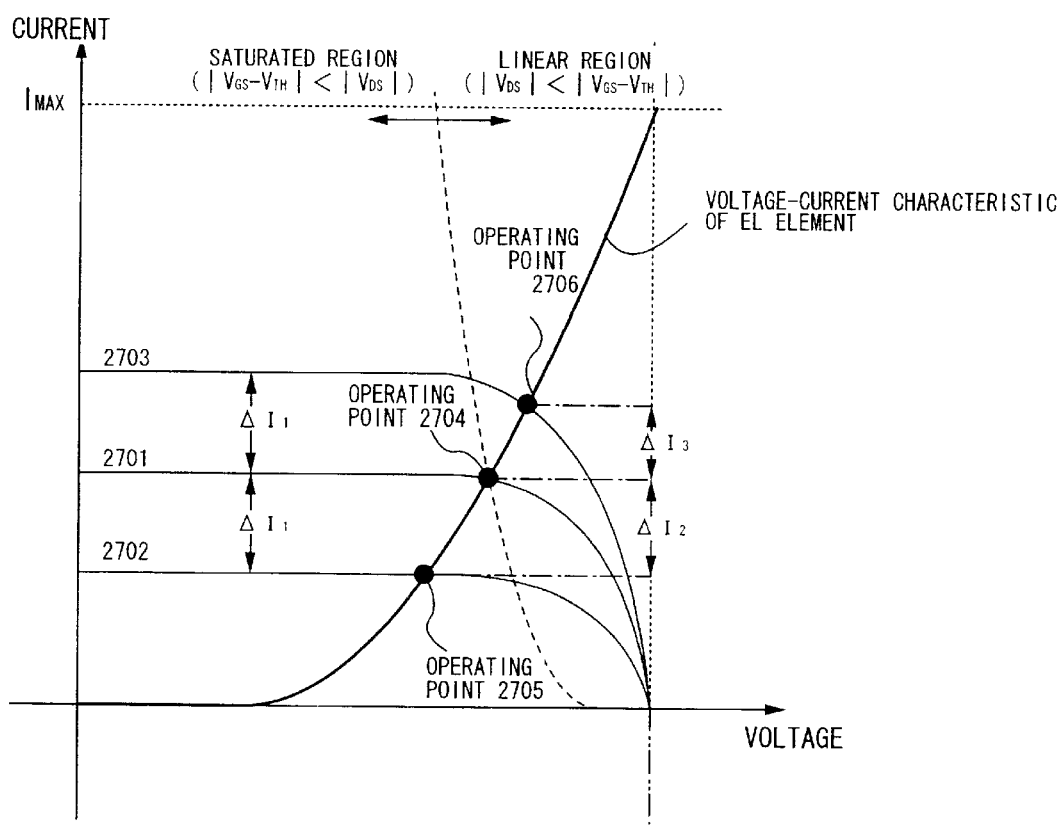
FIGS. 27A and 27B are a diagram showing a structure of a connection between a light emitting element and a TFT for current control and a graph showing voltage-current characteristics of a light emitting element and TFTs for current control, respectively.

FIGS. 27A and 27B are referred to. FIG. 27A shows only a structure of the TFT for current control 108 and the light emitting element 110 in the pixel of the light emitting device according to the present invention shown in FIG. 3. FIG. 27B shows voltage-current characteristics of the TFT for current control 108 and the light emitting element 110 shown in FIG. 27A. A graph of the voltage-current characteristics of the TFT for current control 108 shown in FIG. 27B shows the amount of a current flowing through a drain of the TFT for current control 108 with respect to a voltage $V_{DS}$ between the source region and the drain region. FIG. 27B shows a plurality of graphs at different voltages $V_{GS}$ between the source region and the gate electrode of the TFT for current control 108.

As shown in FIG. 27A, a voltage applied between the pixel electrode and the counter electrode 111 of the light emitting element 110 is denoted by $V_{EL}$, and a voltage applied between a terminal 2601 connected to the power source supply line and the counter electrode 111 of the light emitting element 110 is denoted by $V_T$. A value of $V_T$ is fixed by the electric potential of the power source supply line. A voltage between the source region and the drain region of the TFT for current control 108 is denoted by $V_{DS}$, and a voltage between a wiring 2602 connected to a gate electrode of the TFT for current control 108, that is, a voltage between the gate electrode and the source region of the TFT for current control 108 is denoted by $V_{GS}$.

The TFT for current control 108 may be any of an n-channel TFT and a p-channel TFT.

The TFT for current control 108 and the light emitting element 110 are connected in series with each other. Thus, a current value flowing through both elements (the TFT for current control 108 and the light emitting element 110) is the same. Therefore, the TFT for current control 108 and the light emitting element 110 shown in FIG. 27A are driven at a point of intersection (operating point) of the graphs showing voltage-current characteristics of both elements. In FIG. 27B, a voltage $V_{EL}$ is a voltage between the electric potential of the counter electrode 111 and the electric potential at the operating point. A voltage $V_{DS}$ is a voltage between the electric potential at the terminal 2601 of the TFT for current control 108 and the electric potential at the operating point. Accordingly, the voltage $V_T$ is equal to the sum of $V_{EL}$ and $V_{DS}$.

Then, the case where the voltage $V_{GS}$ is varied is considered. As is seen from FIG. 27(B), with increase in value of $|V_{GS}-V_{TH}|$ of the TFT for current control 108, in other words, with increase in value of $|V_{GS}|$, a current value flowing through the TFT for current control 108 increases. The voltage $V_{TH}$ is a threshold voltage of the TFT for current control 108. Therefore, as can be seen from FIG. 27(B), a current value flowing through the light emitting element 110 at the operating point naturally increases. The brightness of the light emitting element 110 increases in proportion to a current value flowing through the light emitting element 110.

When a value of $|V_{GS}|$ increases to increase a current value flowing through the light emitting element 110, a value of $V_{EL}$ also increase in accordance with the current value. Since a value of $V_T$ is determined by the electric potential of the power source supply line, a value of $V_{DS}$ is correspondingly reduced with the increase in $V_{EL}$.

Moreover, as shown in FIG. 27(B), the voltage-current characteristics of the TFT for current control are divided into two regions, based on values of $V_{GS}$ and $V_{DS}$. A region where the relationship: $|V_{GS}-V_{TH}|<|V_{DS}|$ is satisfied is a saturated region, while a region where the relationship: $|V_{GS}-V_{TH}|>|V_{DS}|$ is satisfied is a linear region.

In the saturated region, the following Expression 1 is established. In Expression 1, $I_D$ is a current value flowing through a channel formation region of the TFT for current control 108. Moreover, $\beta=\mu C_o W/L$ is established, where $\mu$ is a mobility of the TFT for current control 108, $C_o$ is a gate capacitance per unit region, and W/L is a ratio of a channel width W to a channel length L of a channel formation region.

$$I_D=\beta(V_{GS}-V_{TH})^2/2 \qquad \text{(Expression 1)}$$

In the linear region, the following Expression 2 is established.

$$I_D\beta\{(V_{GS}-V_{TH})V_{DS}-V_{DH}^2/2\} \qquad \text{(Expression 2)}$$

As is understood from Expression 1, a current value hardly varies by $V_{DS}$ in the saturated region, and is determined uniquely by $V_{GS}$.

On the other hand, as is understood from Expression 2, a current value is determined by $V_{DS}$ and $V_{GS}$ in the linear region. With increase in $|V_{GS}|$, the TFT for current control 108 operates within the linear region. Correspondingly, $V_{EL}$ gradually increases. Therefore, $V_{DS}$ is reduced by the amount of increase in $V_{EL}$. If $V_{DS}$ is reduced in the linear region, the amount of a current is also reduced. When $|V_{GS}|=\infty$ is established, a current value=$I_{MAX}$. Therefore, even with the greatest value of $|V_{GS}|$, a current larger than $I_{MAX}$ does not flow. Herein, $I_{MAX}$ is a current value flowing through the light emitting element 110 when $V_{EL}=V_T$ is established.

By controlling $|V_{GS}|$, it is possible to include the operating point in the saturated region or in the linear region.

Although it is desirable that the characteristics of all TFTs for current control are ideally the same, the threshold value $V_{TH}$ and the mobility $\mu$ actually differ for each TFT for current control in many cases. If the threshold value $V_{TH}$ and the mobility $\mu$ differ in each TFT for current control, a current value flowing through the channel formation region of the TFT for current control 108 differs for each TFT even with the same value of $V_{GS}$ as can be understood from Expressions 1 and 2.

Figure 28:
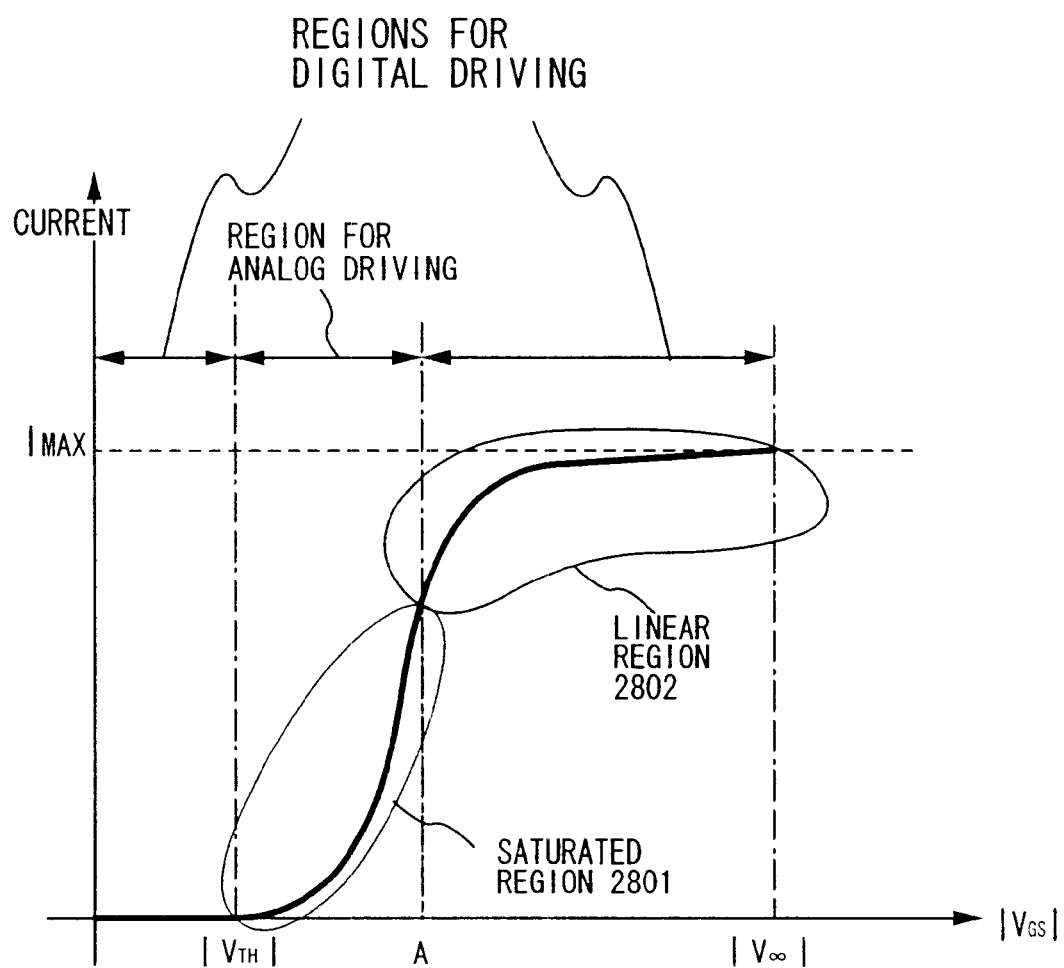
FIG. 28 is a graph showing voltage-current characteristics of a light emitting element and TFTs for current control.

FIG. 28 shows current-voltage characteristics of a TFT for current control with the threshold value $V_{TH}$ and the mobility $\mu$ being shifted. A solid line 2701 is a graph showing the ideal current-voltage characteristic. Solid lines 2702 and 2703 respectively show current-voltage characteristics of a TFT for current control in the case where the threshold value $V_{TH}$ and the mobility $\mu$ are shifted from the ideal values. It is assumed that the graphs 2702 and 2703 of the current-voltage characteristics are shifted from the graph 2701 showing the current-voltage characteristic having the ideal characteristic by the same current value $\Delta I_1$ in the saturated region so that an operating point 2705 of the graph 2702 showing the current-voltage characteristic is present in the saturated region and an operating point 2706 of the graph 2703 of the current-voltage characteristics is present in the linear region. In this case, if the amounts of shift in current value at the operating points 2705 and 2706 are respectively represented by $\Delta I_2$ and $\Delta_{I3}$, the amount of shift in current value is smaller at the operating point 2706 in the linear region than at the operating point 2705 in the saturated region.

Thus, in the case where the digital driving method described in the present invention is employed, the TFT for current control and the light emitting element are driven so that the operating point is present within the linear region. As a result, gray-scale display can be performed with unevenness in brightness of the light emitting element due to shift in characteristics of the TFT for current control being restrained.

In the case of conventional analog driving, it is preferred to drive the TFT for current control and the light emitting element so that the operating point is present within the saturated region where a current value can be controlled only by $|V_{GS}|$.

To summarize the above analysis of operation, FIG. 29 shows a graph of a current value with respect to a gate voltage $|V_{GS}|$ of the TFT for current control. When a value of $|V_{GS}|$ is increased to be greater than an absolute value $|V_{TH}|$ of a threshold voltage of the TFT for current control, the TFT for current control is brought into a conductive state to allow a current to flow therethrough. In this specification, $|V_{GS}|$ at this point is referred to as a lighting starting point. Then, when $|V_{GS}|$ is further increased, $|V_{GS}|$ reaches such a value (this value is supposed to be A) that satisfies $|V_{GS}-V_{TH}|=|V_{DS}|$. As a result, $|V_{GS}|$ shifts from the saturated region 2801 toward the linear region 2802. With a further increase in $|V_{GS}|$, a current value is increased to be finally saturated. At this point, $|V_{GS}|=\infty$ is established.

As can be seen from FIG. 29, through the region represented by: $|V_{GS}|\leq|V_{TH}|$, a current scarcely flows. A region represented by: $|V_{TH}|\leq|V_{GS}|\leq A$ is a saturated region where a current value is varied by $|V_{GS}|$. A region represented by: $A\leq|V_{GS}|$ is a linear region where a current value flowing through the light emitting element is varied by $|V_{GS}|$ and $|V_{DS}|$.

With the digital driving according to the present invention, it is preferred to use a region represented by: $|V_{GS}|\leq|V_{TH}|$ and the linear region represented by: $A\leq|V_{GS}|$.

Embodiment 15 can be freely combined with any of all the other embodiments.

(Embodiment 16)

In the present invention, the utilization of an organic material, in which phosphorescence from a triplet excitation can be used for light emission, allows an external light emission quantum efficiency to be remarkably improved. As a result, the light emitting element can have reduced electric power consumption, a longer life time and reduced weight.

The report for an improved external light emission quantum efficiency by using a triplet excitation is described below (T. Tsutsui, C. Adachi, S. Saito, Photochemical Processes in Organized Molecular Systems, ed. K. Honda, (Elsevier Sci. Pub., Tokyo, 1991) p. 437).

A molecular formula of an organic material (coumarin pigment) reported by the above paper is shown below.

(Chemical Formula 1)

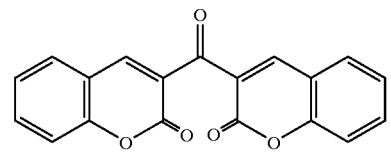

(M. A. Baldo, D. F. O'Brien, Y. You, A. Shoustikov, S. Sibley, M. E. Thompson, S. R. Forrest, Nature 395 (1998), p. 151)

A molecular formula of an organic material (Pt complex) reported by the above paper is shown below.

(Chemical Formula 2)

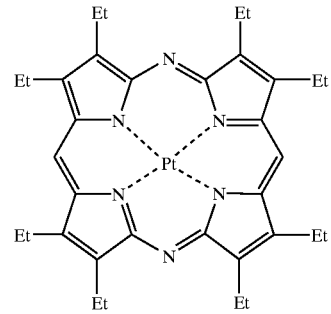

(M. A. Baldo, S. Lamansky, P. E. Burrrows, M. E. Thompson, S. R. Forrest, Appl. Phys. Lett., 75 (1999) p. 4), (T. Tsutsui, M. -J. Yang, M. Yahiro, K. Nakamura, T. Watanabe. T. Tsuji, Y. Fukuda, T. Wakimoto, S. Mayaguchi, Jpn. Appl. Phys., 38 (12B) (1999) L1502.).

A molecular formula of an organic material (Ir complex) reported by the above papers is shown below.

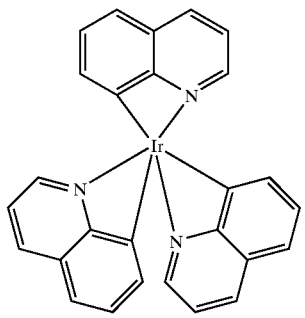
(Chemical Formula 3)

As described above, if phosphorescence emission from a triplet excitation can be utilized, an external light emission quantum efficiency three to four times higher than that with fluorescence emission from a singlet excitation can be theoretically realized.

The structure of this embodiment can be carried out with free combination with any structure of Embodiments 1 to 15.

According to the present invention, gray-scale display is realized by the combination of display time periods. Therefore, as compared with an analog driving method, the brightness of a screen upon gray-scale display is hardly affected by variation in $I_D$-$V_{GS}$ characteristics of a TFT.

Moreover, in the present invention, a display time period and a writing time period can be provided so as to partially overlap with each other. In other words, even during a writing time period, the pixel is capable of performing display. Therefore, a ratio of the sum of lengths of display time periods within one frame time period (duty ratio) is not determined only by the length of a writing time period. In the present invention, a duty ratio can be freely set.

It can be determined whether writing time periods overlap with each other or not by controlling the lengths of the writing time periods. If the length of writing time periods is shortened, the writing time periods do not overlap with each other; if the length of writing time periods is increased, the writing time periods overlap with each other. Therefore, the driving method described in Embodiments 1 to 5 in the specification is merely an example. It can be freely determined which writing time periods overlap with each other in each Embodiment by controlling the length of writing time periods.

In the case where adjacent writing time periods do not overlap with each other, a group of driver circuits for inputting a digital video signal to pixels during the adjacent writing time periods may be any of a first group of driver circuits (Dr_L) and a second group of driver circuits (Dr_R). A driving method shown in Embodiments 1 to 5 fin this specification is merely an example of the present invention. During two adjacent writing time periods that do not overlap with each other, writing may be performed by the first group of driver circuits (Dr_L) or by the second group of driver circuits (Dr_R) for both writing time periods.

By employing the structure of the present invention, a duty ratio can be increased to 100 to realize display with high brightness.

On the contrary, in the case where a black display time period where display is not performed is provided, a light emitting element can be prevented from always emitting light to restrain the deterioration of an organic compound layer.

What is claimed is:

1. A light emitting device comprising:
    a first source signal line driver circuit, a second source signal line driver circuit, a first gate signal line driver circuit, a second gate signal line driver circuit,
    and a pixel portion;
    wherein said pixel portion has a plurality of pixels;
    wherein each of said plurality of pixels includes a light emitting element, a TFT for current control for controlling light emission from said light emitting element, a first TFT for switching and a second TFT for switching for controlling driving of said TFT for current control;
    wherein driving of said first TFT for switching is controlled by said first source signal line driver circuit and said first gate signal line driver circuit;
    wherein driving of said second TFT for switching is controlled by said second source signal line driver circuit and said second gate signal line driver circuit; and
    wherein gray-scale display is performed by controlling a length of a time period during which said light emitting element emits light.

2. A light emitting device according to claim 1, wherein said first TFTs for switching and said second TFTs for switching have the same polarity.

3. A light emitting device according to claim 1, wherein a display time period that is the last to appear is the longest black display time period within the one frame time period.

4. A light emitting device according to claim 1 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

5. A light emitting device comprising:
    a first source signal line driver circuit, a second source signal line driver circuit, a first gate signal line driver circuit, a second gate signal line driver circuit, and a pixel portion;
    a plurality of first source signal lines connected to said first source signal line driver circuit, a plurality of second source signal lines connected to said second source signal line driver circuit, a plurality of first gate signal lines connected to said first gate signal line driver circuit, a plurality of second gate signal lines connected to said second gate signal line driver circuit, and a plurality of power source supply lines,
    wherein said pixel portion has a plurality of pixels including a plurality of light emitting elements, a plurality of TFTs for current control, a plurality of first TFTs for switching, and a plurality of second TFTs for switching;
    wherein gate electrodes included in said plurality of first TFTs for switching are connected to said plurality of first gate signal lines;
    wherein gate electrodes included in said plurality of second TFTs for switching are connected to said plurality of second gate signal lines;
    wherein one of source regions and drain regions included in said plurality of first TFTs for switching are connected to said plurality of first source signal lines, and the other are connected to gate electrodes included in said plurality of TFTs for current control;

wherein one of source regions and drain regions included in said plurality of second TFTs for switching are connected to said plurality of second source signal lines, and the other are connected to gate electrodes included in said plurality of TFTs for current control; and wherein one of source regions and drain regions included in said plurality of TFTs for current control are connected to said plurality of power source supply lines, and the other are connected to said plurality of light emitting elements.

6. A light emitting device according to claim 5, wherein said first TFTs for switching and said second TFTs for switching have the same polarity.

7. A light emitting device according to claim 5, wherein a display time period that is the last to appear is the longest black display time period within the one frame time period.

8. A light emitting device according to claim 5 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

9. A light emitting device comprising:

a first source signal line driver circuit, a second source signal line driver circuit, a first gate signal line driver circuit, a second gate signal line driver circuit, and a pixel portion, a plurality of first source signal lines connected to said first source signal line driver circuit, a plurality of second source signal lines connected to said second source signal line driver circuit, a plurality of first gate signal lines connected to said first gate signal line driver circuit, a plurality of second gate signal lines connected to said second gate signal line driver circuit, and a plurality of power supply lines held at a constant electric potential, wherein said pixel portion has a plurality of pixels including a plurality of light emitting elements, a plurality of TFTs for current control, a plurality of first TFTs for switching, and a plurality of second TFTs for switching;

wherein each of said plurality of light emitting elements has a pixel electrode, a counter electrode held at a constant electric potential, and an organic compound layer provided between said pixel electrode and said counter electrode;

wherein gate electrodes included in said plurality of first TFTs for switching are connected to said plurality of first gate signal lines;

wherein gate electrodes included in said plurality of second TFTs for switching are connected to said plurality of second gate signal lines;

wherein one of source regions and drain regions included in said plurality of first TFTs for switching are connected to said plurality of first source signal lines, and the other are connected to gate electrodes included in said plurality of TFTs for current control;

wherein one of source regions and drain regions included in said plurality of second TFTs for switching are connected to said plurality of second source signal lines, and the other are connected to gate electrodes included in said plurality of TFTs for current control; and wherein one of source regions and drain regions included in said plurality of TFTs for current control are connected to said plurality of power source supply lines, and the other are connected to said plurality of pixel electrodes.

10. A light emitting device according to claim 9, wherein said organic compound layer is formed of a low-molecular organic material or a polymer organic material.

11. A light emitting device according to claim 10, wherein said low-molecular organic material is made of $Alq_3$ (tris-8-quinolilite-aluminium) or TPD (triphenylamine derivative).

12. A light emitting device according to claim 10, wherein said polymer organic material is made of PPV (polyphenylene vinylene), PVK (polyvinylcarbazole) or polycarbonate.

13. A light emitting device according to claim 9, wherein said first TFTs for switching and said second TFTs for switching have the same polarity.

14. A light emitting device according to claim 9, wherein a display time period that is the last to appear is the longest black display time period within the one frame time period.

15. A light emitting device according to claim 9 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

16. A light emitting device comprising:

a first source signal line driver circuit, a second source signal line driver circuit, a first gate signal line driver circuit, a second gate signal line driver circuit, and a pixel portion, a plurality of first source signal lines connected to said first source signal line driver circuit, a plurality of second source signal lines connected to said second source signal line driver circuit, a plurality of first gate signal lines connected to said first gate signal line driver circuit, a plurality of second gate signal lines connected to said second gate signal line driver circuit, and a plurality of power source supply lines, wherein said pixel portion has a plurality of pixels including a plurality of light emitting elements, a plurality of TFTs for current control, a plurality of first TFTs for switching, and a plurality of second TFTs for switching;

wherein gate electrodes included in said plurality of first TFTs for switching are connected to said plurality of first gate signal lines;

wherein gate electrodes included in said plurality of second TFTs for switching are connected to said plurality of second gate signal lines;

wherein one of source regions and drain regions included in said plurality of first TFTs for switching are connected to said plurality of first source signal lines, and the other are connected to gate electrodes included in said plurality of TFTs for current control;

wherein one of source regions and drain regions included in said plurality of second TFTs for switching are connected to said plurality of second source signal lines, and the other are connected to gate electrodes included in said plurality of TFTs for current control;

wherein one of source regions and drain regions included in said plurality of TFTs for current control are connected to said plurality of power source supply lines, and the other are connected to said plurality of light emitting elements;

wherein n writing time periods Ta1, Ta2, ..., Tan sequentially appear within one frame time period;

wherein a writing time period that follows the last writing time period Tan among the n writing time periods Ta1, Ta2, ..., Tan is a first writing time period Ta1 among the n writing time periods Ta1, Ta2, ..., Tan, wherein time periods from apparition of the respective n writing time periods Ta1, Ta2, ..., Tan until apparition of writing time periods following the respective n writing time periods Ta1, Ta2, ..., Tan are n display time periods Td1, Td2, ..., Tdn;

wherein during the n writing time periods Ta1, Ta2, ..., Tan, a digital signal is input to said plurality of pixels through said plurality of first source signal lines from said first source signal line driver circuit or through said plurality of second source signal lines from said second source signal line driver circuit;

wherein among the n writing time periods Ta1, Ta2, ..., Tan, some adjacent writing time periods partially overlap with each other; and wherein said plurality of light emitting elements are selected to be brought into a light emitting state or a non-light emitting state during the n display time periods Td1, Td2, ..., Tdn by the digital signal.

17. A light emitting device according to 16, wherein said digital signal is input to said plurality of pixels through said plurality of first source signal lines from said first source signal line driver circuit during one writing time period of the partially overlapping adjacent writing time periods, and said digital signal is input to said plurality of pixels through said plurality of second source signal lines from the second source signal line driver circuit during the other writing time period.

18. A light emitting device according to claim 16, wherein j display time periods (j is an integer equal to or more than 0 and equal to or less than n) among the n display time periods Td1, Td2, ..., Tdn are black display time periods during which all said plurality of light emitting elements are brought into a non-light emitting state.

19. A light emitting device according to claim 16, wherein the lengths of the n writing time periods Ta1, Ta2, ..., Tan are equal to each other.

20. A light emitting device according to claim 16, wherein a ratio of lengths of (n−j) display time periods among the n display time periods Td1, Td2, ..., Tdn excluding black display time periods when arranged in order of short length is $2^0:2^1:\ldots:2^{(n-j-1)}$.

21. A light emitting device according to claim 16, wherein said first TFTs for switching and said second TFTs for switching have the same polarity.

22. A light emitting device according to claim 16, wherein a display time period that is the last to appear is the longest black display time period within the one frame time period.

23. A light emitting device according to claim 16 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

24. A light emitting device comprising:
a first source signal line driver circuit, a second source signal line driver circuit, a first gate signal line driver circuit, a second gate signal line driver circuit, and a pixel portion,
a plurality of first source signal lines connected to said first source signal line driver circuit, a plurality of second source signal lines connected to said second source signal line driver circuit, a plurality of first gate signal lines connected to said first gate signal line driver circuit, a plurality of second gate signal lines connected to said second gate signal line driver circuit, and a plurality of power source supply lines held at a constant electric potential, wherein said pixel portion has a plurality of pixels including a plurality of light emitting elements, a plurality of TFTs for current control, a plurality of first TFTs for switching, and a plurality of second TFTs for switching;

wherein each of said plurality of light emitting elements includes a pixel electrode, a counter electrode held at a constant electric potential, and an organic compound layer provided between said pixel electrode and said counter electrode;

wherein gate electrodes included in said plurality of first TFTs for switching are connected to said plurality of first gate signal lines;

wherein gate electrodes included in said plurality of second TFTs for switching are connected to said plurality of second gate signal lines;

wherein one of source regions and drain regions included in said plurality of first TFTs for switching are connected to said plurality of first source signal lines, and the other are connected to gate electrodes included in said plurality of TFTs for current control;

wherein one of source regions and drain regions included in said plurality of second TFTs for switching are connected to said plurality of second source signal lines, and the other are connected to gate electrodes included in said plurality of TFTs for current control;

wherein one of source regions and drain regions included in said plurality of TFTs for current control are connected to said plurality of power source supply lines, and the other are connected to said plurality of pixel electrodes;

wherein n writing time periods Ta1, Ta2, ..., Tan sequentially appear within one frame time period;

wherein a writing time period that follows the last writing time period Tan among the n writing time periods Ta1, Ta2, ..., Tan is a first writing time period Ta1 among the n writing time periods Ta1, Ta2, ..., Tan, wherein time periods from apparition of the respective n writing time periods Ta1, Ta2, ..., Tan until apparition of writing time periods following the respective n writing time periods Ta1, Ta2, ..., Tan are n display time periods Td1, Td2, ..., Tdn;

wherein during the n writing time periods Ta1, Ta2, ..., Tan, a digital signal is input to said plurality of pixels through said plurality of first source signal lines from said first source signal line driver circuit or through said plurality of second source signal lines from said second source signal line driver circuit;

wherein among the n writing time periods Ta1, Ta2, ..., Tan, some adjacent writing time periods partially overlap with each other; and wherein said plurality of light emitting elements are selected to be brought into a light emitting state or a non-light emitting state during the n display time periods Td1, Td2, ..., Tdn by the digital signal.

25. A light emitting device according to claim 24, wherein said organic compound layer is formed of a low-molecular organic material or a polymer organic material.

26. A light emitting device according to claim 25, wherein said low-molecular organic material is made of $Alq_3$ (tris-8-quinolilite-aluminium) or TPD (triphenylamine derivative).

27. A light emitting device according to claim 25, wherein said polymer organic material is made of PPV (polyphenylene vinylene), PVK (polyvinylcarbazole) or polycarbonate.

28. A light emitting device according to 24, wherein said digital signal is input to said plurality of pixels through said plurality of first source signal lines from said first source signal line driver circuit during one writing time period of the partially overlapping adjacent writing time periods, and said digital signal is input to said plurality of pixels through said plurality of second source signal lines from the second source signal line driver circuit during the other writing time period.

29. A light emitting device according to claim 24, wherein j display time periods (j is an integer equal to or more than 0 and equal to or less than n) among the n display time periods Td1, Td2, ..., Tdn are black display time periods during which all said plurality of light emitting elements are brought into a non-light emitting state.

30. A light emitting device according to claim 24, wherein the lengths of the n writing time periods Ta1, Ta2, ..., Tan are equal to each other.

31. A light emitting device according to claim 24, wherein a ratio of lengths of (n–j) display time periods among the n display time periods Td1, Td2, ..., Tdn excluding black display time periods when arranged in order of short length is $2^0:2^1: \ldots :2^{(n-i-1)}$.

32. A light emitting device according to claim 24, wherein said first TFTs for switching and said second TFTs for switching have the same polarity.

33. A light emitting device according to claim 24, wherein a display time period that is the last to appear is the longest black display time period within the one frame time period.

34. A light emitting device according to claim 24 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

35. A light emitting device comprising:
a first source signal line driver circuit, a second source signal line driver circuit, a first gate signal line driver circuit, a second gate signal line driver circuit, and a pixel portion,
wherein said pixel portion has pixels;
wherein each of said pixels includes a light emitting element, a first switching TFT, a second switching TFT, and a current-controlling TFT;
wherein driving of said light emitting element is controlled by a digital signal output from said first source signal line driver circuit and said second source signal line driver circuit and a selecting signal output from said first gate signal line driver circuit and said second gate signal line driver circuit;
wherein said first source signal line driver circuit and said first gate signal line driver circuit are connected to said first switching TFT; and
wherein said second source signal line driver circuit and said second gate signal line driver circuit are connected to said second switching TFT.

36. A light emitting device according to claim 35 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

37. A light emitting device comprising:
a first source signal line driver circuit, a second source signal line driver circuit, a first gate signal line driver circuit, a second gate signal line driver circuit, and a pixel portion,
wherein said pixel portion has pixels;
wherein each of said pixels includes a light emitting element, a first switching TFT, a second switching TFT, and a current-controlling TFT;
wherein a time period during which the light emitting element emit light is controlled by a digital signal output from said first source signal line driver circuit and said second source signal line driver circuit and a selecting signal output from said first gate signal line driver circuit and the second gate signal line driver circuit to perform gray-scale display;
wherein said first source signal line driver circuit and said first gate signal line driver circuit are connected to said first switching TFT; and
wherein said second source signal line driver circuit and said second gate signal line driver circuit are connected to said second switching TFT.

38. A light emitting device according to claim 37 wherein said light emitting device is incorporated into an electronic device selected from the group consisting of a video camera, a digital camera, a goggle type display, a car navigation system, a sound reproduction apparatus, a notebook type personal computer, a game apparatus, a portable information terminal, and an image playback device.

* * * * *